(12) United States Patent
Luch

(10) Patent No.: US 6,239,352 B1
(45) Date of Patent: May 29, 2001

(54) SUBSTRATE AND COLLECTOR GRID STRUCTURES FOR ELECTRICALLY INTERCONNECTING PHOTOVOLTAIC ARRAYS AND PROCESS OF MANUFACTURE OF SUCH ARRAYS

(76) Inventor: Daniel Luch, 17161 Copper Hill Dr., Morgan Hill, CA (US) 95037

( * ) Notice: Subject to any disclaimer, the term of this patent is extended or adjusted under 35 U.S.C. 154(b) by 0 days.

(21) Appl. No.: 09/281,656

(22) Filed: Mar. 30, 1999

(51) Int. Cl.[7] .......................... H01L 31/042; H01L 31/05
(52) U.S. Cl. .......................... 136/244; 136/245; 136/256; 257/443; 257/459; 438/61; 438/62; 438/66; 438/67; 438/73; 438/80
(58) Field of Search .................... 136/244, 245, 136/256; 257/443, 459; 438/61, 62, 66, 67, 73, 80; 427/74

(56) References Cited

U.S. PATENT DOCUMENTS

| | | | |
|---|---|---|---|
| 4,697,041 | * 9/1987 | Okaniwa et al. | 136/244 |
| 4,746,618 | * 5/1988 | Nath et al. | 438/62 |
| 4,965,655 | * 10/1990 | Grimmer et al. | 257/56 |
| 5,273,608 | * 12/1993 | Nath | 156/301 |
| 5,385,848 | * 1/1995 | Grimmer | 136/244 |
| 5,419,781 | * 5/1995 | Hamakawa et al. | 136/244 |
| 5,547,516 | * 8/1996 | Luch | 136/244 |
| 5,735,966 | * 4/1998 | Luch | 136/244 |

* cited by examiner

Primary Examiner—Alan Diamond

(57) ABSTRACT

This invention comprises deposition of thin film photovoltaic junctions on metal substrates which can be heat treated following deposition in a continuous fashion without deterioration of the metal support structure. In a separate operation, an interconnection substrate structure is produced in a continuous roll-to-roll fashion. In this way the interconnection substrate structure can be uniquely formulated from polymer-based materials since it does not have to endure high temperature exposure. Cells comprising the metal foil supported photovoltaic junctions are then laminated to the interconnection substrate structure. Conductive interconnections are deposited to complete the array. The conductive interconnections can be accomplished with a separately prepared interconnection component. The interconnected array is produced using continuous roll-to-roll processing which avoids the need to use the expensive and intricate material removal operations currently taught in the art to achieve electrical interconnections among arrays of photovoltaic cells.

13 Claims, 47 Drawing Sheets

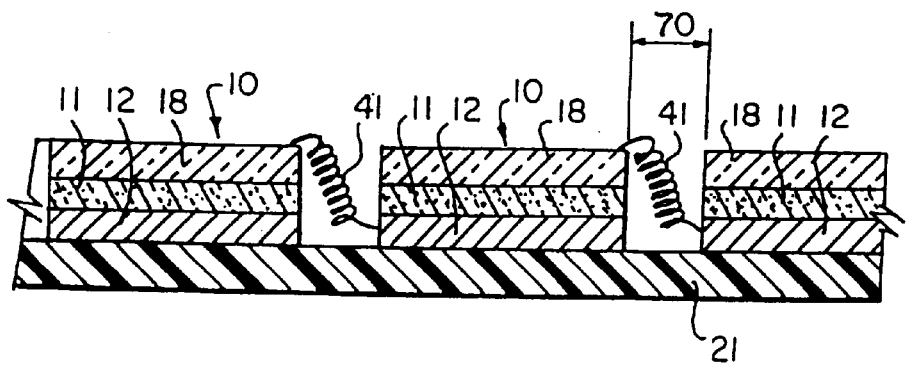
FIG.5
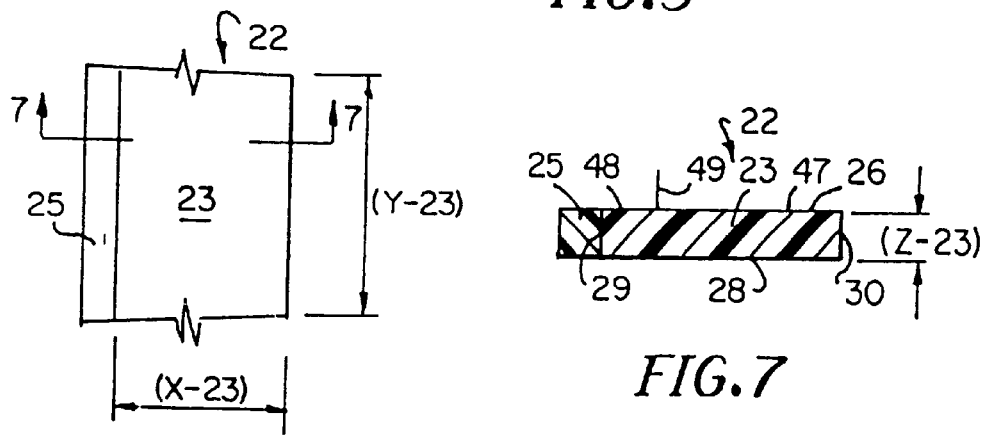
FIG.6
FIG.7
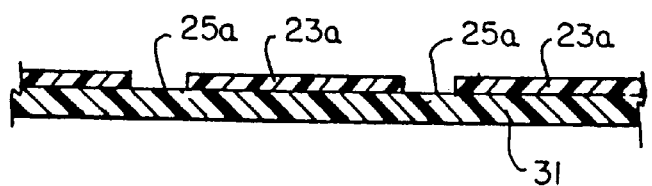
FIG.8
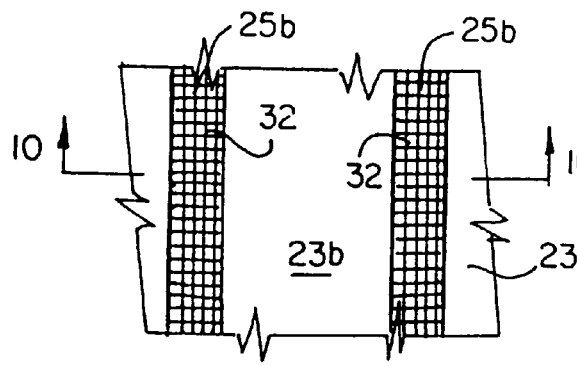
FIG.9

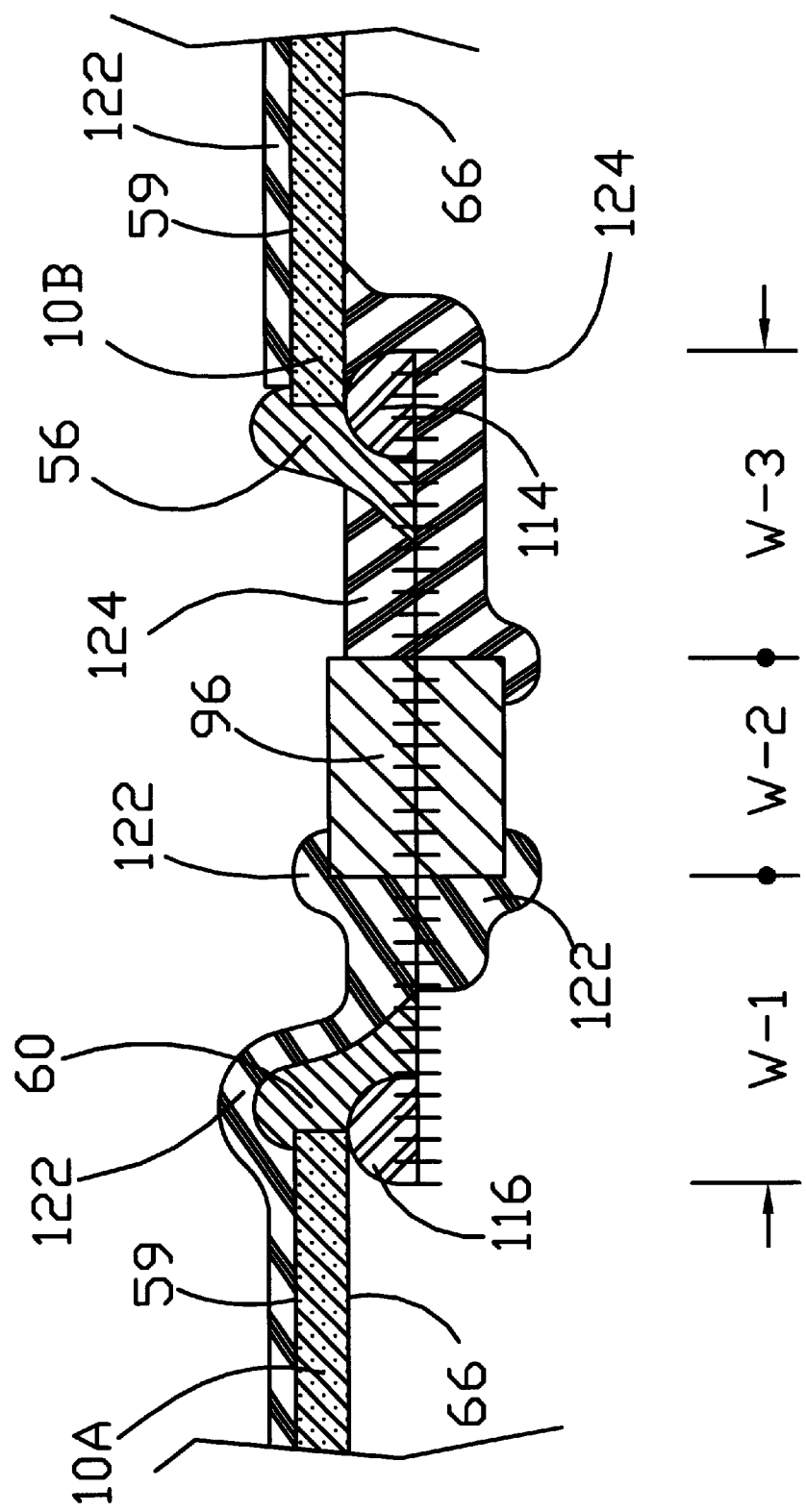

SUBSTRATE AND COLLECTOR GRID STRUCTURES FOR ELECTRICALLY INTERCONNECTING PHOTOVOLTAIC ARRAYS AND PROCESS OF MANUFACTURE OF SUCH ARRAYS

BACKGROUND OF THE INVENTION

Photovoltaic cells have developed according to two distinct methods. The initial operational cells employed a matrix of single crystal silicon appropriately doped to produce a planar p-n junction. An intrinsic electric field established at the p-n junction produces a voltage by directing solar photon produced holes and free electrons in opposite directions. Despite good conversion efficiencies and long-term reliability, widespread energy collection using single-crystal silicon cells is thwarted by the exceptionally high cost of single crystal silicon material and interconnection processing.

A second approach to produce photovoltaic cells is by depositing thin photovoltaic semiconductor films on a supporting substrate. Material requirements are minimized and technologies can be proposed for mass production. The thin film structures can be designed according to doped homo-junction technology such as in that involving silicon films, or can employ heterojunction approaches such as those using CdTe or chalcopyrite materials.

Despite significant improvements in individual cell conversion efficiencies for both single crystal and thin film approaches, photovoltaic energy collection has been generally restricted to applications having low power requirements. One factor impeding development of bulk power systems is the problem of economically collecting the energy from an extensive collection surface. Photovoltaic cells can be described as high current, low voltage devices. Typically individual cell voltage is less than one volt. The current component is a substantial characteristic of the power generated. Efficient energy collection from an expansive surface must minimize resistive losses associated with the high current characteristic. A way to minimize resistive losses is to reduce the size of individual cells and connect them in series. Thus, voltage is stepped through each cell while current and associated resistive losses are minimized.

It is readily recognized that making effective, durable series connections among multiple small cells can be laborious, difficult and expensive. In order to approach economical mass production of series connected arrays of individual cells, a number of factors must be considered in addition to the type of photovoltaic materials chosen. These include the substrate employed and the process envisioned. Since thin films can be deposited over expansive areas, thin film technologies offer additional opportunities for mass production of interconnected arrays compared to inherently small, discrete single crystal silicon cells. Thus a number of U.S. Patents have issued proposing designs and processes to achieve series interconnections among the thin film photovoltaic cells. Many of these technologies comprise deposition of photovoltaic thin films on glass substrates followed by scribing to form smaller area individual cells. Multiple steps then follow to electrically connect the individual cells in series array. Examples of these proposed processes are presented in U.S. Pat. Nos. 4,443,651, 4,724,011, and 4,769,086 to Swartz, Turner et al. and Tanner et al. respectively. While expanding the opportunities for mass production of interconnected cell arrays compared with single crystal silicon approaches, glass substrates must inherently be processed on an individual batch basis.

More recently, developers have explored depositing wide area films using continuous roll-to-roll processing. This technology generally involves depositing thin films of photovoltaic material onto a continuously moving web. However, a challenge still remains regarding subdividing the expansive films into individual cells followed by interconnecting into a series connected array. For example, U.S. Pat. No. 4,965,655 to Grimmer et. al. and U.S. Pat. No. 4,697,041 to Okamiwa teach processes requiring expensive laser scribing and interconnections achieved with laser heat staking. In addition, these two references teach a substrate of thin vacuum deposited metal on films of relatively expensive polymers. The electrical resistance of thin vacuum metallized layers significantly limits the active area of the individual interconnected cells.

It has become well known in the art that the efficiencies of certain promising thin film photovoltaic junctions can be substantially increased by high temperature treatments. These treatments involve temperatures at which even the most heat resistant plastics suffer rapid deterioration, thereby requiring either ceramic, glass, or metal substrates to support the thin film junctions. Use of a glass or ceramic substrates generally restricts one to batch processing and handling difficulty. Use of a metal foil as a substrate allows continuous roll-to-roll processing. However, despite the fact that use of a metal foil allows high temperature processing in roll-to-roll fashion, the subsequent interconnection of individual cells effectively in an interconnected array has proven difficult, in part because the metal foil substrate is electrically conducting.

U.S. Pat. No. 4,746,618 to Nath et al. teaches a design and process to achieve interconnected arrays using roll-to-roll processing of a metal web substrate such as stainless steel. The process includes multiple operations of cutting, selective deposition, and riveting. These operations add considerably to the final interconnected array cost.

U.S. Pat. No. 5,385,848 to Grimmer teaches roll-to-roll methods to achieve integrated series connections of adjacent thin film photovoltaic cells supported on an electrically conductive metal substrate. The process includes mechanical or chemical etch removal of a portion of the photovoltaic semiconductor and transparent top electrode to expose a portion of the electrically conductive metal substrate. The exposed metal serves as a contact area for interconnecting adjacent cells. These material removal techniques are troublesome for a number of reasons. First, many of the chemical elements involved in the best photovoltaic semiconductors are expensive and environmentally unfriendly. This removal subsequent to controlled deposition involves containment, dust and dirt collection and disposal, and possible cell contamination. This is not only wasteful but considerably adds to expense. Secondly, the removal processes are difficult to control dimensionally. Thus a significant amount of the valuable photovoltaic semiconductor is lost to the removal process. Ultimate module efficiencies are further compromised in that the spacing between adjacent cells grows, thereby reducing the effective active collector area for a given module area.

Thus there remains a need for an inexpensive manufacturing process which allows high heat treatment for thin film photovoltaic junctions while also offering unique means to achieve effective integrated series connections.

A further unsolved problem which has thwarted production of expansive surface photovoltaic modules is that of collecting the photogenerated current from the top, light incident surface. Transparent conductive oxide (TCO) layers have been employed as a top surface electrode. However, these TCO layers are relatively resistive compared to pure metals. This fact forces individual cell widths to be reduced in order to prevent unacceptable resistive power losses. As cell widths decrease, the width of the area between individual cells (interconnect area) should also decrease so that the relative portion of inactive surface of the interconnect area does not become excessive. Typical cell widths of one centimeter are often taught in the art. These small cell widths demand very fine interconnect area widths, which dictate delicate and sensitive techniques to be used to electrically connect the top TCO surface of one cell to the bottom electrode of an adjacent series connected cell. Furthermore, achieving good stable ohmic contact to the TCO cell surface has proven difficult, especially when one employs those sensitive techniques available when using the TCO only as the top collector electrode.

The problem of collecting photovoltaic generated current from the top light impinging surface of a photovoltaic cell has been addressed in a number of ways, none entirely successful.

In a somewhat removed segment of technology, a number of electrically conductive fillers have been used to produce electrically conductive polymeric materials. This technology generally involves mixing of the conductive filler into the polymer resin prior to fabrication of the material into its final shape. Conductive fillers typically consist of high aspect ratio particles such as metal fibers, metal flakes, or highly structured carbon blacks, with the choice based on a number of cost/performance considerations.

Electrically conductive resins have been used as bulk thermoplastic compositions, or formulated into paints. Their development has been spurred in large part by electromagnetic radiation shielding and static discharge requirements for plastic components used in the electronics industry. Other known applications include resistive heating fibers and battery components.

In yet another separate technological segment, electroplating on plastic substrates has been employed to achieve decorative effects on items such as knobs, cosmetic closures, faucets, and automotive trim. ABS (acrylonitrile-butadiene-styrene) plastic dominates as the substrate of choice for most applications because of a blend of mechanical and process properties and ability to be uniformly etched. The overall plating process comprises many steps. First, the plastic substrate is chemically etched to microscopically roughen the surface. This is followed by depositing an initial metal layer by chemical reduction. This initial metal layer is normally copper or nickel of thickness typically one-half micrometer. The object is then electroplated with metals such as bright nickel and chromium to achieve the desired thickness and decorative effects. The process is very sensitive to processing variables used to fabricate the plastic substrate, limiting applications to carefully molded parts and designs. In addition, the many steps employing harsh chemicals make the process intrinsically costly and environmentally difficult. Finally, the sensitivity of ABS plastic to liquid hydrocarbons has prevented certain applications. The conventional technology for electroplating on plastic (etching, chemical reduction, electroplating) has been extensively documented and discussed in the public and commercial literature. See, for example, Saubestre, Transactions of the Institute of Metal Finishing, 1969, Vol. 47., or Arcilesi et al., Products Finishing, March 1984.

Many attempts have been made to simplify the process of electroplating on plastic substrates. Some involve special chemical techniques to produce an electrically conductive film on the surface. Typical examples of this approach are taught by U.S. Pat. No. 3,523,875 to Minklei, U.S. Pat. No. 3,682,786 to Brown et. al., and U.S. Pat. No. 3,619,382 to Lupinski. The electrically conductive film produced was then electroplated.

Another approach proposed to simplify electroplating of plastic substrates is incorporation of electrically conductive fillers into the resin to produce an electrically conductive plastic. The electrically conductive resin is then electroplated. Examples of this approach are the teachings of Adelman in U.S. Pat. No. 4,038,042 and Luch in U.S. Pat. No. 3,865,699. Adelman taught incorporation of conductive carbon black into a polymeric matrix to achieve electrical conductivity required for electroplating. The substrate was pre-etched to achieve adhesion of the subsequently electrodeposited metal. Luch taught incorporation of small amounts of sulfur into polymer-based compounds filled with conductive carbon black. The sulfur was shown to have two advantages. First, it participated in formation of a chemical bond between the polymer-based substrate and an initial Group VIII based metal electrodeposit. Second, the sulfur increased lateral growth of the Group VIII based metal electrodeposit over the surface of the substrate.

Since the polymer-based compositions taught by Luch could be electroplated directly without any pretreatments, they could be accurately defined as directly electroplateable resins (DER). Directly electroplateable resins, (DER), are characterized by the following features.

(a) having a polymer matrix;
(b) presence of carbon black in amounts sufficient for the overall composition to have an electrical volume resistivity of less than 1000 ohm-cm., e.g., 100 ohm-cm., 10 ohm-cm., 1 ohm-cm.;
(c) presence of sulfur (including any sulfur provided by sulfur donors) in amounts greater than about 0.1% by weight of the overall polymer-carbon-sulfur composition; and
(d) presence of the polymer, carbon and sulfur in said directly electroplateable composition of matter in cooperative amounts required to achieve direct, uniform, rapid and adherent coverage of said composition of matter with an electrodeposited Group VIII metal or Group VIII metal-based alloy.

The minimum workable level of carbon black required to achieve electrical resistivities less than 1000 ohm-cm. appears to be about 8 weight percent based on the weight of polymer plus carbon black.

Polymers such as polyvinyls, polyolefins, polystyrenes, elastomers, polyamides, and polyesters are suitable for a DER matrix, the choice generally being dictated by the physical properties required.

In order to eliminate ambiguity in terminology of the present specification and claims, the following definitions are supplied.

"Metal-based" refers to a material having metallic properties comprising one or more elements, at least one of which is an elemental metal. "Metal-based alloy" refers to a substance having metallic properties and being composed of two or more elements of which at least one is an elemental metal. "Polymer-based" refers to a substance composed, by volume, of 50 percent or more hydrocarbon polymer.

"Group VIII-based" refers to a metal (including alloys) containing, by weight, 50% to 100% metal from Group VIII of the Periodic Table of Elements.

It is important to note that electrical conductivity alone is insufficient to permit a plastic substrate to be directly electroplated. The plastic surface must be electrically conductive on a microscopic scale. For example, simply loading a small volume percentage of metal fibers may impart conductivity on a scale suitable for electromagnetic radiation shielding, but the fiber separation would likely prevent uniform direct electroplating. In addition, many conductive thermoplastic materials form a non-conductive surface skin during fabrication, effectively eliminating the surface conductivity required for direct electroplating.

Objects of the Invention

An object of the invention is to eliminate the deficiencies in the prior art methods of producing expansive area, series interconnected photovoltaic arrays. A further object of the present invention is to provide improved substrates to achieve series interconnections among expansive thin film cells. A further object of the invention is to permit inexpensive production of high efficiency, heat treated thin film photovoltaic cells while simultaneously permitting the use of polymer based substrate materials and associated processing to effectively interconnect those cells. A further object of the present invention is to provide improved processes whereby expansive area, series interconnected photovoltaic arrays can be economically mass produced.

A further object of the invention is to provide improved processes and structures for supplying current collector grids.

Other objects and advantages will become apparent in light of the following description taken in conjunction with the drawings and embodiments.

SUMMARY OF THE INVENTION

The current invention provides a solution to the stated need by producing the active photovoltaic film and interconnecting substrate separately and subsequently combining them to produce the desired expansive series interconnected array. The invention contemplates deposition of thin film photovoltaic junctions on metal foil substrates which can be heat treated following deposition in a continuous fashion without deterioration of the metal support structure. In a separate operation, an interconnection substrate structure is produced in a continuous roll-to-roll fashion. The metal foil supported photovoltaic junction is then laminated to the interconnecting substrate structure and conductive connections are deposited to complete the array. In this way the interconnection substrate structure can be uniquely formulated from polymer-based materials since it does not have to endure high temperature exposure. Furthermore, the photovoltaic junction and its metal foil support can be produced in bulk without the need to use the expensive and intricate material removal operations currently taught in the art to achieve series interconnections.

BRIEF DESCRIPTION OF THE DRAWINGS

The various factors and details of the structures and manufacturing methods of the present invention are hereinafter more fully set forth with reference to the accompanying drawings wherein:

FIG. 5 is a sectional view illustrating the problems associated with making series connections among thin film photovoltaic cells shown in FIGS. 1–3.

FIG. 6 is a top plan view of a substrate structure for achieving series interconnections of thin film photovoltaic cells.

FIG. 7 is a sectional view taken substantially along the line 7—7 of FIG. 6.

FIG. 8 is a sectional view similar to FIG. 7 showing an alternate embodiment of a substrate structure for achieving series interconnections of thin film photovoltaic cells.

FIG. 9 is a top plan view of an alternate embodiment of a substrate structure for achieving series interconnections of thin film photovoltaic cells.

FIG. 13a is a side view of the process. FIG. 13b is a sectional view taken substantially along line 13b—13b of FIG. 13a.

FIG. 44A is a sectional view taken substantially along the line 44A—44A of FIG. 44.

DESCRIPTION OF PREFERRED EMBODIMENTS

Figure 1:
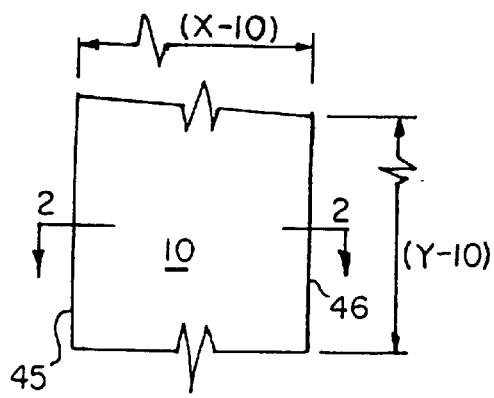
FIG. 1 is a top plan view of a thin film photovoltaic cell including its support foil.

Reference will now be made in detail to the preferred embodiments of the invention, examples of which are illustrated in the accompanying drawings. In the drawings, like reference numerals designate identical or corresponding parts throughout several views and an additional letter designation is characteristic of a particular embodiment.

Figure 2:
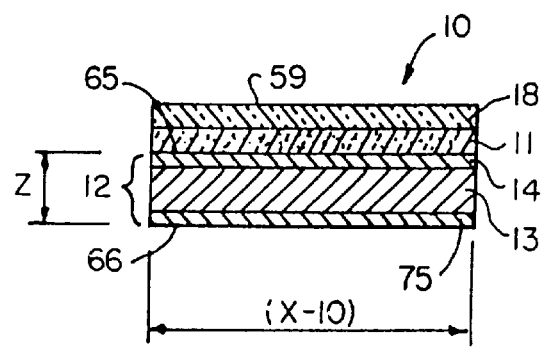
FIG. 2 is a sectional view taken substantially along the line 2—2 of FIG. 1.

Referring to FIG. 1, a thin film photovoltaic cell, including a supporting metal-based foil is generally indicated by 10. Structure 10 has a width X-10 and length Y-10. Width X-10 defines a first photovoltaic cell terminal edge 45 and second photovoltaic cell terminal edge 46. It is contemplated that length Y-10 is considerably greater than width X-10 and length Y-10 can generally be described as "continuous" or being able to be processed in a roll-to-roll fashion. FIG. 2 shows that structure 10 comprises a thin film photovoltaic structure 11 supported by metal-based foil 12. Foil 12 has first surface 65, second surface 66, and thickness "Z". Metal-based foil 12 may be of uniform composition or may comprise a laminate of two or more metal-based layers. For example, foil 12 may comprise a base layer of inexpensive and processable metal 13 with an additional metal-based layer 14 disposed between base layer 13 and photovoltaic structure 11. The additional metal-based layer may be chosen to ensure good ohmic contact between the top surface 65 of support 12 and photovoltaic structure 11. Bottom surface 66 of foil support 12 may comprise a material 75 chosen to achieve good electrical and mechanical joining characteristics to the substrate as will be shown. The thickness Z of support layer 12 is generally contemplated to be between 0.001 cm. and 0.025 cm. This thickness would provide adequate handling strength while still allowing flexibility for roll-to-roll processing.

Figure 3:
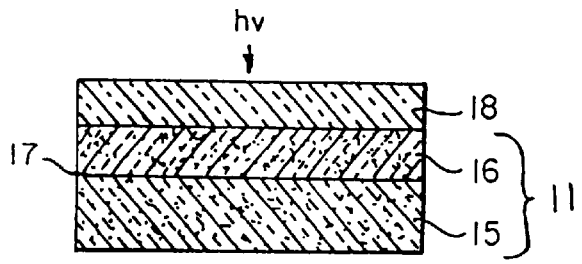
FIG. 3 is an expanded sectional view showing a form of the structure of layer 11 of FIG. 2.
Figure 4:
FIG. 4 illustrates a process for producing the structure shown in FIGS. 1 through 3.
Figure 4:
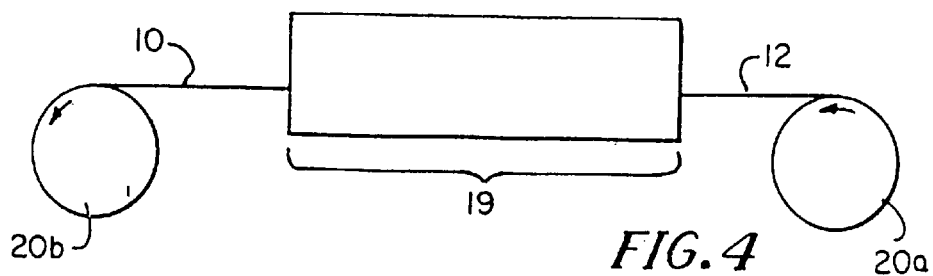

Photovoltaic structure 11 can be any of the thin film structures known in the art. In its simplest form, the photovoltaic cell combines an n-type semiconductor with a p-type semiconductor to from an n-p junction. Most often an optically transparent window electrode such as a thin film of zinc or tin oxide is employed to minimize resistive losses involved in current collection. FIG. 3 illustrates an example of a typical photovoltaic structure in section. In FIG. 3, 15 represents a thin film of a p-type semiconductor, 16 a thin film of ntype semiconductor and 17 the resulting photovoltaic junction. Window electrode 18 completes the typical photovoltaic structure. The exact nature of the photovoltaic structure 11 does not form the subject matter of the present invention. FIG. 4 refers to the method of manufacture of the foil supported photovoltaic structures generally illustrated in FIGS. 1 through 3. The metal-based support foil 12 is moved in the direction of its length Y through a deposition process, generally indicated as 19. Process 19 accomplishes deposition of the active photovoltaic structure onto support foil 12. Support foil 12 is unwound from supply roll 20a, passed through deposition process 19 and rewound onto takeup roll 20b. Process 19 can comprise any of the processes well-known in the art for depositing thin film photovoltaic structures. These processes include electroplating, vacuum sputtering, and chemical deposition. Process 19 may also include treatments, such as heat treatments, intended to enhance photovoltaic cell performance.

Referring now to FIG. 5, there are illustrated cells 10 as shown in FIG. 2. The cells have been positioned to achieve spacial positioning on the support substrate 21. Support structure 21 is by necessity non-conductive at least in that distance indicated by numeral 70 separating the adjacent cells 10. This insulating space prevents short circuiting from metal foil electrode 12 of one cell to foil electrode 12 of an adjacent cell. In order to achieve series connection, electrical communication must be made from the top surface of window electrode 18 to the foil electrode 12 of an adjacent cell. This communication is shown in the FIG. 5 as a metal wire 41. Metal wire 41 is clearly impractical for inexpensive continuous production and is shown for illustration purposes only.

It should be noted that foil electrode 12 is relatively thin, on the order of 0.001 cm to 0.025 cm. Therefore connecting to its edge as indicated in FIG. 5 would be impractical.

Referring now to FIGS. 6 and 7, one embodiment of the interconnection substrate structures of the current invention is generally indicated by 22. Unit of substrate 22 comprises electrically conductive sheet region 23 and electrically insulating joining portion region 25. Electrically conductive sheet 23 has a top surface 26, bottom surface 28, width X-23, length Y-23 and thickness Z-23. Width X-23 defines a first terminal edge 29 and a second terminal edge 30 of conductive sheet 23. Top surface 26 of conductive sheet 23 can be thought of as having top collector surface 47 and top contact surface 48 separated by imaginary insulating boundary 49. The purpose for these definitions will become clear in the following.

Electrically conductive sheet 23 includes an electrically conductive polymer. Typically, electrically conductive polymers exhibit bulk resistivity values of less than 1000 ohm-cm. Resistivities less than 1000 ohm-cm can be readily achieved by compounding well-known conductive fillers into a polymer matrix binder.

The substrate unit 22 may be fabricated in a number of different ways. Electrically conductive sheet 23 can comprise an extruded film of electrically conductive polymer joined to a strip of compatible insulating polymer 25 at or near terminal edge 29 as illustrated in FIG. 7. Alternatively, the conductive sheet may comprise a strip of electrically conductive polymer 23a laminated to an insulating support structure 31 as illustrated in section in FIG. 8. In FIG. 8, electrically insulating joining portions 25a are simply those portions of insulating support structure 31 not overlaid by sheets 23a.

It is contemplated that electrically conductive sheets 23 may comprise materials in addition to the electrically conductive polymer. For example, a metal may be electrodeposited to the electrically conductive polymer for increased conductivity. In this regard, the use of a directly electroplateable resin (DER) may be particularly advantageous.

Figure 10:
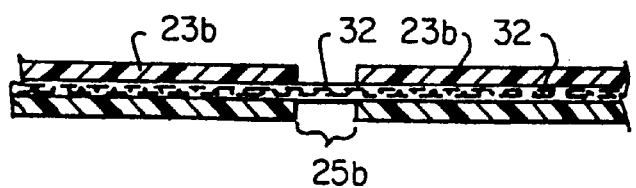
FIG. 10 is a sectional view similar to FIGS. 7 and 8 taken substantially along line 10—10 of FIG. 9.

A further embodiment of fabrication of interconnection substrate unit 22 is illustrated in FIGS. 9 and 10. In FIG. 9, electrically conductive sheet 23b comprises electrically conductive polymer impregnated into a fabric or web 32. A number of known techniques can be used to achieve such impregnation. Insulating joining portion 25b in FIG. 9 is simply an un-impregnated extension of the web 32. Fabric or web 32 can be selected from a number of woven or non-woven fabrics, including non-polymeric materials such as fiberglass.

Figure 11:
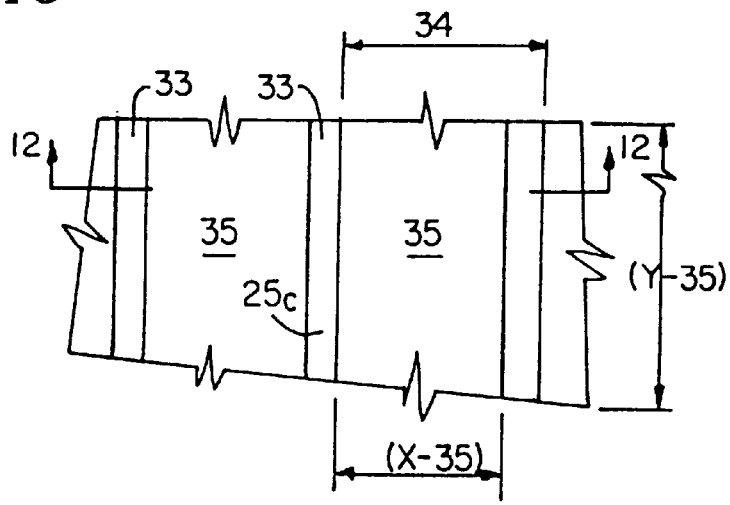
FIG. 11 is a top plan view of another embodiment of a substrate structure for achieving series interconnections of thin film photovoltaic cells.

Referring now to FIG. 11, an alternate embodiment for the substrate structures of the present invention is illustrated. In the FIG. 11, a support web or film 33 extends among and supports multiple individual cell units, generally designated by repeat dimension 34. Electrically conductive sheets 35 are analogous to sheet 23 of FIGS. 6 through 10. At the stage of overall manufacture illustrated in FIG. 11, electrically conductive sheets 35 need not comprise an electrically conductive polymer as do sheets 23 of FIGS. 6 through 10. However, as will be shown, electrically conducting means, typically in the form of an electrically conductive polymer containing adhesive, must eventually be utilized to join photovoltaic laminate 10 to the top surface 50 of electrically conductive sheets 35. In addition, the electrically conducting sheets 35 must be attached to the support carrier 33 with integrity required to maintain positioning and dimensional control. This is normally accomplished with an adhesive, indicated by layer 36 of FIG. 12.

Figure 12:
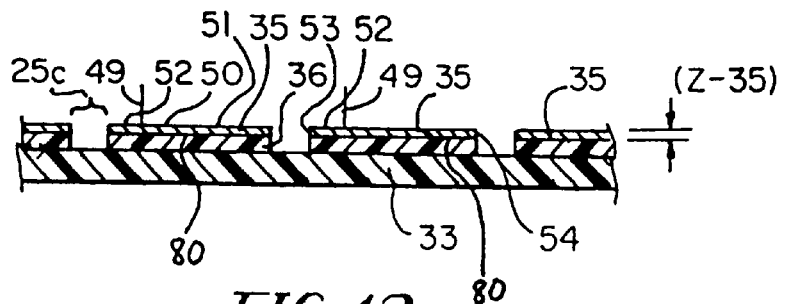
FIG. 12 is a sectional view taken substantially along the line 12—12 of FIG. 11.

Conductive sheets 35 are shown in FIGS. 11 and 12 as having length Y-35, width X-35 and thickness Z-35. It is contemplated that length Y-35 is considerably greater than width X-35 and length Y-35 can generally be described as "continuous" or being able to be processed in roll-to-roll fashion. Width X-35 defines a first terminal edge 53 and second terminal edge 54 of sheet 35.

It is important to note that the thickness of the conductive sheets 35, Z-35 must be sufficient to allow for continuous lamination to the support web 33. Typically when using metal based foils for sheets 35, thickness between 0.001 cm and 0.025 cm would be chosen.

As with the substrate structures of FIGS. 6 through 10, it is helpful to characterize top surface 50 of conductive sheets 35 as having a top collector surface 51 and a top contact surface 52 separated by an imaginary barrier 49. Conductive sheet 35 also is characterized as having a bottom surface 80.

Figure 13A:
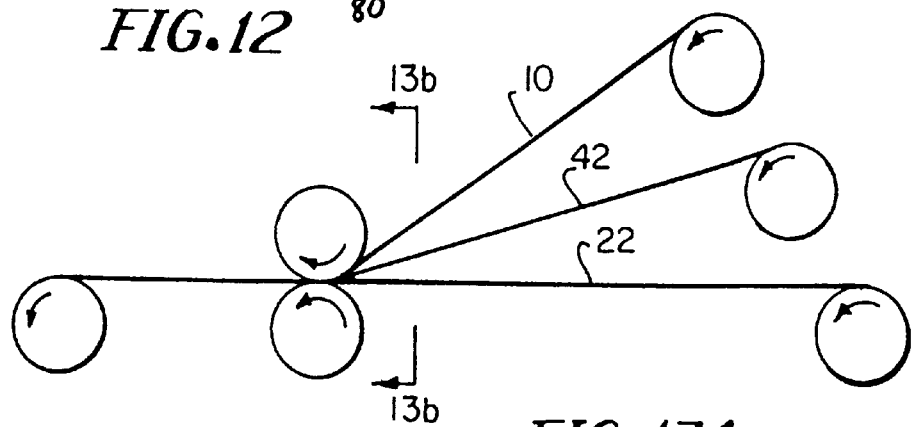
FIGS. 13a and 13b schematically depict a process for laminating the foil supported thin film photovoltaic structure of FIGS. 1 through 3 to an interconnecting substrate structure.
Figure 13B:
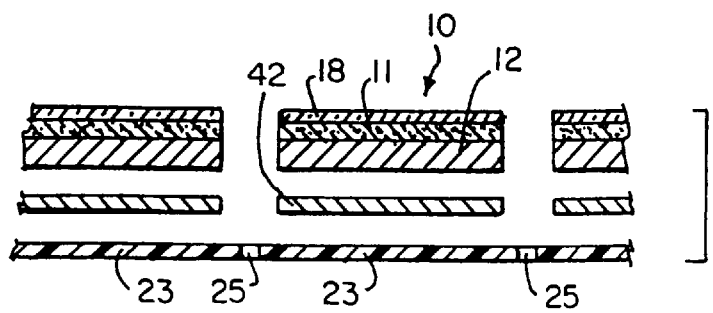

Referring now to FIGS. 13A and 13B, a process is shown for laminating the metal-based foil supported thin film photovoltaic structure of FIGS. 1 through 3 to the substrate structures taught in FIGS. 6 through 12. In FIGS. 13a and 13b, photovoltaic cell structures as illustrated in FIGS. 1 through 3 are indicated by numeral 10. Substrate structures as taught in the FIGS. 6 through 12 are indicated by the numeral 22. Numeral 42 indicates a film of electrically conductive adhesive intended to join electrically conductive metal-based foil 12 of FIGS. 1 through 3 to electrically conductive sheet 23 of FIGS. 6 through 10 or electrically conductive sheets 35 of FIGS. 11 and 12. It will be appreciated by those skilled in the art that the adhesive strip 42 shown in FIGS. 13a and 13b is one of but a number of appropriate metal joining techniques which would maintain required ohmic communication. For example, it is contemplated that methods such as doctor blading a conductive resin prior to lamination, spot welding, soldering, joining with low melt temperature metals or alloys, or crimped mechanical contacts would serve as equivalent methods to accomplish the ohmic joining illustrated as achieved in FIGS. 13a and 13b with a strip of conductive adhesive. These equivalent methods can be generically referred to as conductive joining means. In FIG. 13B, the process of FIG. 13A is illustrated using the substrate structure of FIGS. 6 and 7.

Figure 14A:
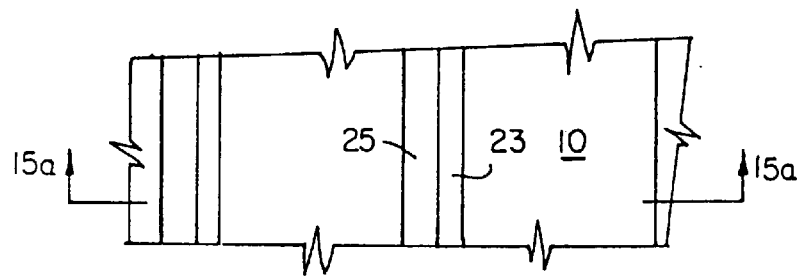
FIGS. 14a, 14b, and 14c are views of the structures resulting from the laminating process of FIGS. 13 and using the substrate structure of FIGS. 7, 8 and 10 respectively.
Figure 14B:
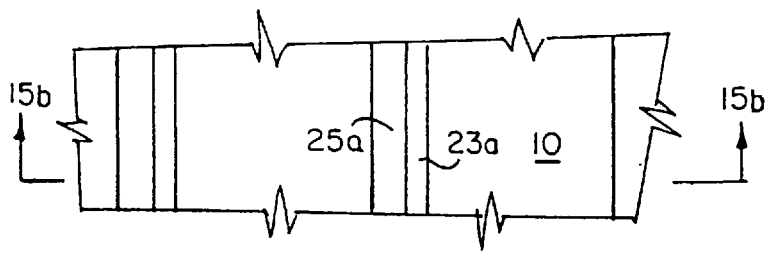
Figure 14C:
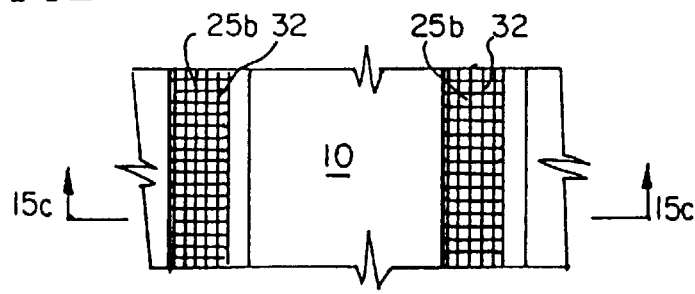
Figure 15A:
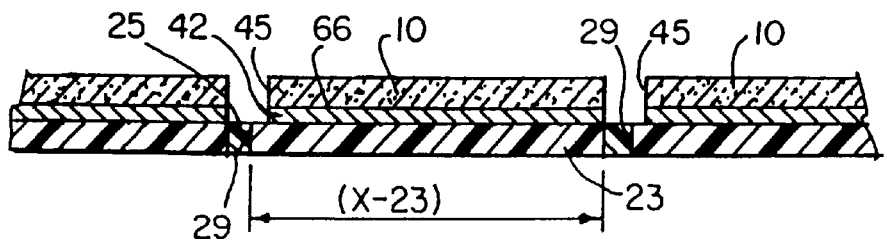
FIGS. 15a, 15b, and 15c are sectional views taken substantially along the lines 15a—15a, 15b—15b, and 15c—15c of FIGS. 14a, 14b, and 14c respectively.
Figure 15B:
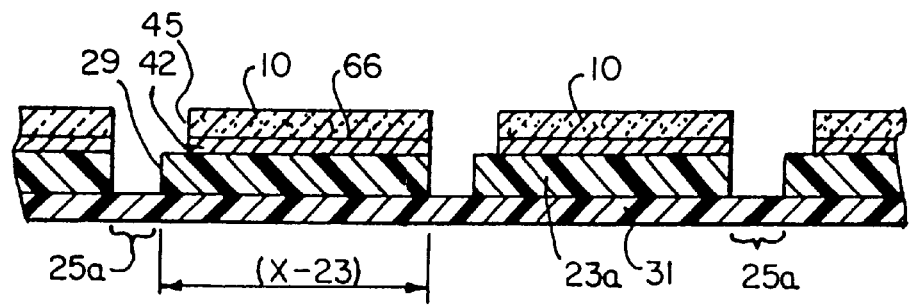
Figure 15C:
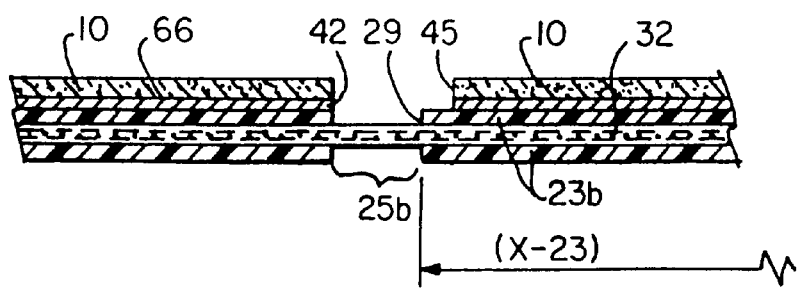

Referring now to FIGS. 14 and 15, there is shown the result of the lamination process of FIG. 13 using the substrate structure of FIGS. 6 through 10. In these and most subsequent figures, cells 10 are shown as a single layer for simplicity, but it is understood that in these figures cells 10 would have a structure similar to that shown in detail in FIG. 2. FIGS. 14a and 15a correspond to the substrate structures of FIGS. 6 and 7. FIGS. 14b and 15b correspond to the substrate structure of FIG. 8. FIGS. 14c and 15c correspond to the substrate structures of FIGS. 9 and 10.

Figure 22:
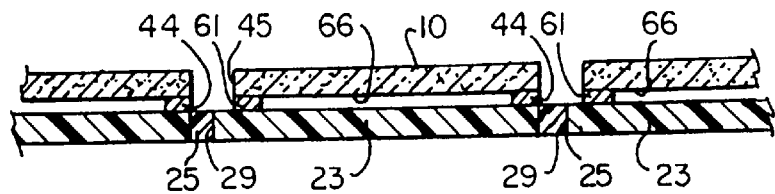
FIG. 22 is a sectional view similar to FIG. 15a but showing an alternate method of accomplishing the mechanical and electrical joining of the lamination process of FIG. 13.

In the FIGS. 15a, 15b and 15c, electrically conductive adhesive layer 42 is shown as extending completely and contacting the entirety of the second surface 66 of metal-based foil supported photovoltaic cells 10. This complete surface coverage is not a requirement however, in that foil 12 is highly conductive and able to distribute current over the expansive width X-10 with minimal resistance losses. For example, the structure of FIG. 22 shows an embodiment wherein electrical communication is achieved between conductive sheet 23 of FIGS. 6 and 7 and second surface 66 of foil 12 through a narrow bead of conductive joining means 61. An additional bead of adhesive shown in FIG. 22 by 44, may be used to ensure spacial positioning and dimensional support for this form of structure. Adhesive 44 need not be electrically conductive.

Figure 23:
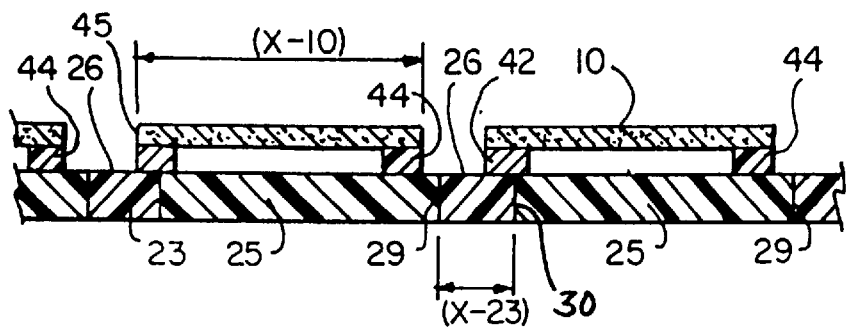
FIG. 23 is a sectional view similar to FIG. 15a but showing an alternate embodiment of the laminated structure.

In the FIGS. 15a, 15b and 15c, the conductive sheets 23, 23a and 23b are shown to be slightly greater in width X-23 than the width of foil X-10. As is shown in FIG. 23, this is not a requirement for satisfactory completion of the series connected arrays. FIG. 23 is a sectional view of a form of the substrate structures of FIGS. 6 and 7 laminated by the process of FIG. 13 to the photovoltaic structures of FIGS. 1–3. In FIG. 23, width X-10 is greater than width X-23. Electrical communication is achieved through conductive joining means 42 and additional joining means 44 to achieve dimensional stability may be employed. The only requirement of the current invention is that first conductive sheet terminal edge 29 be offset from first photovoltaic cell terminal edge 45 to expose a portion of top surface 26 of conductive sheet 23.

Figure 26:
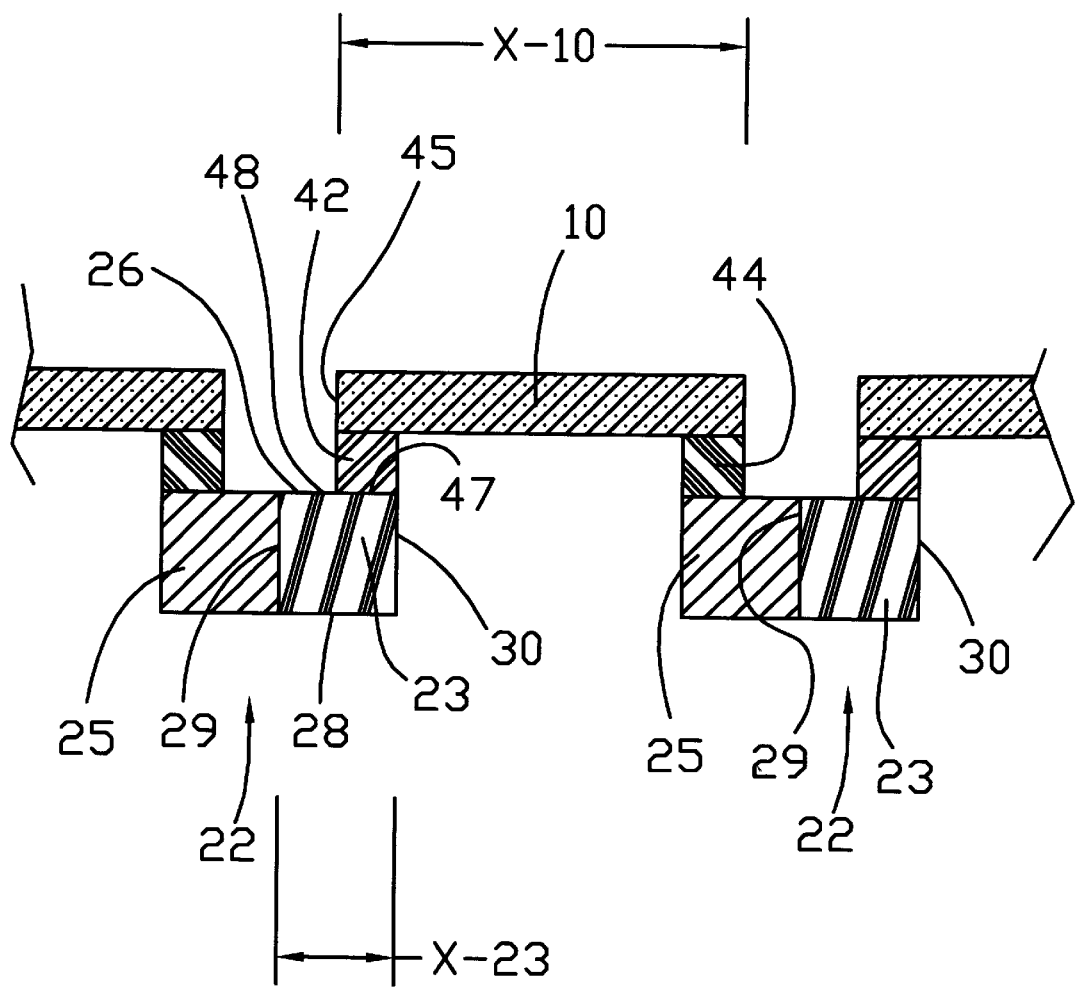
FIG. 26 is a sectional view of another embodiment of a laminated intermediate article in the manufacture of series interconnected arrays.

In FIG. 23, insulating joining portion 25 is shown as extending continuously from second terminal edge 30 of one conductive sheet 23 to the first terminal edge 29 of an adjacent conductive sheet. As shown in FIG. 26, this is not necessary. In FIG. 26, metal foil supported photovoltaic cell 10 is attached to a first conductive sheet 23 through electrically conductive joining means 42 and also to insulating joining portion 25 of an adjacent substrate structure through adhesive 44. Thus, the substrate structure 22 can be discrete. In the embodiment of FIG. 26, the foil based photovoltaic structure 10 is of sufficient strength to maintain proper spacial relationships and positioning among cells.

Figure 16:
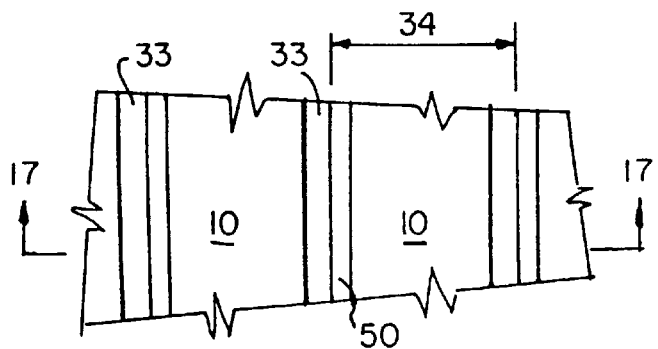
FIG. 16 is a top plan view of the structure resulting from the laminating process of FIG. 13 and using the substrate structure of FIGS. 11 and 12.
Figure 17:
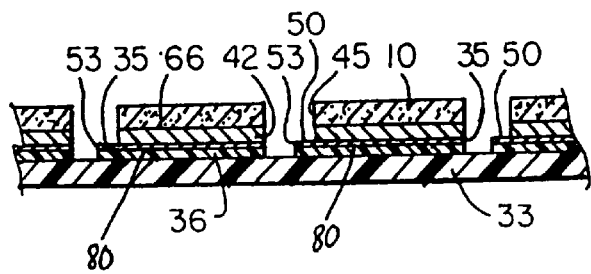
FIG. 17 is a sectional view taken substantially along the line 17—17 of FIG. 16.

Referring now to FIGS. 16 and 17, there is shown an alternate structure resulting from the laminating process of FIG. 13 as applied to the photovoltaic cells of FIGS. 1–3 and the substrate structure of FIGS. 11 and 12. In a fashion similar to that of FIGS. 15, 22, and 23, the first terminal edge 53 of conductive sheets 35 supported by insulating substrate 33 are slightly offset from the first terminal edge 45 of photovoltaic cells 10. This offset exposes a portion of top surface 50 of conductive sheet 35. Electrical and mechanical joining of sheets 35 with second surface 66 of metal-based foil 12 is shown in FIG. 17 as being achieved with conductive adhesive 42 as in previous embodiments. However, it is contemplated as in previous embodiments that this electrical and mechanical joining can be accomplished by alternate means such as soldering, joining with compatible low melting point alloys, spot welding, or mechanical crimping.

In FIG. 17, support web or film 33 is shown as extending continuously among many cells. However, it should be clear that support film 33 can be discontinuous. Support film 33 need only be attached to a portion of a first sheet 35 and a portion of a second sheet 35 of an adjacent cell. This arrangement would suffice to achieve the desired spacial positioning among cells and leave exposed a portion of back surface 80 of electrically conductive sheet 35.

Comparing the sectional views of FIGS. 15, 22, 23 and 17, one observes many similarities. The most important common structural similarity is that the first terminal edges 29 of conductive sheets 23 be offset slightly from first terminal edge 45 of photovoltaic cells 10 (FIGS. 15, 22, 23). Similarly, first terminal edges 53 of conductive sheets 35 are slightly offset from first terminal edges 45 of photovoltaic cells 10 (FIG. 17). As will be shown, the resulting exposed top surface portions are used as contact surfaces for the final interconnected array.

Figure 24:
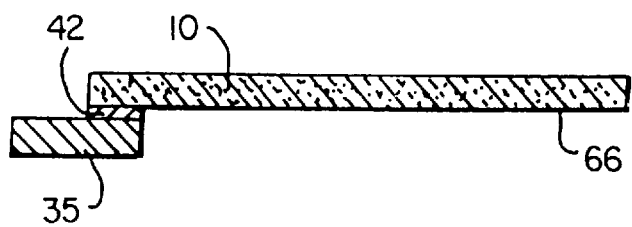
FIG. 24 is a sectional view of an alternate embodiment.
Figure 25:
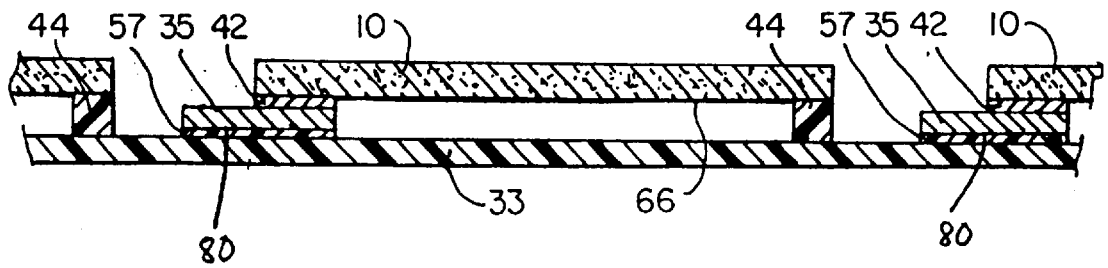
FIG. 25 is a sectional view of the embodiment of FIG. 24 after a further processing step.

It should also be observed that the structures equivalent to those shown in FIGS. 16 and 17 can also be achieved by first joining photovoltaic cells 10 and conductive sheets 35 with suitable electrically conductive joining means 42 to give the structure shown in FIG. 24 and laminating these strips to an insulating support web 33. An example of such an equivalent structure is shown in FIG. 25, wherein the laminates of FIG. 24 have been adhered to insulating web 33 in defined repeat positions with adhesive means 57 and 44. As mentioned above and as shown in FIGS. 24 and 25, conductive sheets 35 do not have to contact the whole of the bottom surface 66 of photovoltaic cell 10. In addition, support web 33 need not be continuous among all the cells. The support web 33 need only extend from the adhesive means 57 of one cell to the adhesive attachment 44 of an adjacent cell. This arrangement would leave a portion of the bottom surface 66 of foil 12, and perhaps a portion of the bottom surface 80 of conductive sheet 35 exposed.

Figure 18:
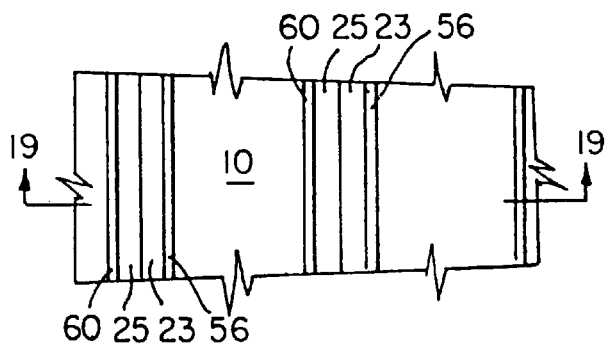
FIG. 18 is a top plan view of the structures of FIGS. 14a and 15a but following an additional step in manufacture of the interconnected cells.
Figure 19:
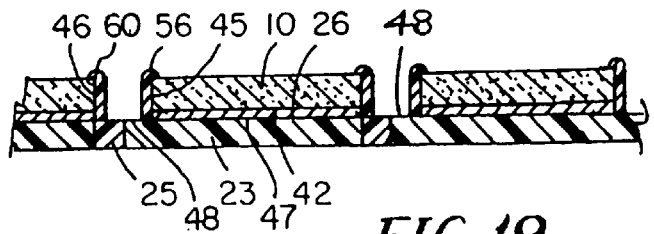
FIG. 19 is a sectional view taken substantially along the line 19—19 of FIG. 18.

Referring now to FIGS. 18 and 19, insulating beads 56 and 60 of insulating material having been applied to the first and second terminal edges 45 and 46 respectively of photovoltaic cells 10. While these beads 56 and 60 are shown as applied to the structure of FIG. 15a, it is understood that appropriate beads of insulating material are also envisioned as a subsequent manufacturing step for the structures of FIGS. 15b, 15c, 17, 22, 23, 25, and 26. The purpose of the insulating beads is to protect the edge of the photovoltaic cells from environmental and electrical deterioration. In addition, as will be shown the insulating bead allows for electrical interconnections to be made among adjacent cells without electrical shorting.

It is noted that the application of insulating material 56 to first terminal edge 45 of photovoltaic cells 10 effectively divides the top surfaces 26 and 50 of conductive sheets 23 and 35 respectively into two regions. The first region (region 48 of surface 26 or region 52 of surface 50) can be considered as a contact region for series interconnects among adjacent cells. The second region (region 47 of surface 26 or region 51 of surface 50) can be considered as the contact region for interconnecting the substrate to the second surface 66 of photovoltaic cells 10.

Figure 20:
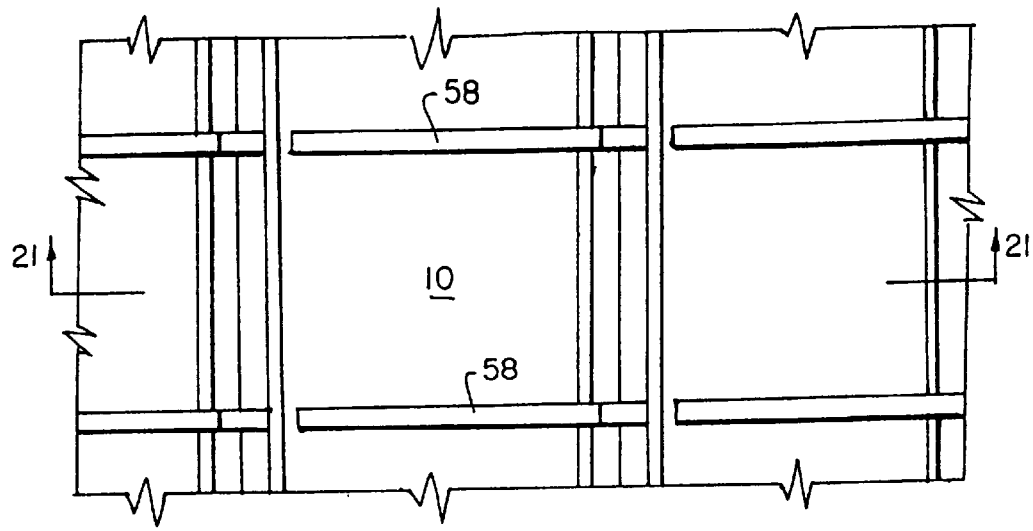
FIG. 20 is a top plan view of a completed interconnected array.
Figure 21:
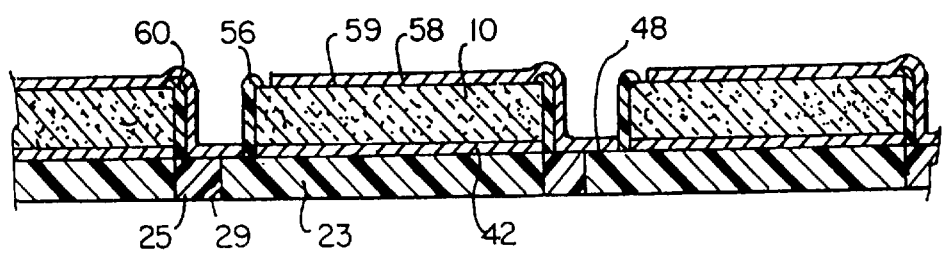
FIG. 21 is a sectional view taken substantially along line 21—21 of FIG. 20.

Referring now to FIGS. 20 and 21, there is shown the method of forming the final interconnected array. Grid fingers 58 of a highly electrically conductive material are deposited to achieve electrical communication between the top surface 59 of the photovoltaic cell 10 and the remaining exposed contact regions 48 or 52 of an adjacent cell. It is contemplated that these fingers can be deposited by any of a number of processes to deposit metal containing or metal-based foils or films, including masked vacuum deposition, printing of conductive inks, electrodeposition or combinations thereof.

Figure 27:
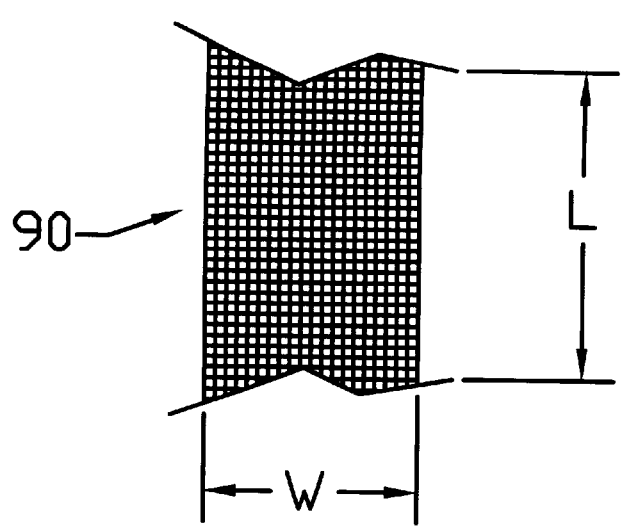
FIG. 27 is a top plan view of a starting material for another embodiment of substrate structure.

Referring now to FIG. 27, the starting material for yet another embodiment is illustrated in plan view. Web, mesh or fabric strip 90 is characterized by having a width "W" and a length "L". It is contemplated that length "L" is considerably greater than width "W" and length "L" can generally be described as "continuous" or being able to be processed in a roll-to-roll fashion.

Figure 28:
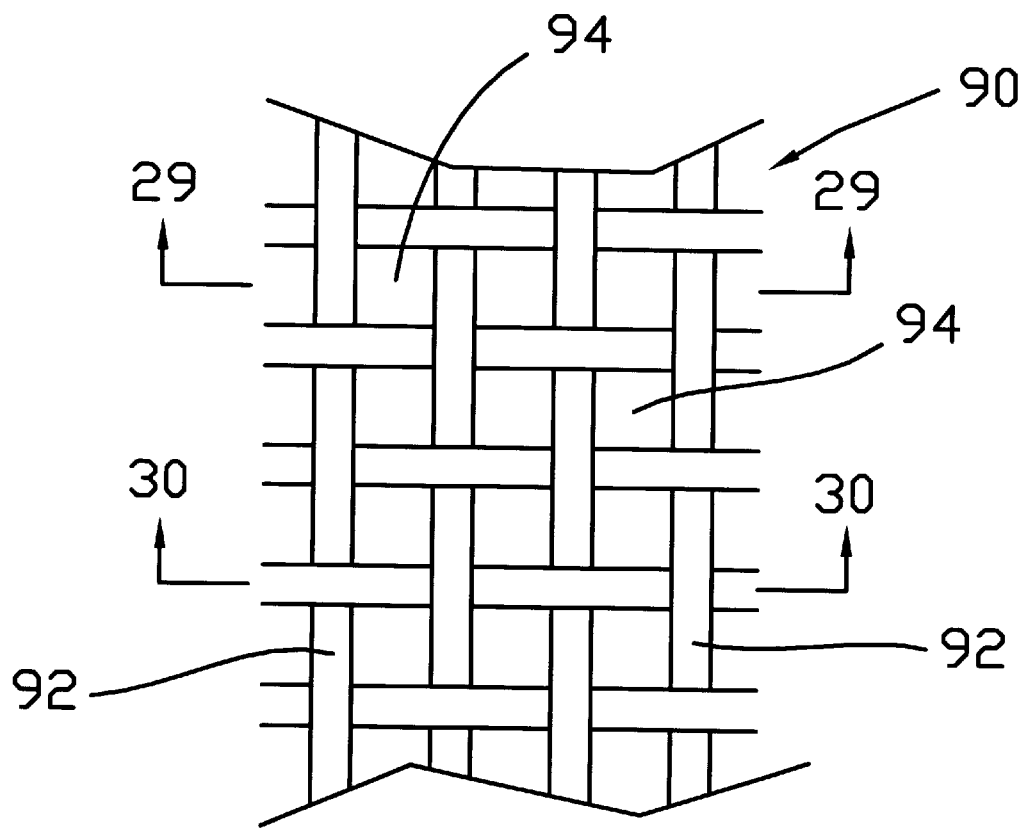
FIG. 28 is a greatly magnified plan view of the material of FIG. 27.

FIG. 28, a greatly magnified plan view of a portion of the structure of FIG. 27, shows the fabric 90 comprising fibrils 92 interwoven to form a sturdy structure. Holes 94 are present among the interwoven fibrils. It is understood that the fibrils need not be actually interwoven as shown. Equivalent structures comprising fibrils and holes, such as polymeric non-woven fabric or adhesively bonded fibril mats, can be employed.

Figure 29:
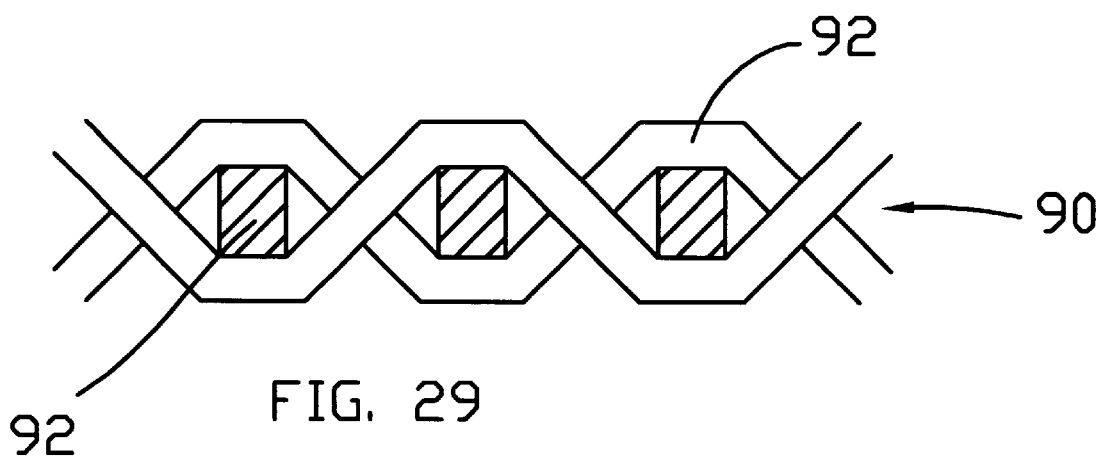
FIG. 29 is a sectional view taken substantially along line 29—29 of FIG. 28.
Figure 30:
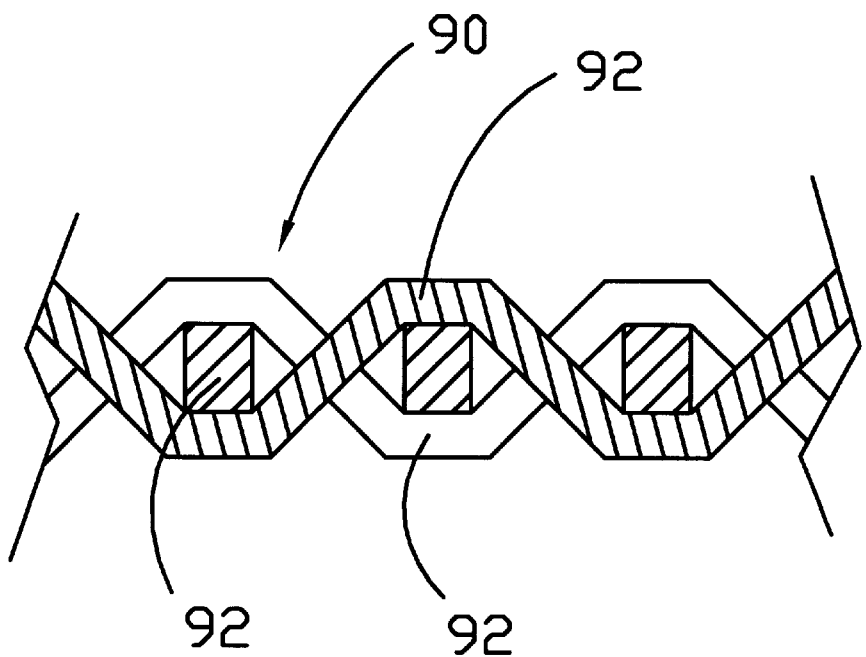
FIG. 30 is a sectional view taken substantially along line 30—30 of FIG. 28.

FIGS. 29 and 30 are sectional views of the embodiment of FIG. 28 taken substantially along line 29—29 and line 30—30 of FIG. 28 respectively.

Figure 31:
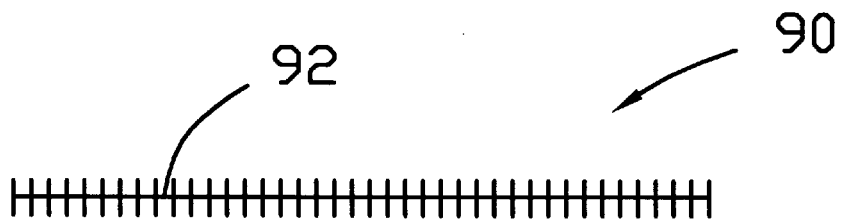
FIG. 31 is a simplified sectional view representing the structure depicted in FIGS. 29 and 30.

FIG. 31 is a greatly simplified sectional representation of the structure depicted in FIGS. 29 and 30. This simplified representation of FIG. 31 is useful in the illustration of subsequent embodiments.

Figure 32:
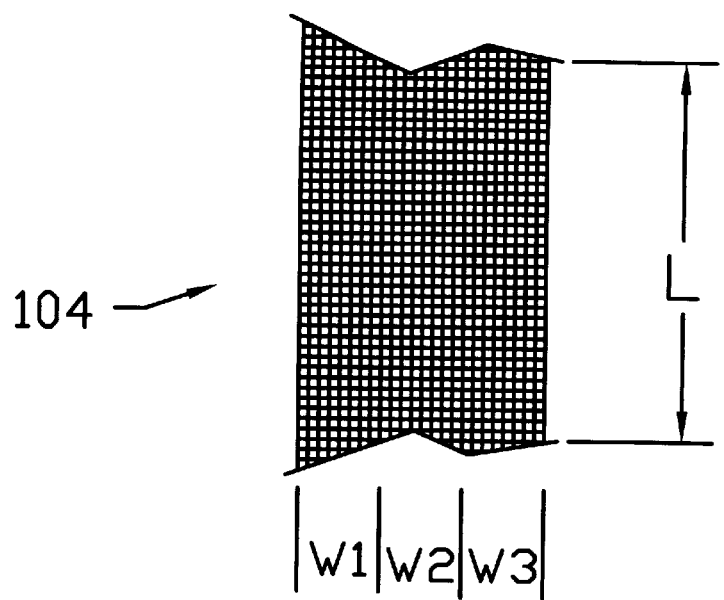
FIG. 32 is a view similar to FIG. 27 but defining three distinct area portions of the structure produced by a process step.

Referring now to FIG. 32, there is shown the material shown in FIG. 27 following an additional processing step. The material of width "W" is now generally designated as 104 to indicate this additional process step. Width "W" has been further defined as comprising three minor widths "W1", "W2", and "W3". Each of these widths "W1", "W2", and "W3" is understood to extend along length "L" as indicated.

Figure 33:
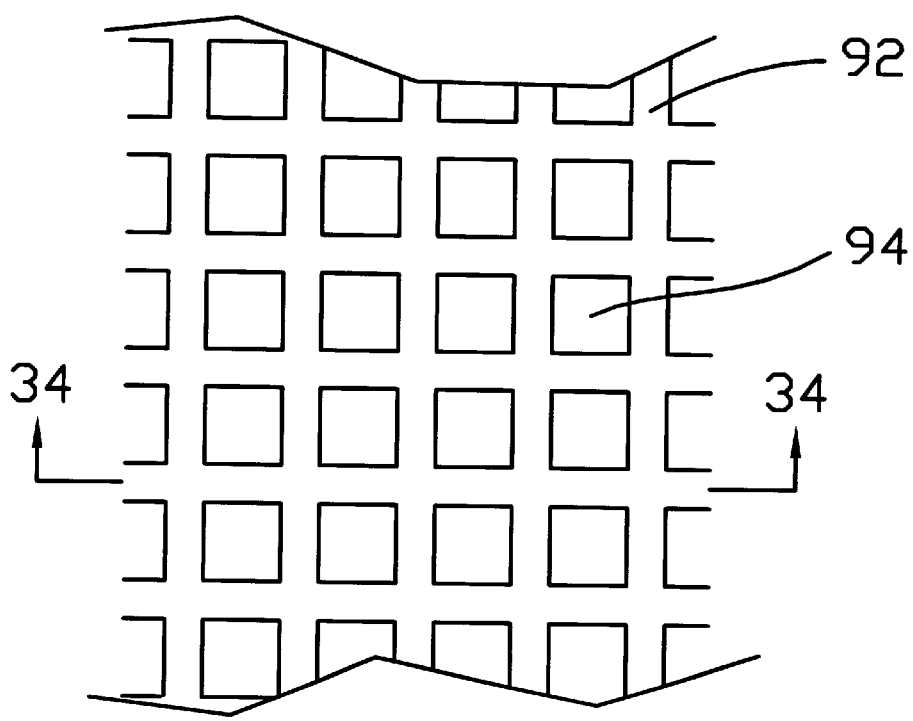
FIG. 33 is a greatly magnified plan view of that portion of FIG. 32 defined by "W2".
Figure 34:
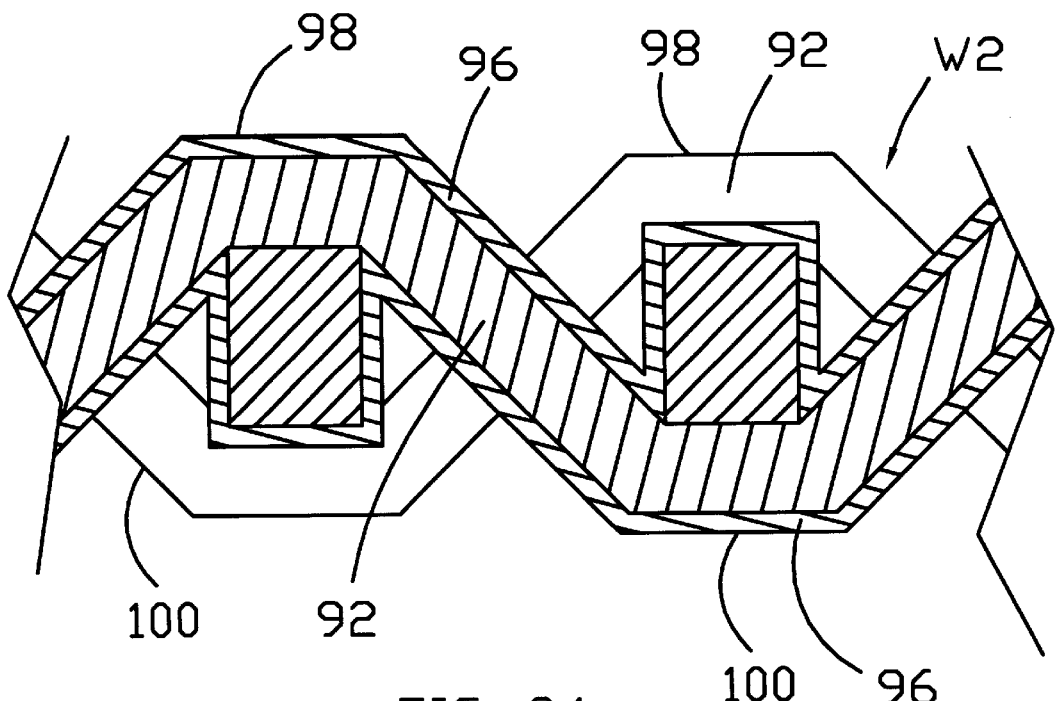
FIG. 34 is a greatly magnified sectional view of a portion of the structure of FIG. 33 taken substantially from the perspective of line 34—34 of FIG. 33.

FIG. 33 is a greatly magnified plan view of the portion of FIG. 32 structure identified as minor width "W2". In contrast to the plan view shown in FIG. 28, the structure of FIG. 33 appears continuous in the two-dimensional plan view. This continuity results from coating the fibrils with an electrically conductive coating. The structure of the coated fibrils is best shown in the sectional view of FIG. 34, which is a view taken substantially along line 34—34 of FIG. 33. In FIG. 34, fibrils 92 in the region "W2" have been coated with electrically conductive coating 96. It is anticipated that coating 96 and the deposition process for applying coating 96 can be chosen from any number of suitable techniques. Included in such techniques are painting, dipping, or printing of conductive inks, laminating, and masked chemical or vapor deposition of metals or other conductive materials. In the case of a temperature resistant fabric such as fiberglass, deposition of a low melting point metal such as solder could be employed. A particularly advantageous coating 96 to prepare the structure of FIG. 34 is DER applied using a paint solution or paste. The DER is inexpensive, and readily formulated and applied from solution form.

The important feature of the structure of FIG. 34 is that through-hole electrical communication extends from the top surface 98 to the bottom surface 100 in the region defined by "W2" of FIG. 32. This situation is readily achieved by using the coated fabric approach of the present embodiments.

Figure 35:
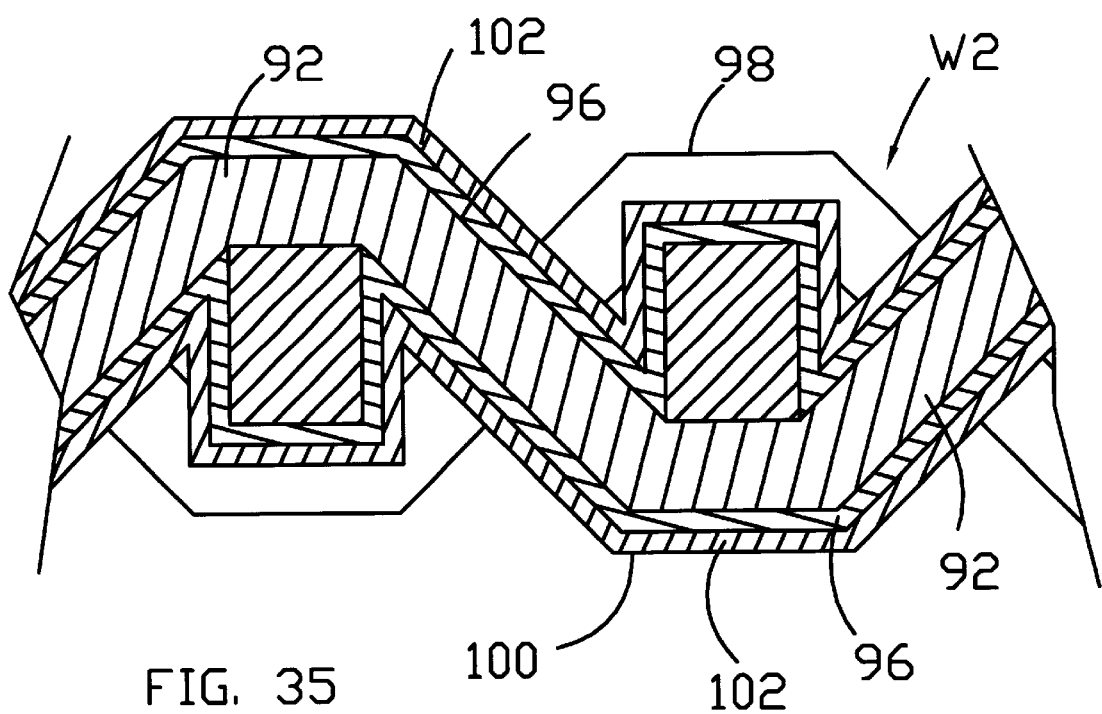
FIG. 35 is a sectional view similar to FIG. 34 showing the structure following an optional additional process step.

FIG. 35 is a sectional view similar to FIG. 34 following an additional optional process step. In FIG. 35, the electrical conductivity and mechanical and environmental integrity of the structure is further enhanced by applying an additional highly conductive coating 102 overlaying coating 96. This subsequent coating 102 can be conveniently applied by metal electrodeposition. The structure of FIG. 35 gives highly conductive communication, equivalent to a metal screen, from top surface 98 to bottom surface 100 in region "W2" by virtue of the through-hole electrodeposition.

Figure 36:
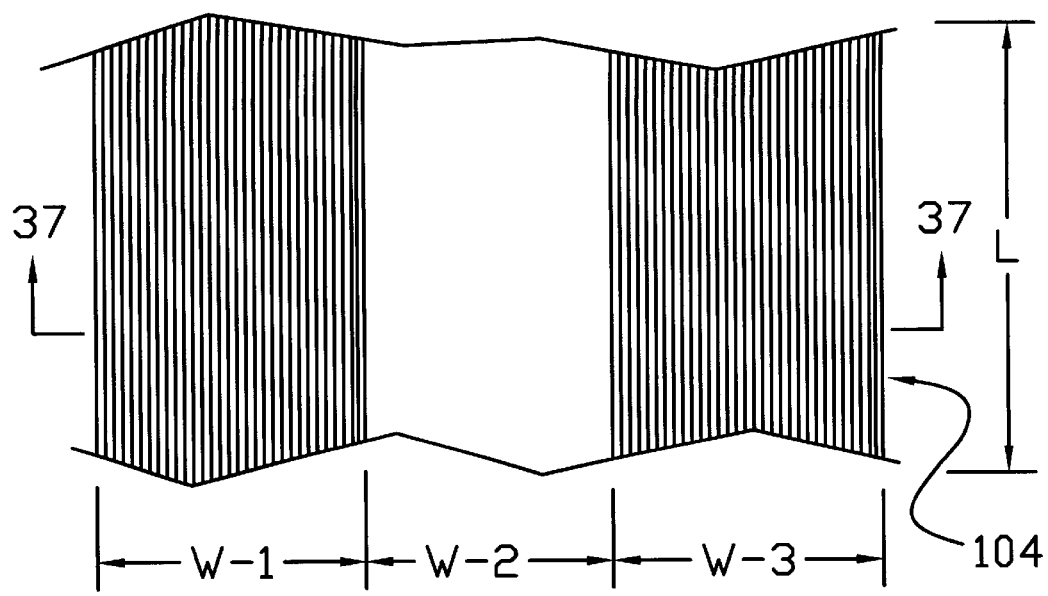
FIG. 36 is a simplified plan view of the structure of FIG. 32 useful in illustrating the process and structure of the embodiment.

Referring now to FIG. 36, there is shown a simplified plan view of the 104 structure intended to facilitate teaching of the processing steps envisioned to accomplish manufacture of the series connected photovoltaic arrays using the substrate structure 104. In FIG. 36, the regions "W1" and "W3" have structure shown in detail in FIGS. 28–30. In FIG. 36, region "W2" has structure shown in detail in FIGS. 33 and 34 and optionally FIG. 35.

Figure 37A:
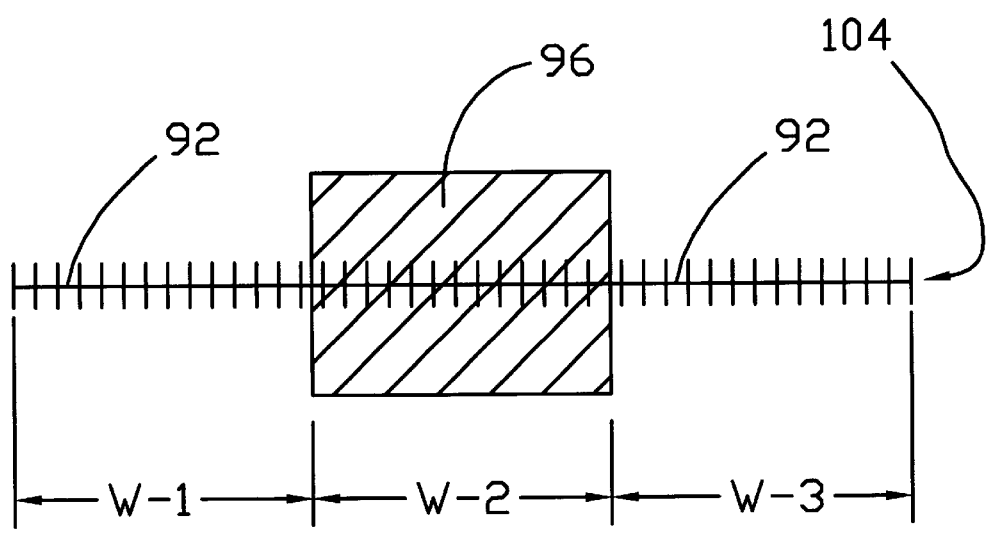
FIG. 37A is a simplified sectional view taken substantially along line 37—37 of FIG. 36, useful in illustrating the process and structure of the embodiment.
Figure 37B:
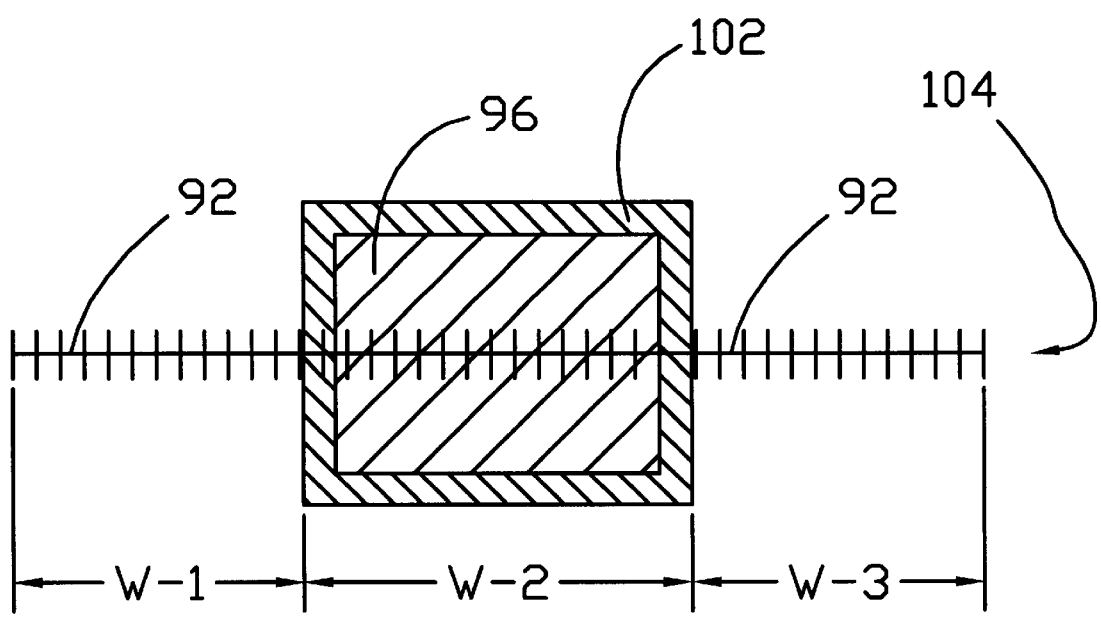
FIG. 37B is a simplified sectional view similar to FIG. 37A incorporating an optional additional process step.

Referring now to FIG. 37a, there is shown a simplified sectional view of the 104 structure employing the "W2" structure depicted in FIG. 34. FIG. 37b shows a similar view of the 104 structure employing the "W2" structure depicted in FIG. 35. These simplifications will help illustration of the processing steps and the structures resulting from these processing steps.

Figure 38:
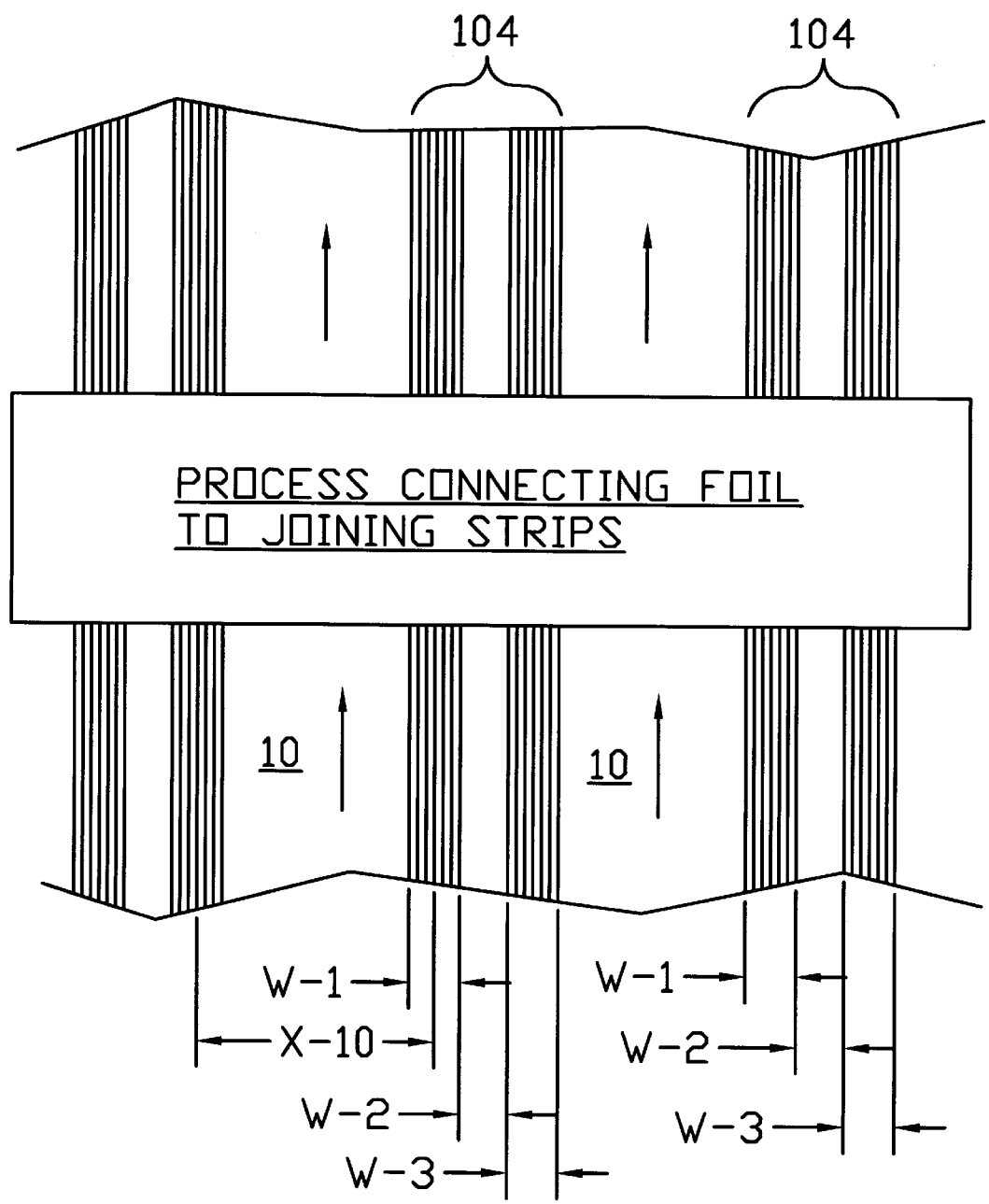
FIG. 38 is a schematic depiction of a process for joining the foil supported thin film photovoltaic structure of FIGS. 1 through 3 to the substrate structure of FIGS. 32 or 36.

Referring now to FIG. 38 there is shown a schematic depiction of a process for joining the foil supported thin film photovoltaic structure of FIGS. 1 through 3 with the substrate strips 104. Photovoltaic cells 10 are continuously fed to the process in spaced relationship to substrate strips 104. The process accomplishes attaching one edge portion of cells 10 to a portion "W3" of one substrate strip 104 and an opposite edge portion of cells 10 to a portion "W1" of a second substrate strip 104.

Figure 39:
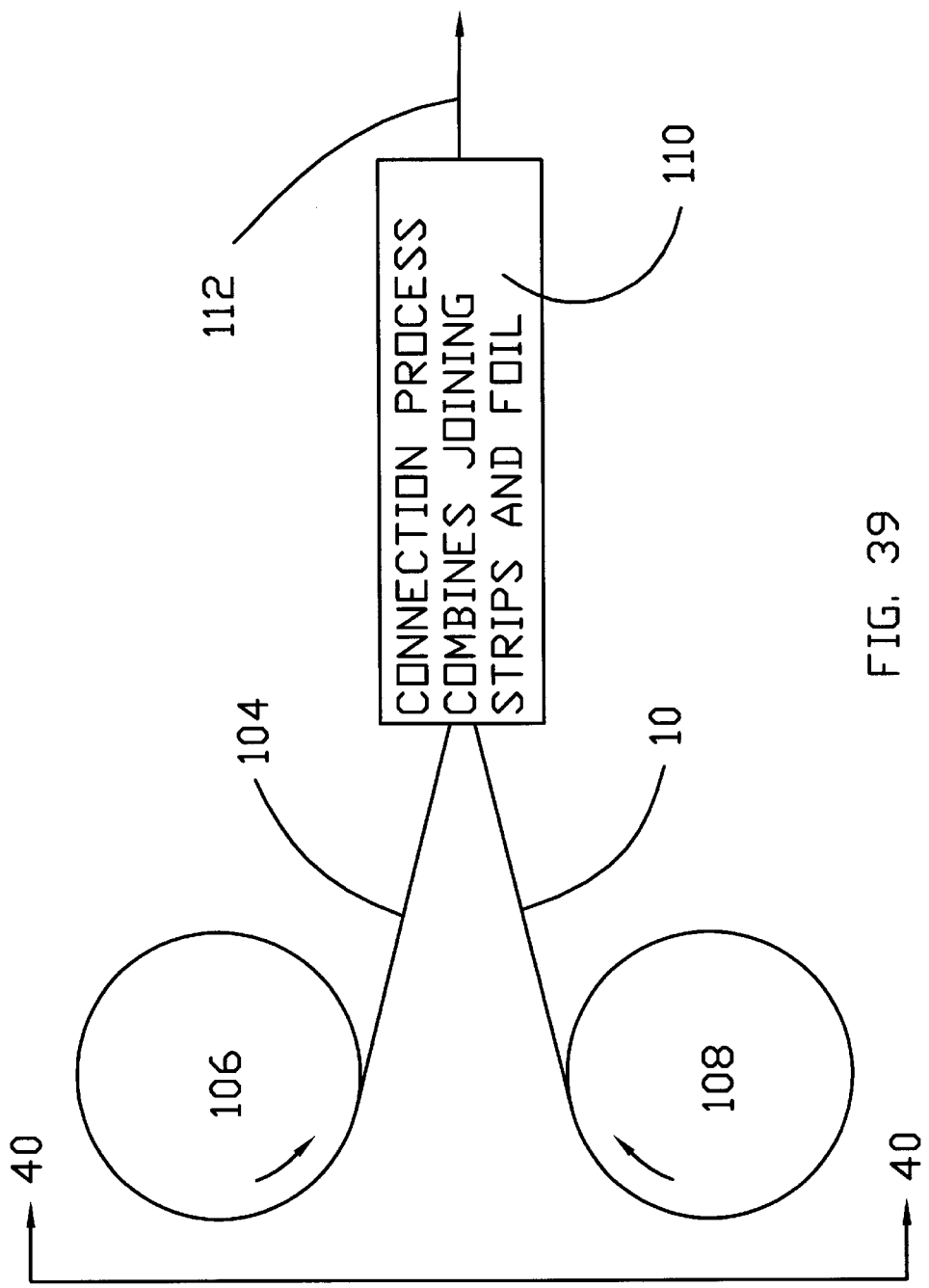
FIG. 39 illustrates one form of the process depicted in FIG. 38.
Figure 40:
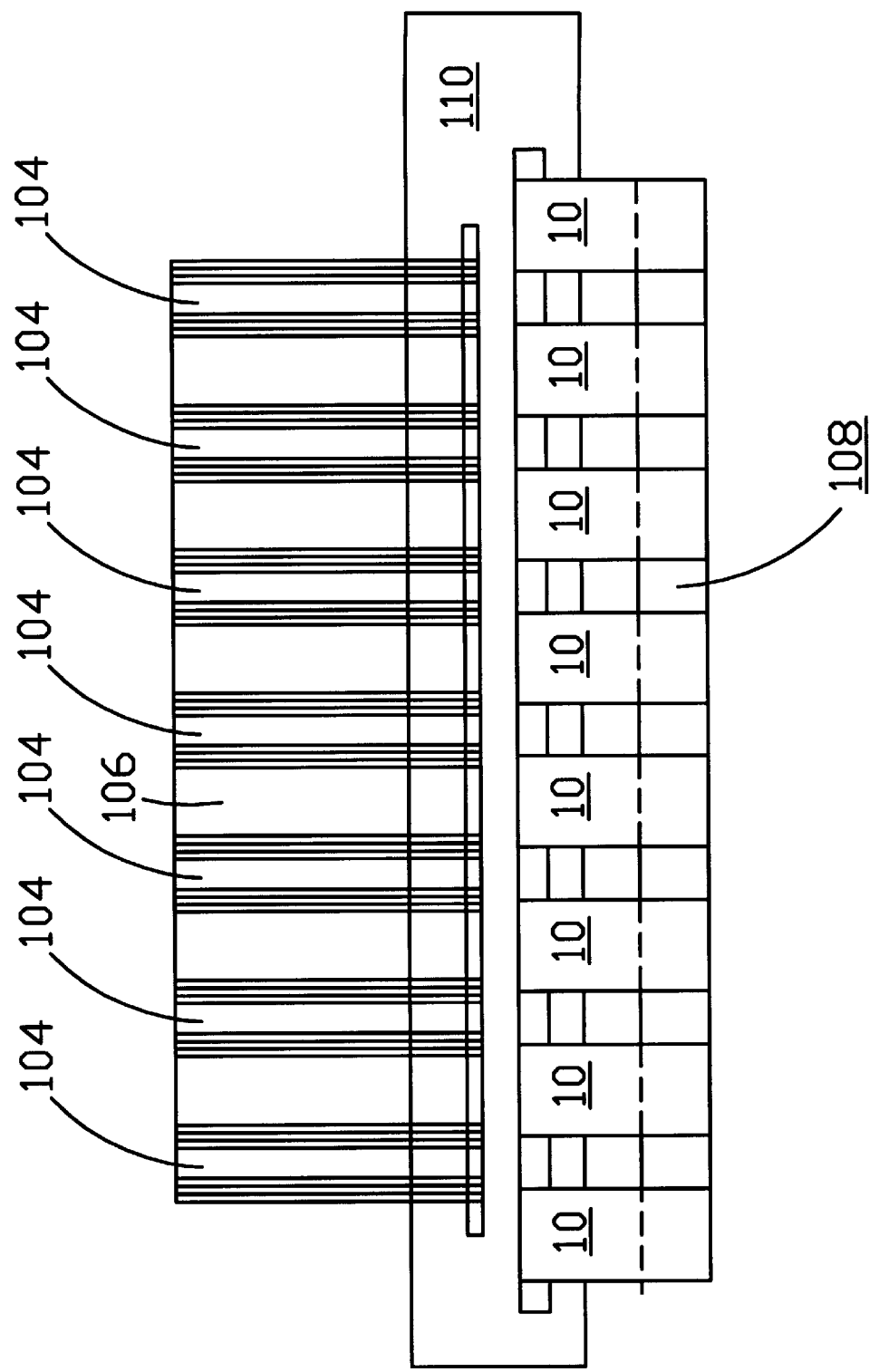
FIG. 40 is a view of the process of FIG. 39 taken substantially along line 40—40 of FIG. 39.

FIGS. 39 and 40 illustrate the process of FIG. 38 in more detail. In FIG. 39, spacially positioned substrate strips 104 are continuously fed to the joining process 110 from roll 106. Spacially positioned photovoltaic cells 10 are continuously fed to the process 110 from roll 108. The resultant combined structure is designated by the numeral 112.

FIG. 40 illustrates the process of FIG. 39 from the perspective of line 40—40 of FIG. 39.

Figure 41:
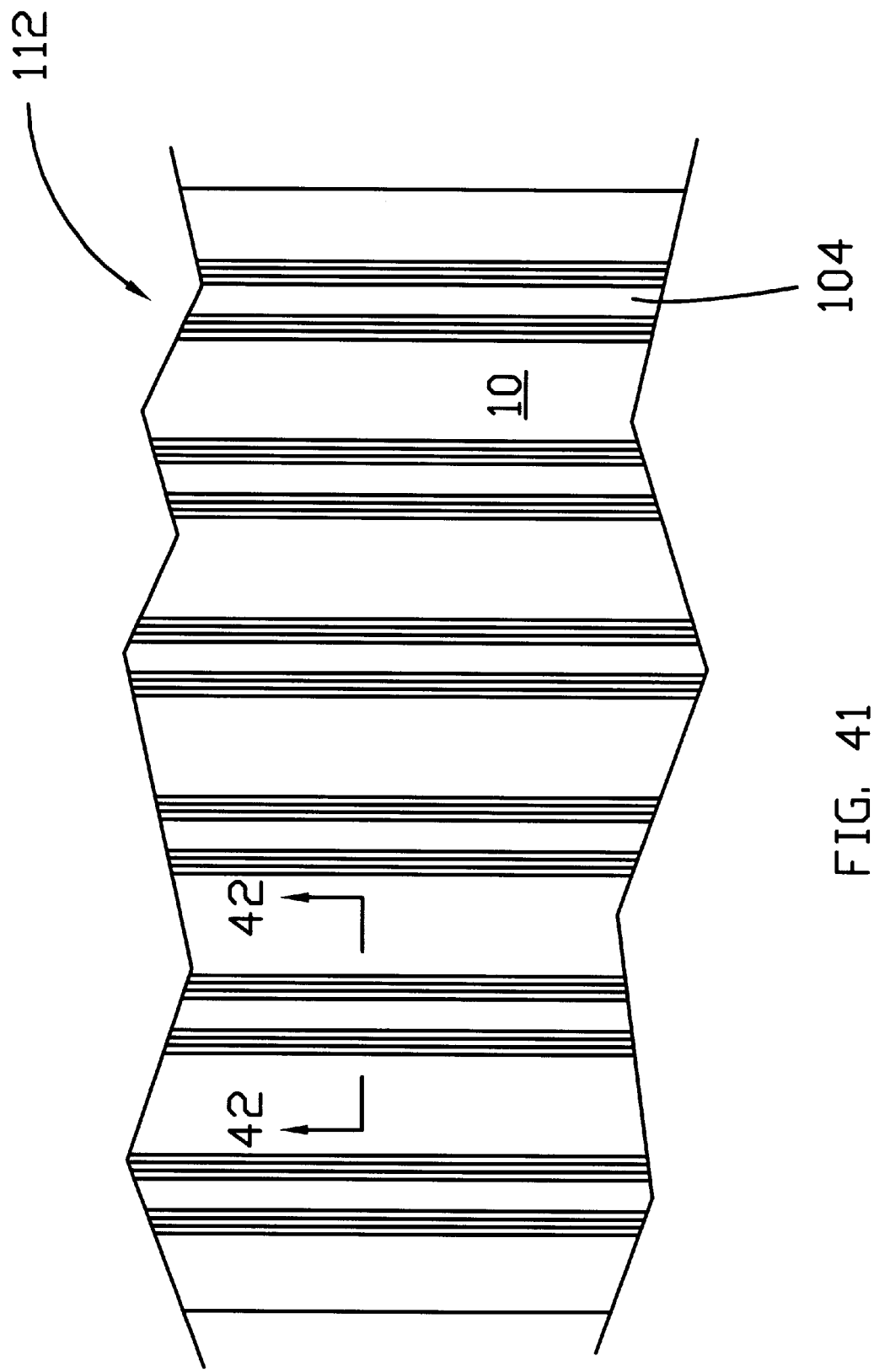
FIG. 41 is a plan view of the structure resulting from the process of FIG. 38.

FIG. 41 is a plan view of the combined structure resulting from joining process 110.

Figure 42A:
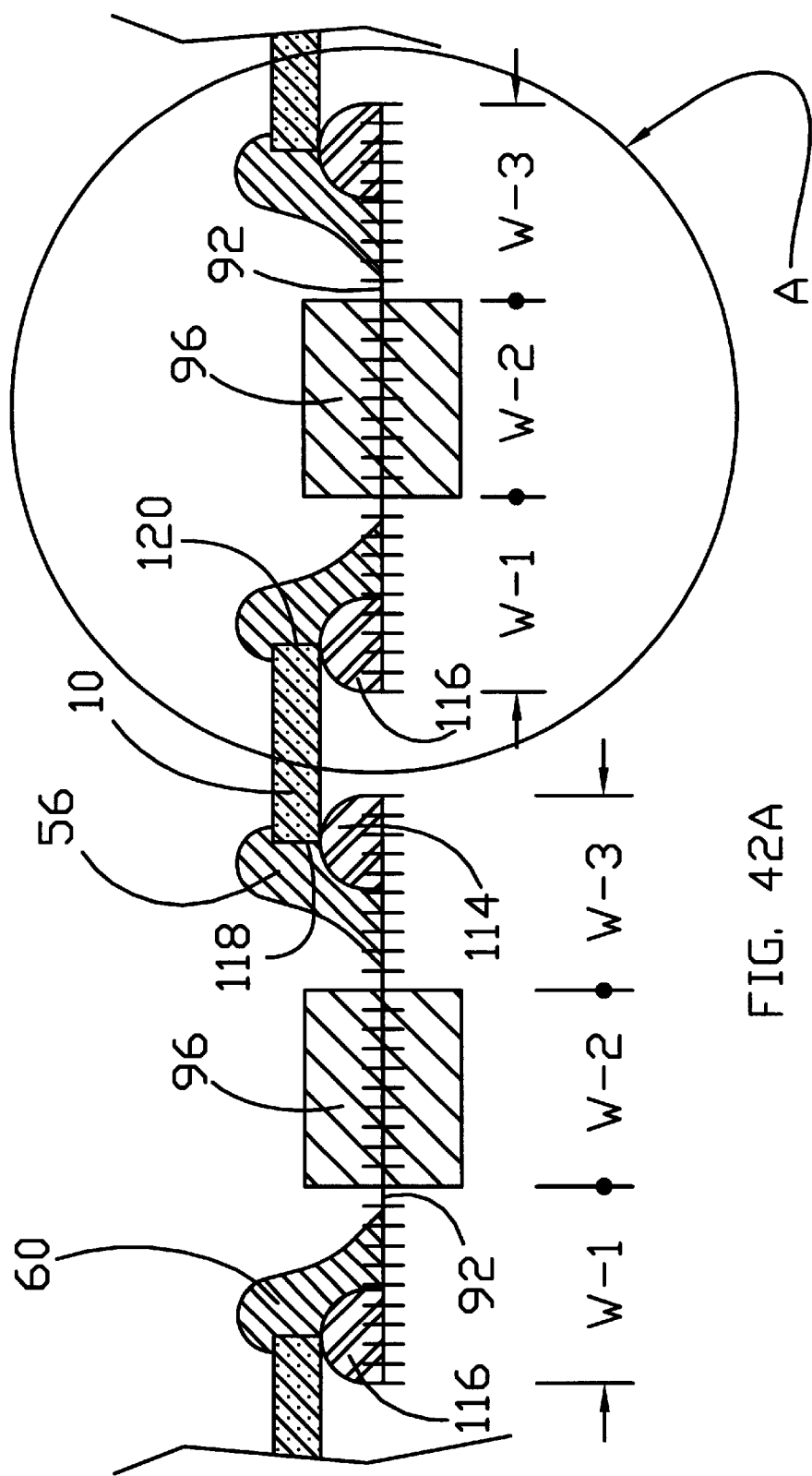
FIG. 42A is an embodiment of the structure of FIG. 41 taken substantially along line 42—42 of FIG. 41.

FIG. 42A is a simplified sectional view taken substantially along line 42—42 of FIG. 41 of the product from process 110 when structure 104 shown in FIG. 37A is employed. Adhesive bead 114 is used to attach a first edge portion 118 of photovoltaic cell structure 10 to portion "W3" of a substrate strip and adhesive bead 116 attaches the second edge portion of cell 10 to portion "W1" of another substrate strip. Insulating beads 56 and 60 protect the first and second terminal edges of photovoltaic cells 10.

Figure 42B:
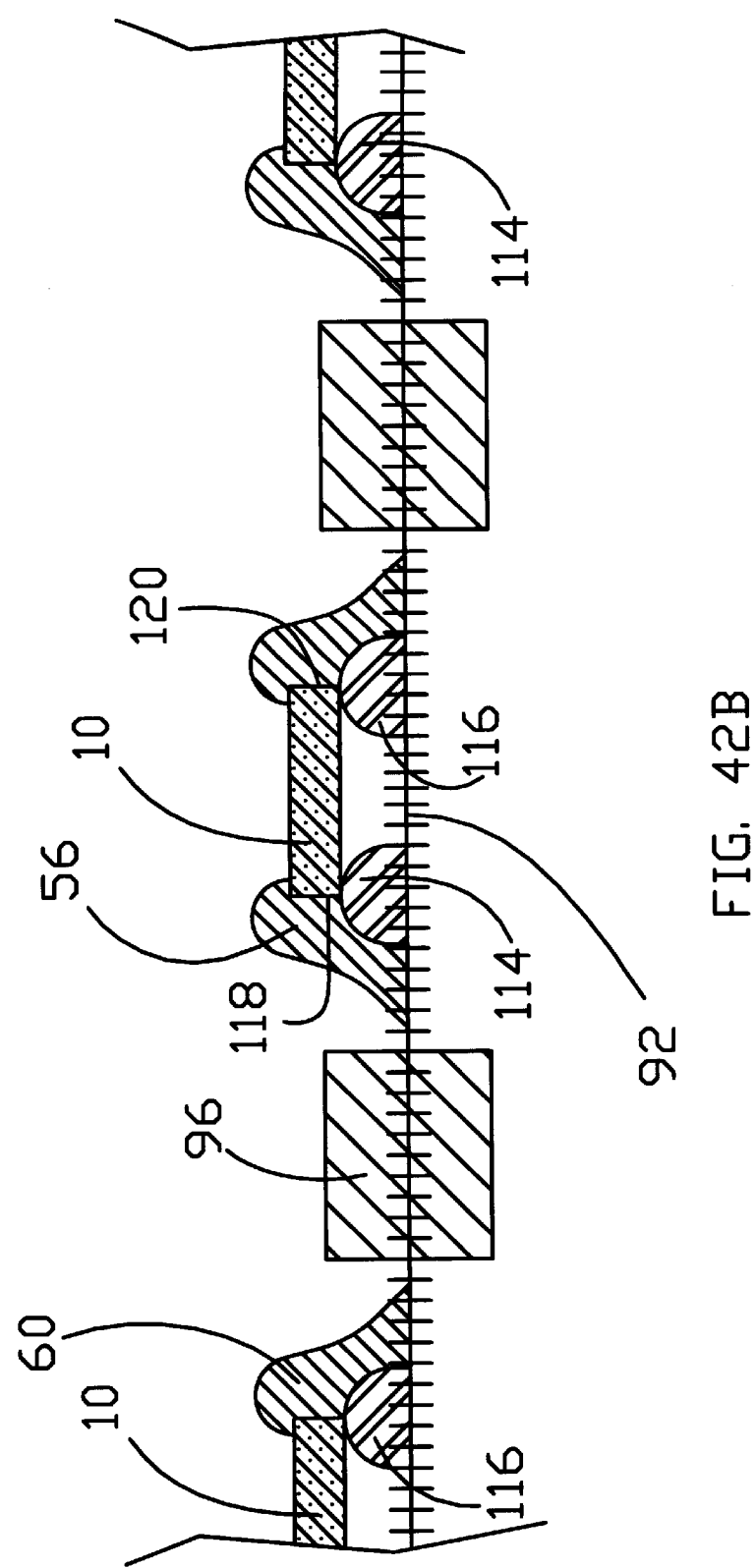
FIGS. 42B and 42C are views similar to 42A showing alternate embodiments of the structure depicted in FIG. 41.

FIG. 42B is a structure similar to 42A but shows that the substrate structure need not be discrete strips but can be joined. This is equivalent to stating the portion "W1" of one strip is joined to portion "W3" of another strip. Maintenance of spacial positioning and mechanical integrity are promoted by the structure depicted in FIG. 42B.

Figure 42C:
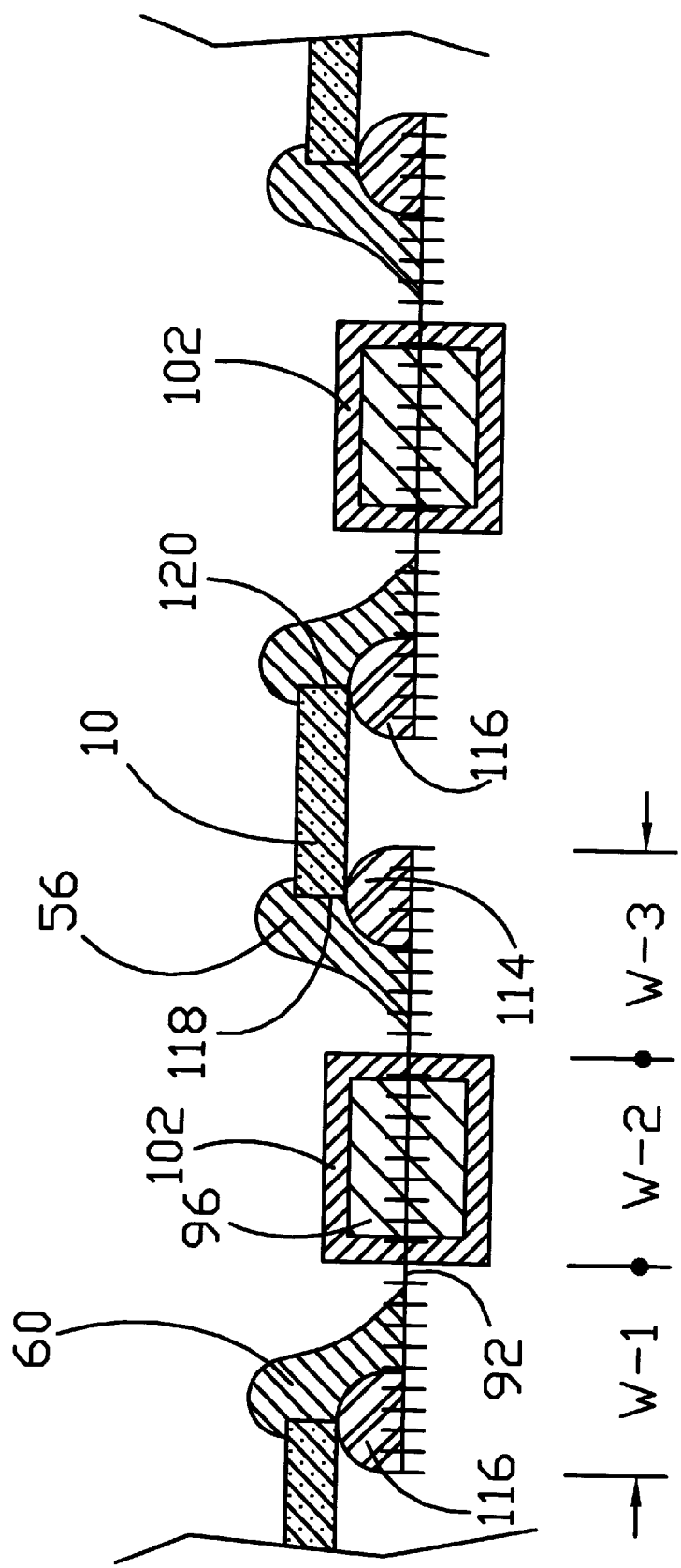

FIG. 42C is a view similar to 42A but employing the substrate structure 104 shown in FIG. 37B.

Figure 43:
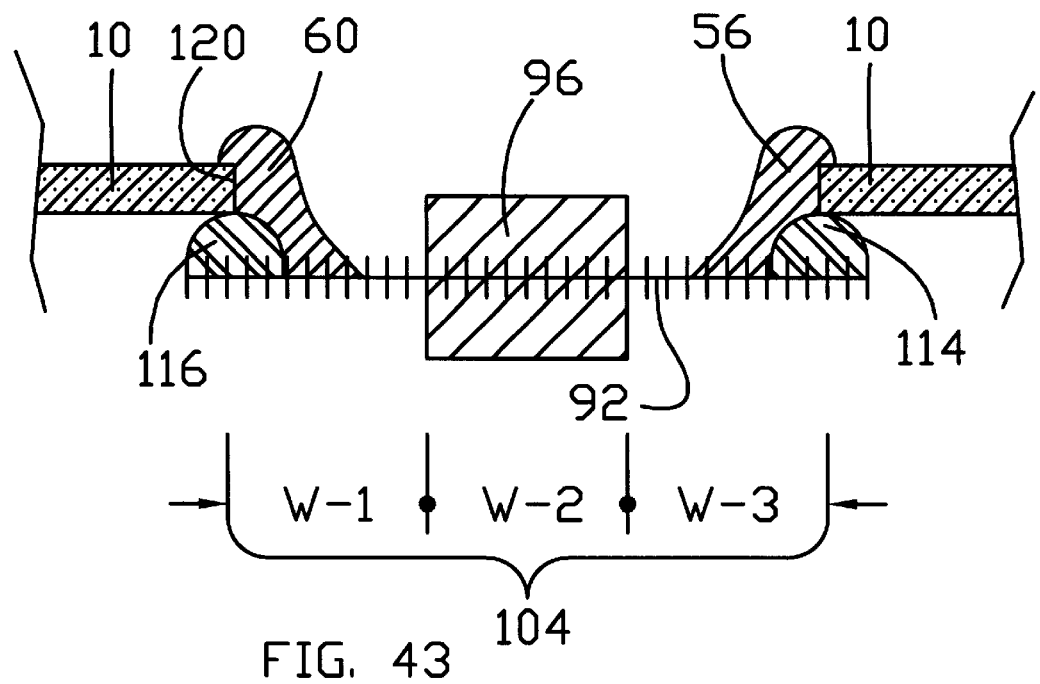
FIG. 43 is an enlarged view of the portion of FIG. 42A shown within circle "A".

FIG. 43 is an enlarged view of the structural portion within circle "A" of FIG. 42a.

FIG. 44A is a view similar to FIG. 43 but following an additional manufacturing step in preparation of the series connected array. In FIG. 44A an electrically conductive coating 122 extends from the top surface 59 of photovoltaic cell 10a over insulating bead 60 and to electrically conductive region "W2". Coating 122 can comprise a number of electrically conductive media, such as conductive inks or conductive adhesives. Appropriate conductive inks or adhesives can be applied by silk screening, masked printing, or simple extrusion of molten conductive thermoplastic. Alternate forms of applying coating 122 are chemical or vacuum deposition of conductive materials in conjunction with appropriate masking techniques.

Figure 44:
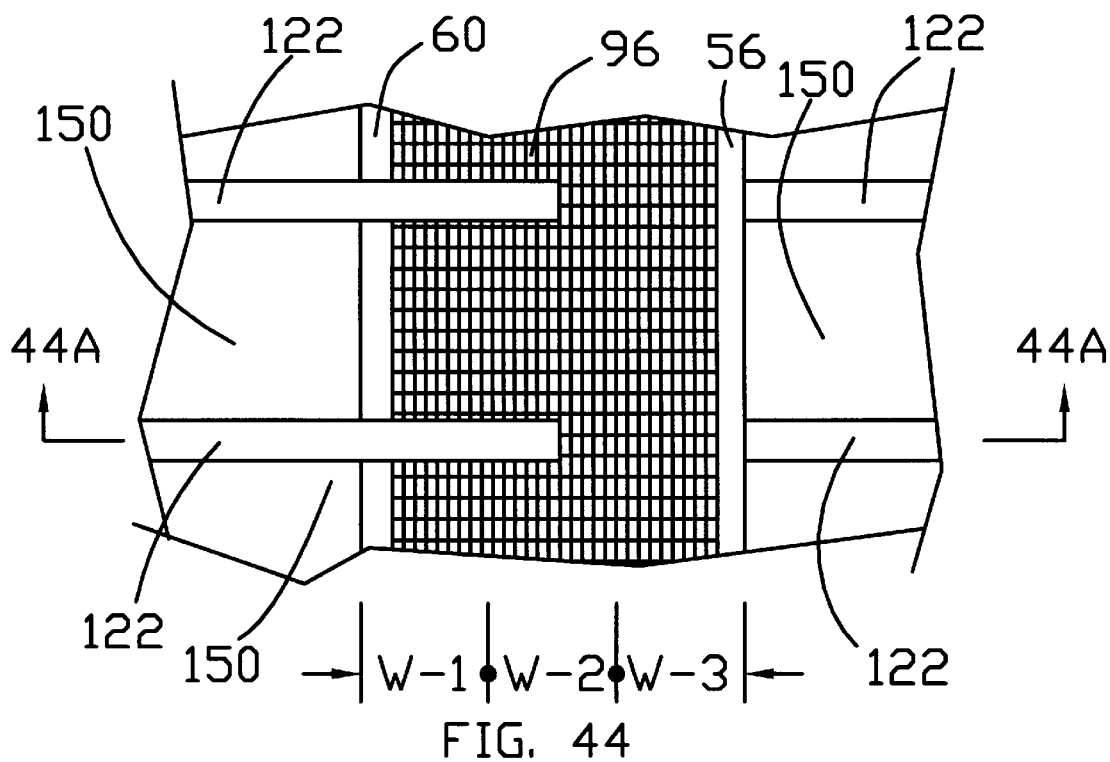
FIG. 44 is a plan view of the structure of FIG. 43 after an additional processing step.

As indicated in FIG. 44A, conductive coating 122 extends outward across the surfaces of cells 10A, 10B in the form of grid fingers. These grid fingers obviously do not cover the entire top surface 59 of cell 10, but are positioned in spaced relationship on the surface. This arrangement is best shown by the plan view of FIG. 44.

FIG. 44A also shows an electrically conductive coating 124 extending from the second lower surface 66 of cell 10B and to electrically conductive region "W2". Coating 124 need not be the same composition nor applied by the same process as coating 122.

FIG. 44A shows that electrical communication is established between the top surface 59 of photovoltaic cell 10A and the bottom surface 66 of adjacent photovoltaic cell 10B. However, coatings 122 and 124 may not supply sufficient conductivity, either because coating resistivities are high relative to pure metals or coating thicknesses are small, as would be the case with vacuum or chemical deposited metal coatings. The conductivity of the grid fingers can be further enhanced to minimize resistive power losses by depositing additional metal or metal-based material onto fingers 122. In a preferred embodiment, this additional metal or metal-based material is applied by electrodeposition. This is accomplished by first employing masking techniques to cover those areas of top surface 59 not covered by grid coating 122 with a protective insulating coating. The insulating coating prevents electrodeposition on those areas and also protects the surface from the possible deleterious effects of the electroplating solution. Masking techniques well known in the art are envisioned, and can be as simple as registered pad printing of an insulative organic coating.

Figure 45:
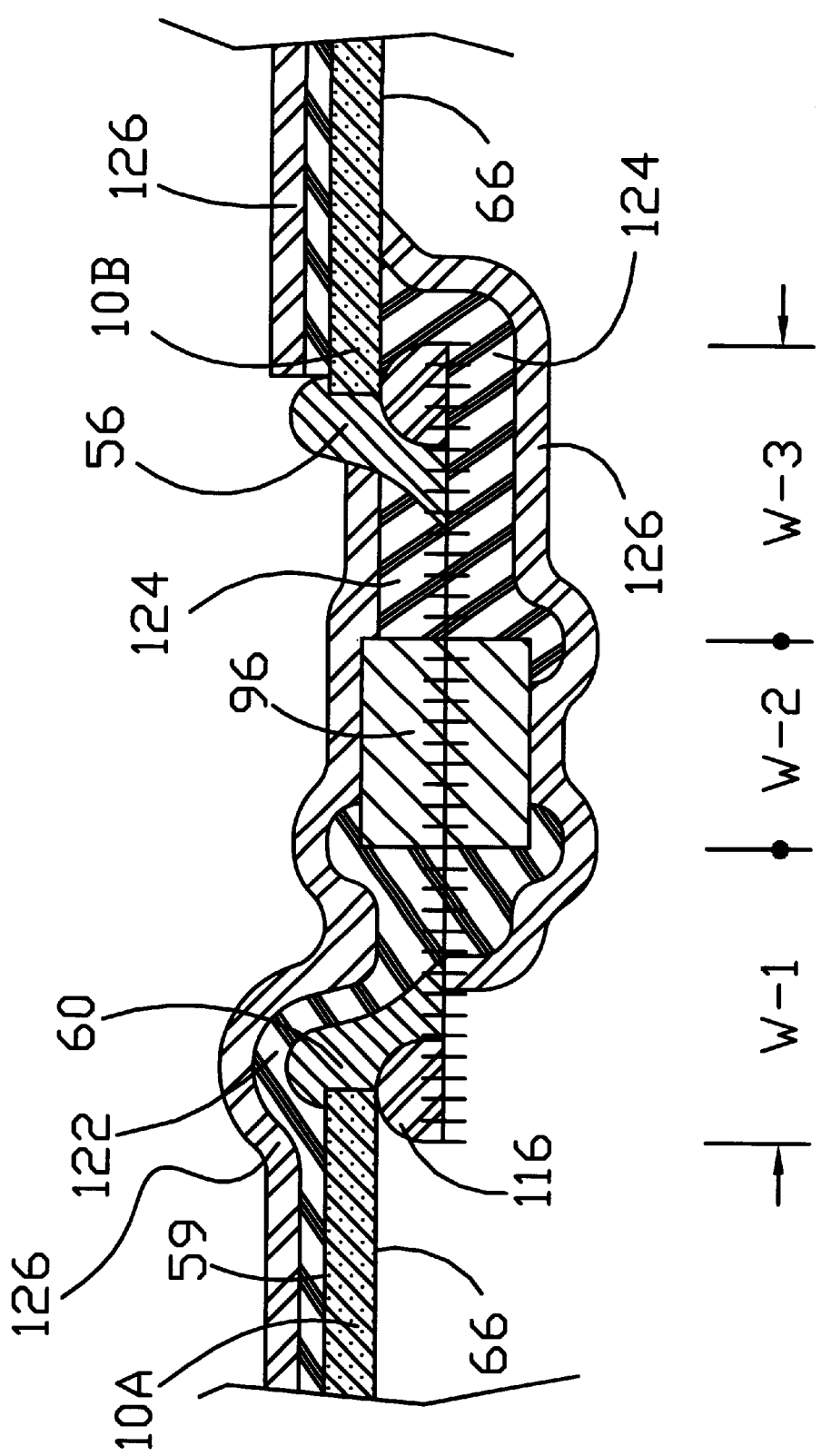
FIG. 45 is a view similar to FIG. 42A after a further processing step.

The plan views of FIG. 44 indicates the location of the insulative masking coating 150. The structure depicted in FIGS. 44 and 44A may be continuously passed through one or more metal electrodeposition baths to result in the structure depicted in the sectional view of FIG. 45. In FIG. 45, the electrodeposited material 126 extends from the top surface 59 of cell 10A to the bottom surface 66 of adjacent cell 10B by virtue of the holes in region "W2".

Those skilled in the art will recognize that a similar combination of conductive coating 122 and electrodeposit 126 may be used to produce the grid fingers 58 depicted in FIGS. 20 and 21. In the embodiments depicted in FIGS. 20,21 and FIG. 45, the fact that the bottom surfaces 66 (FIG. 45) and 28(FIG.21) are conductive and exposed facilitate the continuous electrodeposition step by allowing cathodic contacting to these bottom surfaces, exposing the opposite top surfaces to the electroplating baths.

In a preferred embodiment of the grid structure taught above in conjunction with FIGS. 20,21 and FIG. 45, conductive grid coating 122 comprises a DER. "DERS" are inexpensive, can be formulated to achieve good adhesion and ohmic contact to top surface 59 comprising the transparent conductive oxide (TCO), and achieves good ohmic contact and adhesion to the electrodeposit 126. In essence, the DER functions as a "conductive adhesive" joining the TCO and the electrodeposit 126.

Those skilled in the art will recognize that electrodeposit 126, while illustrated as a single layer, may comprise multiple layers.

Figure 49:
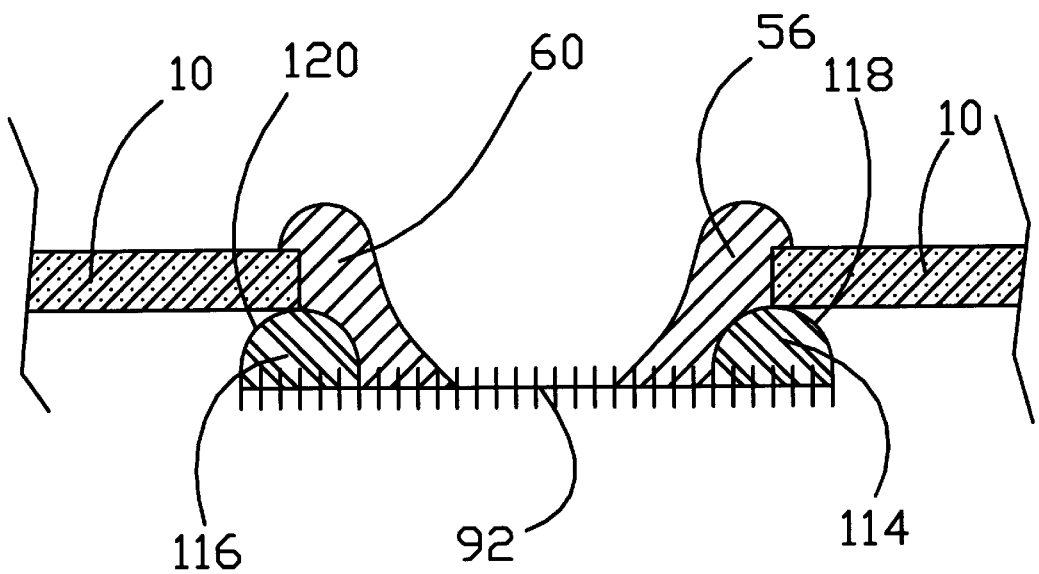
FIG. 49 is a sectional view similar to FIG. 43 illustrating an alternate processing sequence.

FIG. 49 is a sectional view similar to FIG. 43 of an alternative intermediate article resulting from feeding the material of FIGS. 27 through 31 to the process of FIGS. 38 through 40 rather than the joining strips 104 of FIGS. 36 and 37. Here the conductive coating 96 defining region "W2" of FIGS. 36 and 37 has not been applied. However, applying the conductive coating 96 to the FIG. 49 structure at the time of applying conductive coatings 122 and 124 (see discussion of FIG. 44A), results in converting the FIG. 49 structure into one equivalent to that shown in FIG. 44A.

Figure 46:
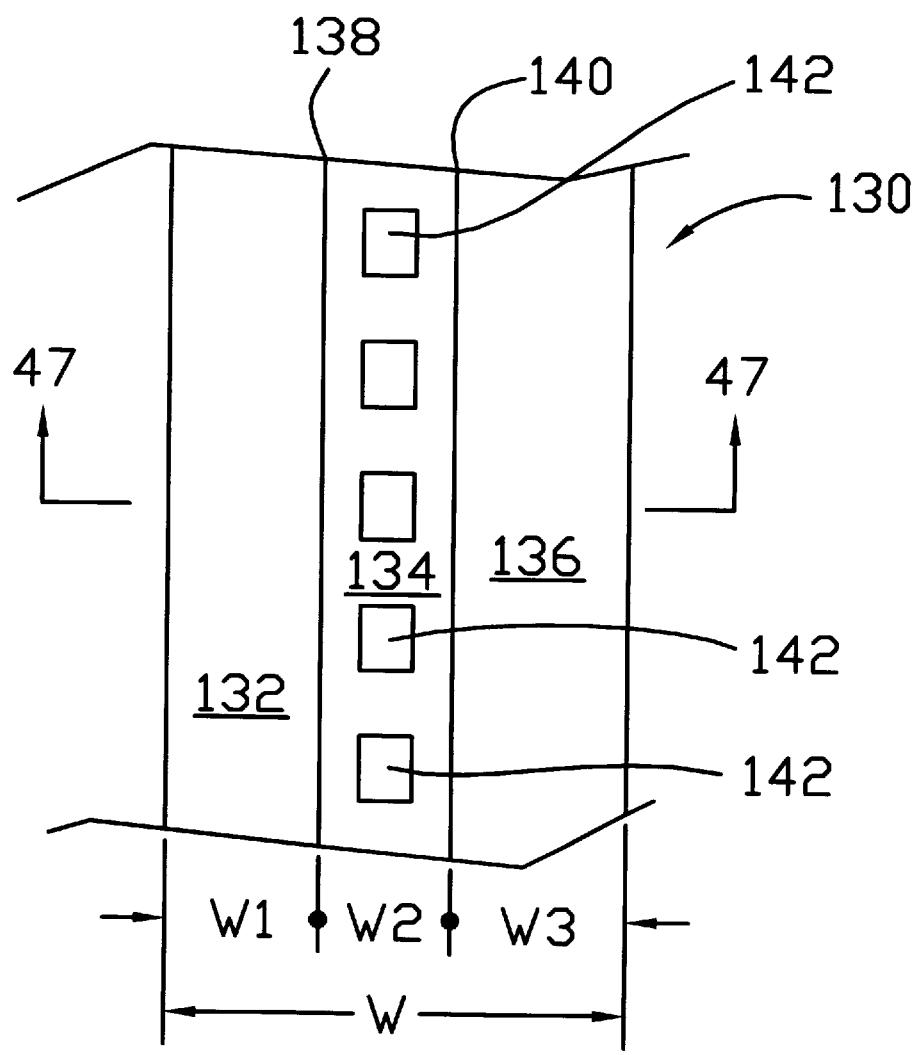
FIG. 46 is a top plan view of another embodiment of the novel substrate structures useful in the manufacture of series interconnected photovoltaic arrays.

FIG. 46 shows yet another embodiment of the current disclosure. The plan view of 46 illustrates a polymer based sheet 130 of width "W" subdivided into three areas "W1", "W2", and "W3" in fashion similar to that of FIG. 32. Polymer based sheet 130 can be conveniently formed by coextrusion of materials 132, 134, and 136, corresponding to regions "W1", "W2", and "W3" respectively. Materials 132, 134, and 136 can be all based on the same polymer or different polymers can be chosen. It is important however that proper joining integrity be established at mating interfaces 138 and 140.

The material 134 chosen for region "W2" is an electrically conductive polymer. A particularly advantageous resin is a DER.

Figure 47:
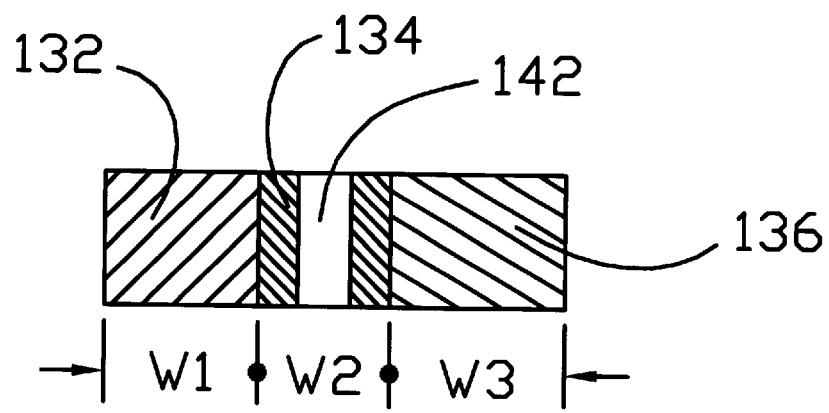
FIG. 47 is a sectional view taken substantially along line 47—47 of FIG. 46.

FIG. 47 is a sectional view taken substantially along line 47—47 of FIG. 46. As shown in FIGS. 46 and 47, region "W2" is caused to have holes 142 along its length. In the simplest conceptual case, these holes are simply punched in the region "W2". Another approach would be to formulate the region "W2" of FIGS. 46 and 47 from a fabric (non-woven or woven) of electrically conductive polymer.

Figure 48:
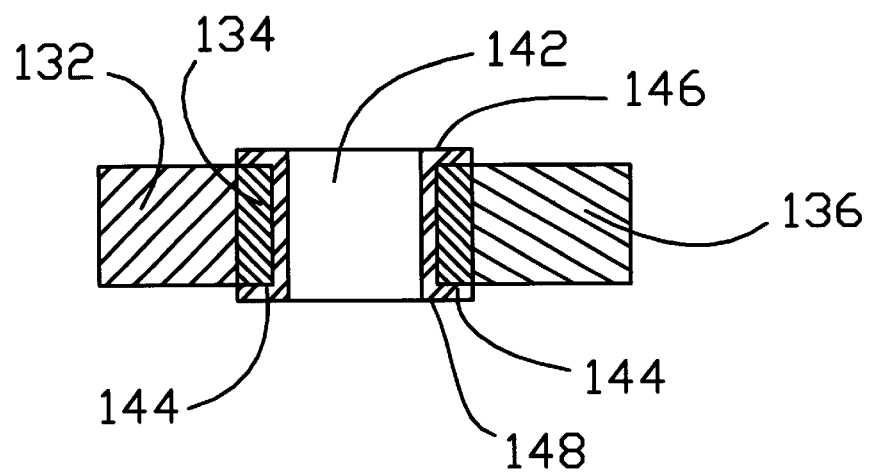
FIG. 48 is a view similar to FIG. 47 following an additional processing step.

FIG. 48 shows the structure of FIG. 47 following an additional processing step of depositing metal 144 through holes 142 to establish high electrical conductivity from top surface 146 to bottom surface 148. Preferably this metal deposition is by electroplating although chemical and vapor deposition techniques could be used.

In many respects the structures shown in FIGS. 47 and 48 resemble the structures depicted in FIGS. 37a and 37b respectively. Thus the use of the structures of FIGS. 47 and 48 in the process of FIGS. 38 through 40 would give results similar to those previously taught as one skilled in the art will recognize.

It is important to recognize that the unique design and process taught by the present invention is accomplished in a fully additive fashion. No wasteful and costly material removal steps are needed to achieve the integrated series connected arrays taught. This is a significant advantage over the prior art.

Despite the relative simplicity envisioned for production of the current collector grid/interconnect structures using the combination "conductive coating plus electrodeposition" approach taught above in conjunction with FIGS. 20, 21 and FIGS. 44, 44A and 45, it can be contemplated that separate production of the grid/interconnect array followed by subsequent application to a geometrically registered arrangement of photovoltaic cells may be employed to advantage. This concept would avoid the masking and possible exposure of the photovoltaic cells to the wet electrochemistry involved in the approaches taught above in conjunction with FIGS. 20,21 and 44, 44A and 45. Thus, a further embodiment of the grid structure, design and fabrication process is taught below in conjunction with FIGS. 50 through 66.

Figure 50:
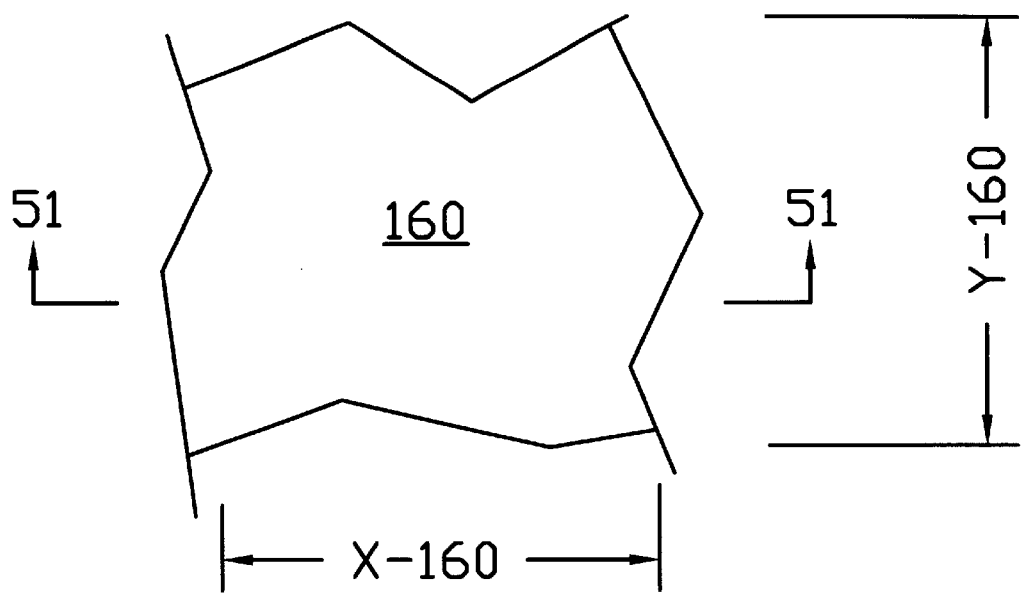
FIG. 50 is a top plan view of a starting component of an additional embodiment of the invention.
Figure 51:
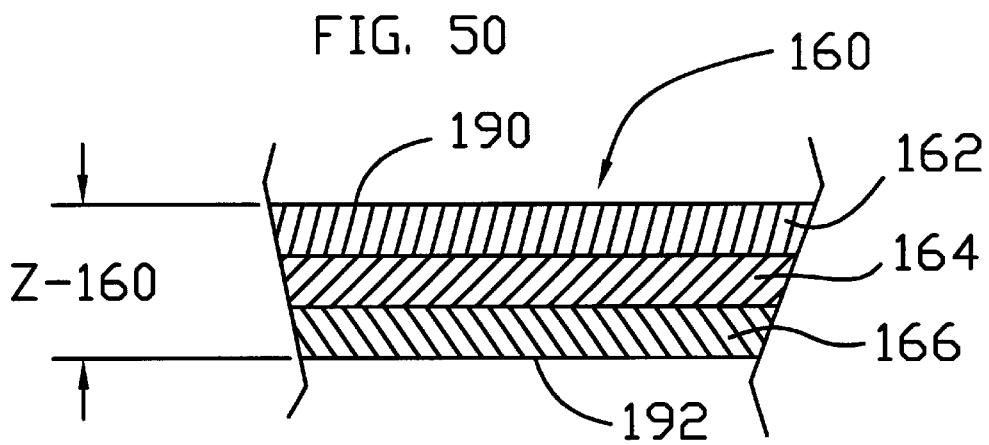
FIG. 51 is a sectional view taken along line 51—51 of FIG. 50.

FIG. 50 is a plan view of a polymeric film or glass substrate 160. Substrate 160 has width X-160 and length Y-160. In one embodiment, taught in detail below, Y-1 60 is much greater than width X-160, whereby film 160 can generally be described as "continuous" in length and able to be processed in length Y-160 in a continuous roll-to-roll fashion. FIG. 51 is a sectional view taken substantially from the view 51—51 of FIG. 50. Thickness dimension Z-160 is small in comparison to dimensions Y-160, X-160 and thus substrate 160 has a sheetlike structure. As shown in FIG. 51, substrate 160 may be a laminate of multiple layers 162, 164, 166 etc. or may comprise a single layer of material. The multiple layers 162,164,166 etc. may comprise inorganic or organic components such as thermoplastics or silicon containing glass-like layers. The various layers are intended to supply functional attributes such as environmental barrier protection or adhesive characteristics. Such functional layering is well-known and widely practiced in the plastic packaging art. Sheetlike substrate 160 has first surface 190 and second surface 192.

Figure 52:
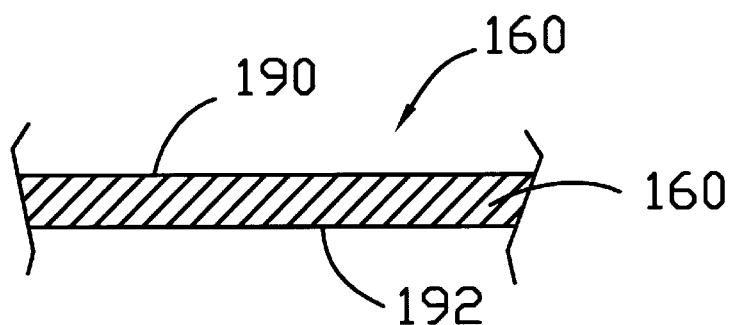
FIG. 52 is a simplified representation of the sectional view of FIG. 51.

FIG. 52 depicts the structure 160 (possibly laminate) as a single layer for purposes of presentation simplicity. Substrate 160 will be represented as this single layer in the subsequent embodiments.

Figure 53:
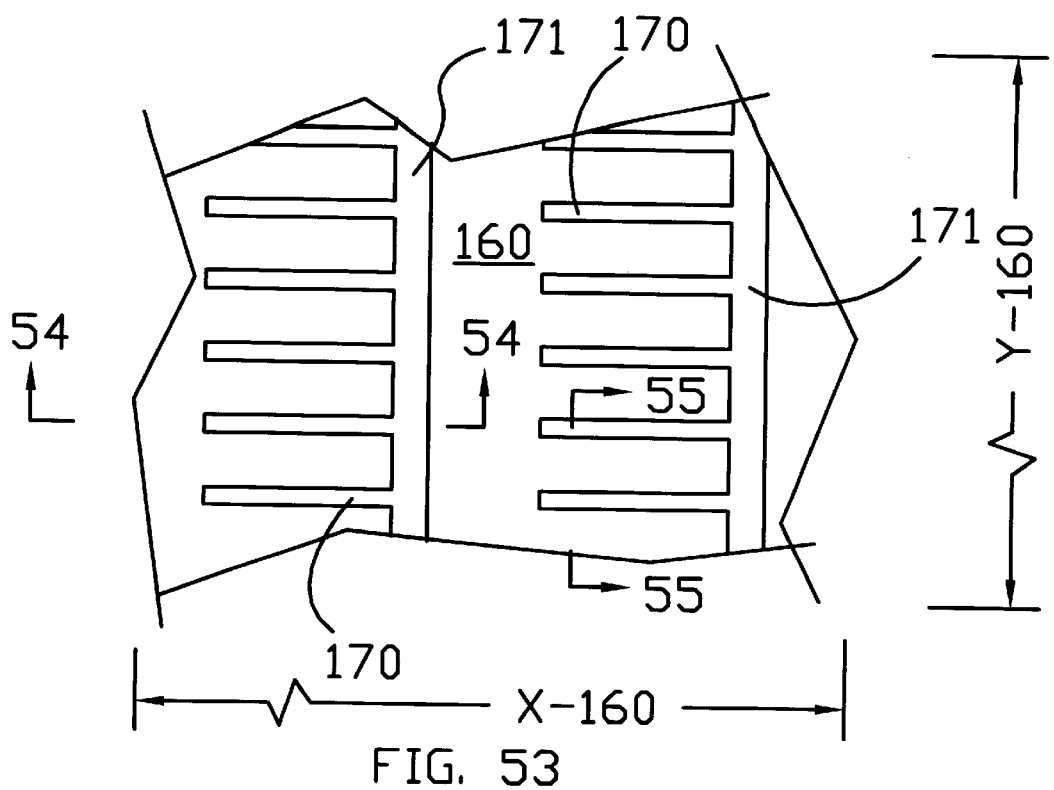
FIG. 53 is a top plan view of the embodiment of FIGS. 50 through 52 following an additional processing step.
Figure 54:
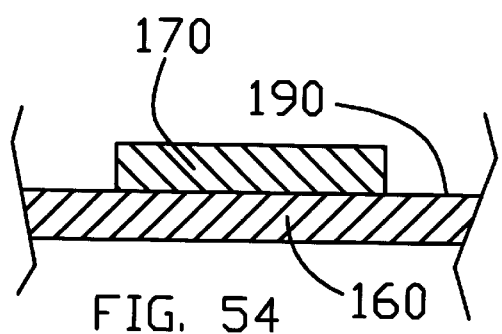
FIG. 54 is a sectional view taken along the line 54—54 of FIG. 53.
Figure 55:
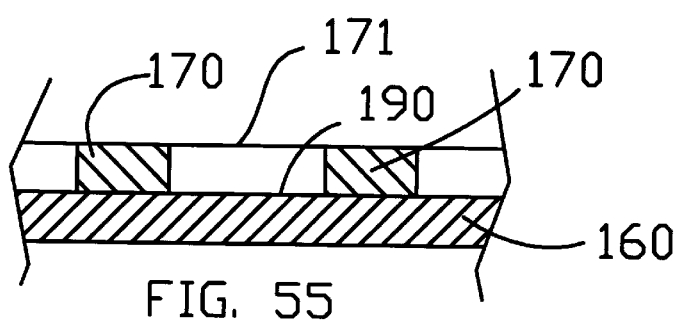
FIG. 55 is a sectional view taken along the line 55—55 of FIG. 53.

FIG. 53 is a plan view of the structure following an additional manufacturing step, and FIG. 54 is a sectional view taken along line 54—54 of FIG. 53. FIG. 55 is a sectional view taken along line 55—55 of FIG. 53. In FIGS. 53 through 55, it is seen that a pattern of "fingers", designated 170, extends from "buss" structures, designated 171. Both "fingers" 170 and "busses" 171 are deposited on and supported by substrate 160. While shown as a single layer, "fingers" 170 and "busses" 171 may comprise multiple layers. "Fingers" 170 and "busses" 171 may comprise electrically conductive material, such as a directly electroplateable resin, a conductive polymer, or a metal-based material, or may comprise non-conductive material which would assist accomplishing a subsequent deposition of conductive material. For example, "fingers" 170 or "busses" 171 could comprise a seeded polymer which would catalyze chemical deposition of a metal in a subsequent step. A second example would be materials selected to promote adhesion of a subsequently applied conductive material. "Fingers" 170 and "busses" 171 may differ in actual composition.

Figure 56:
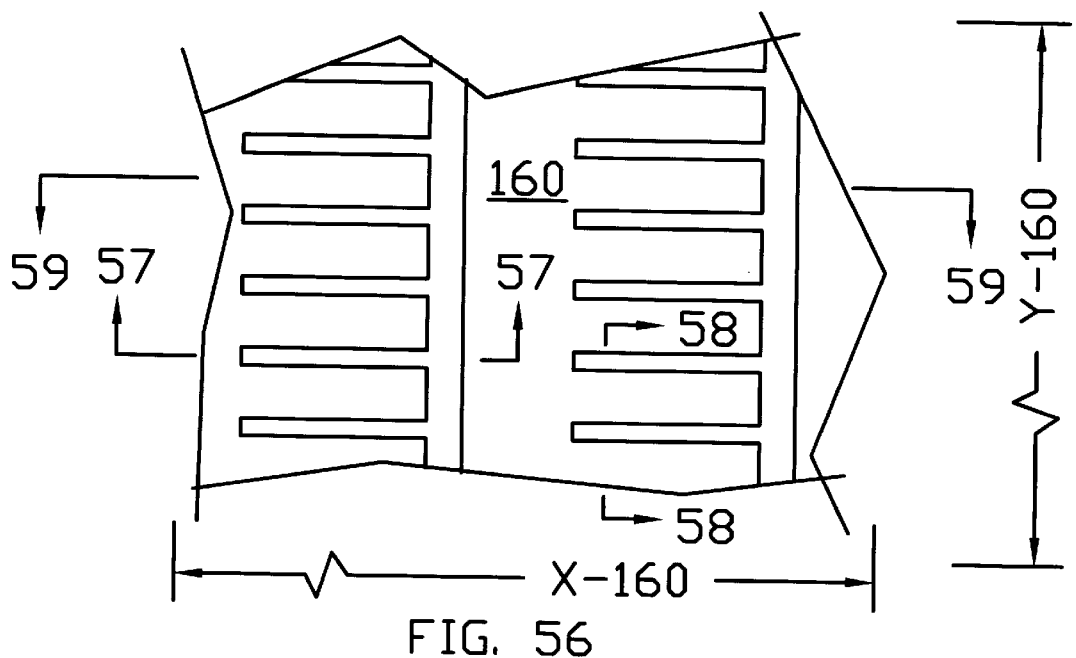
FIG. 56 is a top plan view of embodiment of FIGS. 53 through 55 after an additional processing step.
Figure 57:
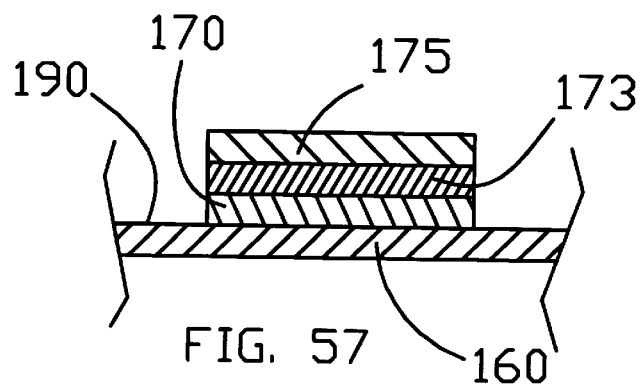
FIG. 57 is a sectional view taken along line 57—57 of FIG. 56.
Figure 58:
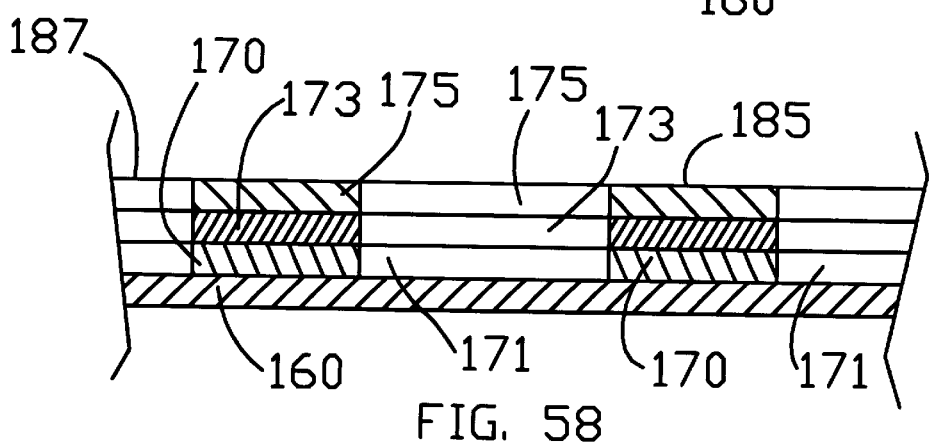
FIG. 58 is a sectional view taken along line 58—58 of FIG. 56.
Figure 59:
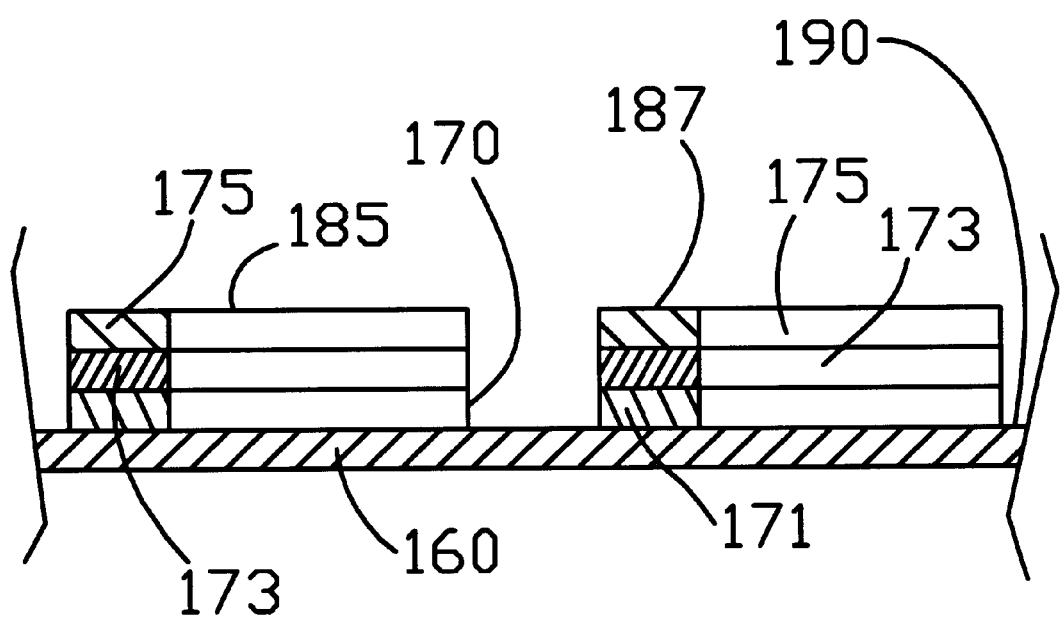
FIG. 59 is a sectional view taken along line 59—59 of FIG. 56.

FIGS. 56, 57 and 58 correspond to the views of FIGS. 53, 54 and 55 following an additional processing step. FIG. 59 is a sectional view taken substantially along line 59—59 of FIG. 56. FIGS. 56 through 59 show additional conductive material deposited onto the "fingers" and "busses" of FIGS. 53 through 55. This additional conductive material is designated by layers 173,175. While shown as multiple layers 173,175, it is understood that this conductive material could be a single layer. As best shown in FIG. 58, "fingers" 170 have top free surface 185 and "busses" 171 have top free surface 187. In a preferred embodiment, additional layers 173, 175 etc. comprise electrodeposited material taking advantage of the deposition speed, low cost and selectivity of the electrodeposition process. Alternatively, these additional conductive layers may be deposited by selective chemical deposition or registered masked vapor deposition. Metal-filled conductive resins may also be used to form these additional layers 173,175.

Figure 60:
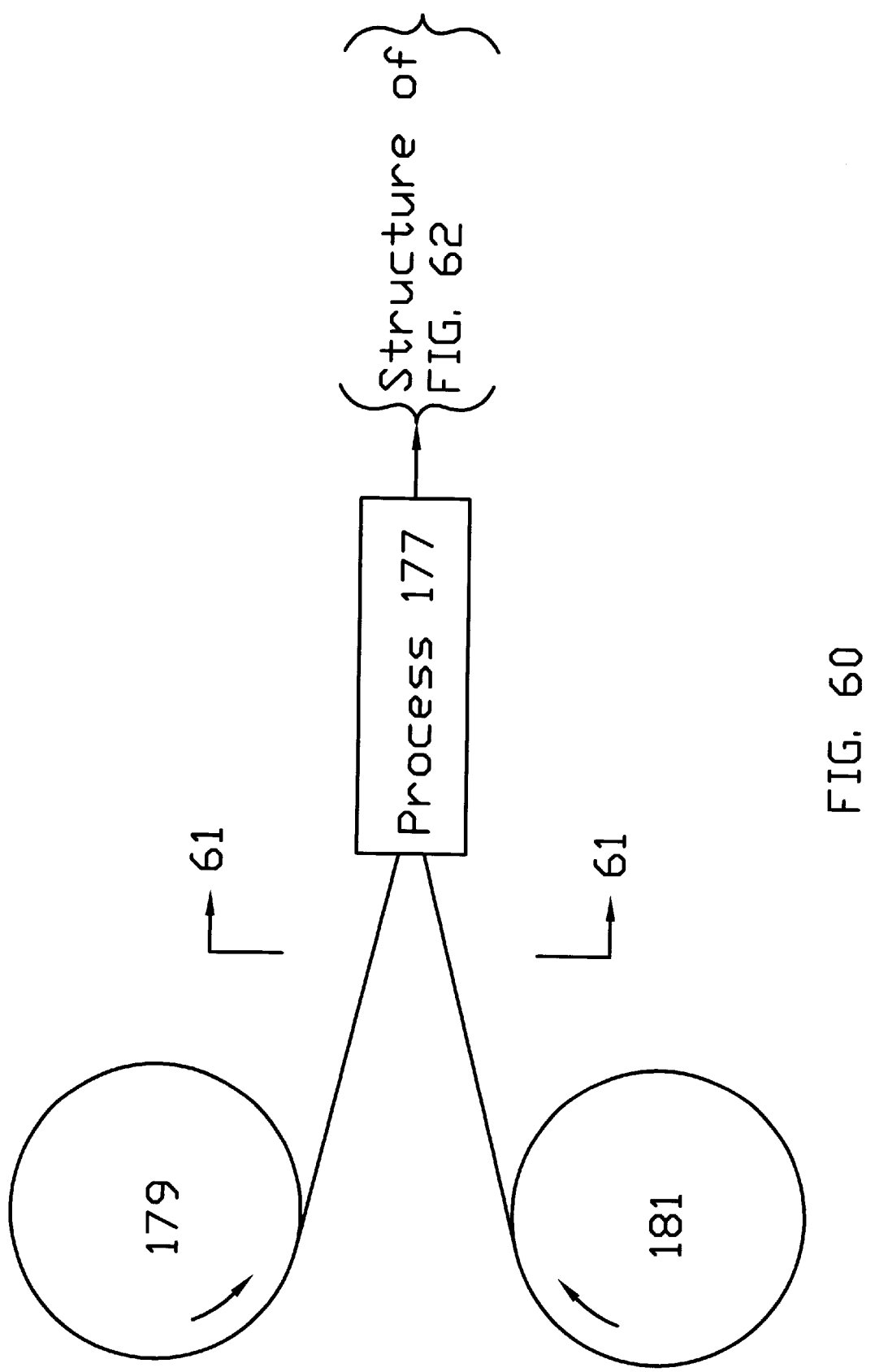
FIG. 60 is a simplified representation of a process used in the manufacture of an embodiment of the invention.
Figure 61:
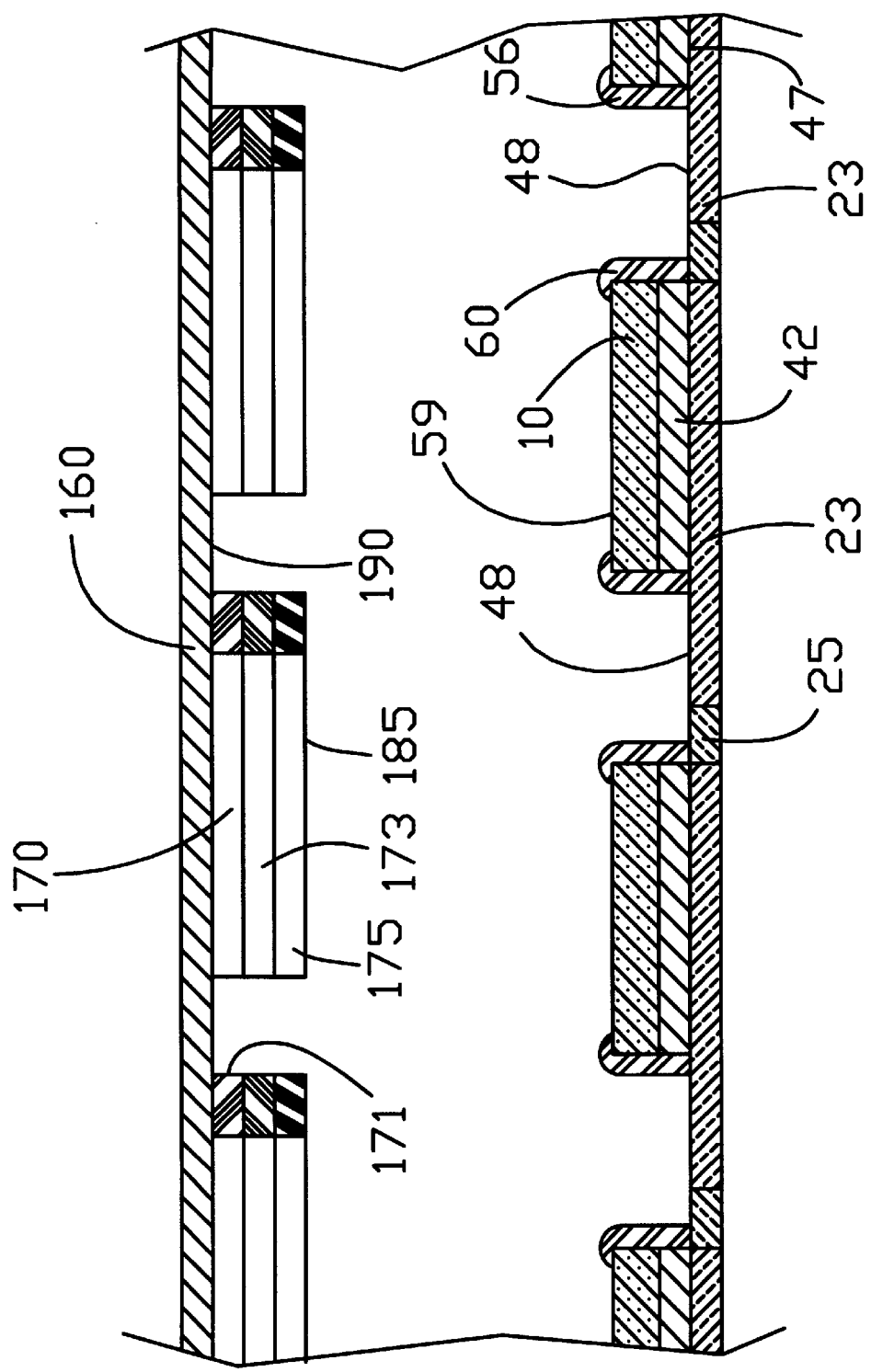
FIG. 61 is a sectional view taken along the line 61—61 of FIG. 60 using the structures of FIGS. 19 and 59.

FIGS. 60 through 63 illustrate a process 177 by which the interconnection component of FIGS. 56 through 59 is combined with the structure illustrated in FIG. 19 to accomplish series interconnections among geometrically spaced cells. In FIG. 60 roll 179 represents a "continuous" feed roll of the grid/buss structure on the sheetlike substrate as depicted in FIGS. 56 through 59. Roll 181 represents a "continuous" feed roll of the sheetlike geometrical arrangement of cells depicted in FIG. 19. As indicated in FIGS. 60 through 63, process 177 laminates these two sheetlike structures together in a spacial arrangement wherein the grid "fingers" project laterally across the top surface 59 of cells 10 and the "finger/buss" structure extends to the top contact surface 48 of an adjacent cell.

Figure 62:
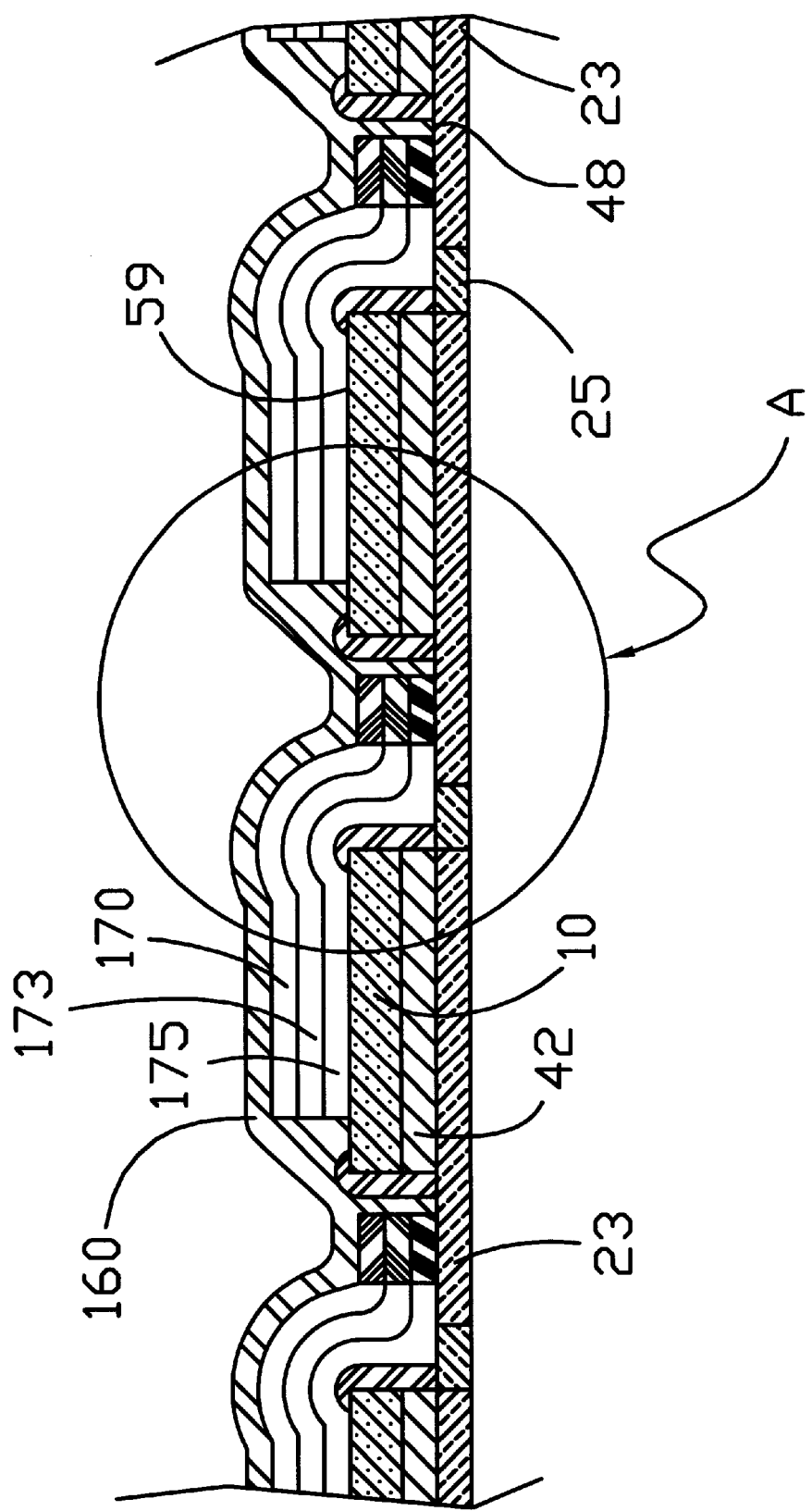
FIG. 62 is a sectional view showing a lamination resulting from the process of FIG. 60.
Figure 63:
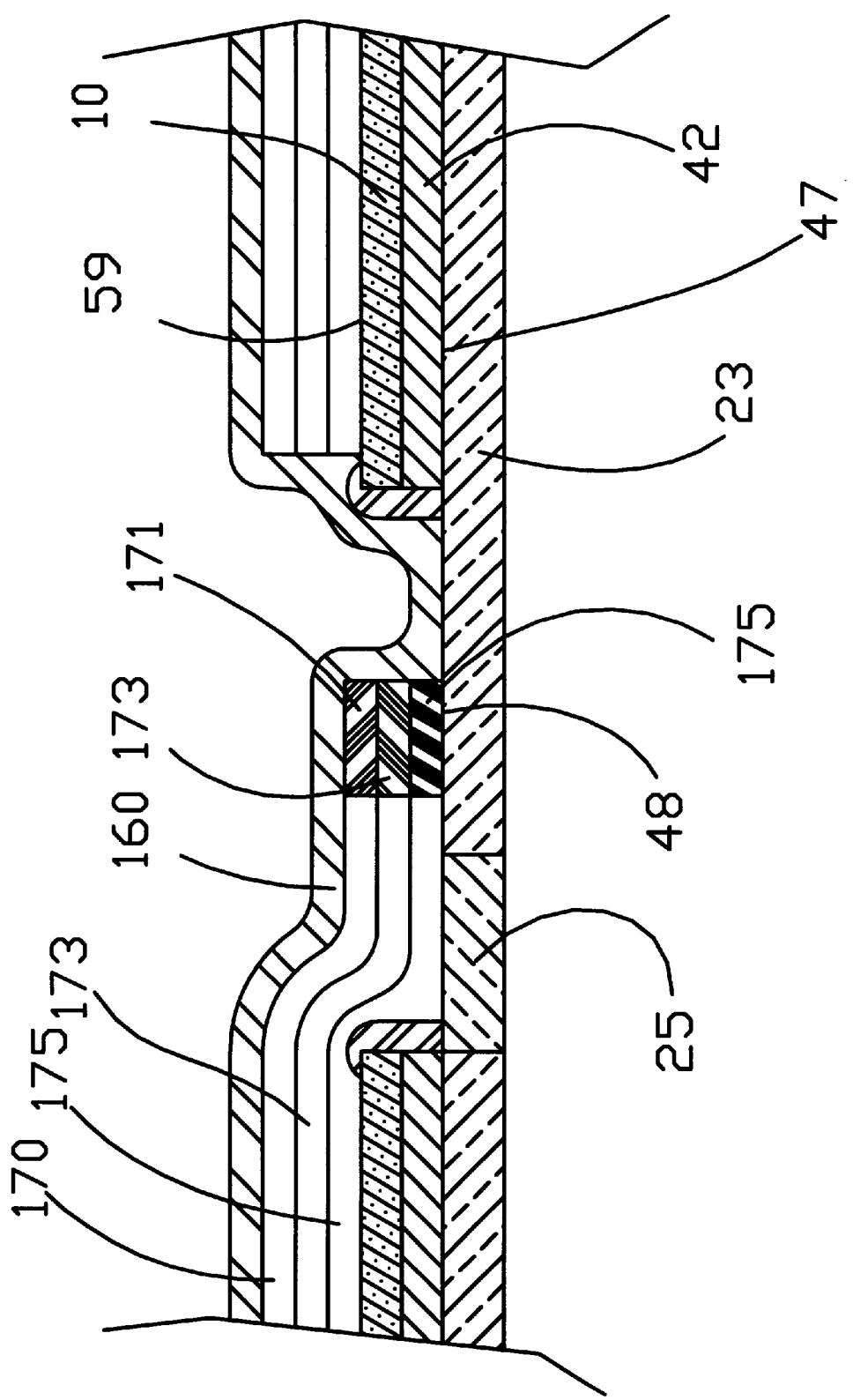
FIG. 63 is an enlarged sectional view of the portion of FIG. 62 within Circle "A" of FIG. 62.

The actual interconnection between adjacent cells is depicted in greatly magnified form in FIG. 63, magnifying the encircled region "A" of FIG. 62. In the embodiments of FIG. 62 and 63, "buss" structure (171,173,175) is shown to extend in the "continuous" Y direction of the laminated structure (direction normal to the paper). It will be appreciated by those skilled in the art that the only electrical requirement to achieve proper interconnection of the cells is that the grid "fingers" extend to the contact surface 48 of an adjacent cell. However, in those cases where the grid fingers comprise an electrodeposit, inclusion of the "busses" provides a convenient way to pass electrical current by providing a continuous path from the rectified current source to the individual grid "fingers". This facilitates the initial electrodeposition of layers 173, 175 etc. onto the originally deposited materials 170, 171. Those skilled in the art will recognize that if the grid "fingers" comprise material deposited by selective chemical, masked vapor deposition or printing, the grid "fingers" could constitute individual islands and the "buss" structure could be eliminated.

Those skilled in the art will recognize that contact between the top surface 59 of the cell and the mating surface 185 of the grid finger will be achieved by ensuring good adhesion between first surface 190 of sheet 160 and the top surface 59 of the cell in those regions where surface 190 is not covered by the grid. However, electrical contact between grid "fingers" 170 and cell surface 59 can be further enhanced by selectively printing a conductive adhesive onto "fingers" 170 prior to the lamination process taught in conjunction with FIGS. 60 and 61. In this way surface 185 is formed by a conductive adhesive resulting in secure adhesive and electrical joining of grid "fingers" 170 to top surface 59 following the lamination process. Alternatively, one may employ a low melting point metal-based material as a constituent of the material forming surface 185. In this case the low melting point metal-based material is caused to melt during the process 177 of FIG. 60 thereby increasing the contact area between the mating surfaces 185 and 59. In a preferred embodiment indium or indium containing alloys are chosen as the low melting point contact material at surface 185. Indium melts at a low temperature, considerably below possible lamination temperatures. In addition, Indium is known to bond to glass and ceramic materials when melted in contact with them. Given sufficient lamination pressures, only a very thin layer of Indium would be required to take advantage of this bonding ability.

Figure 64:
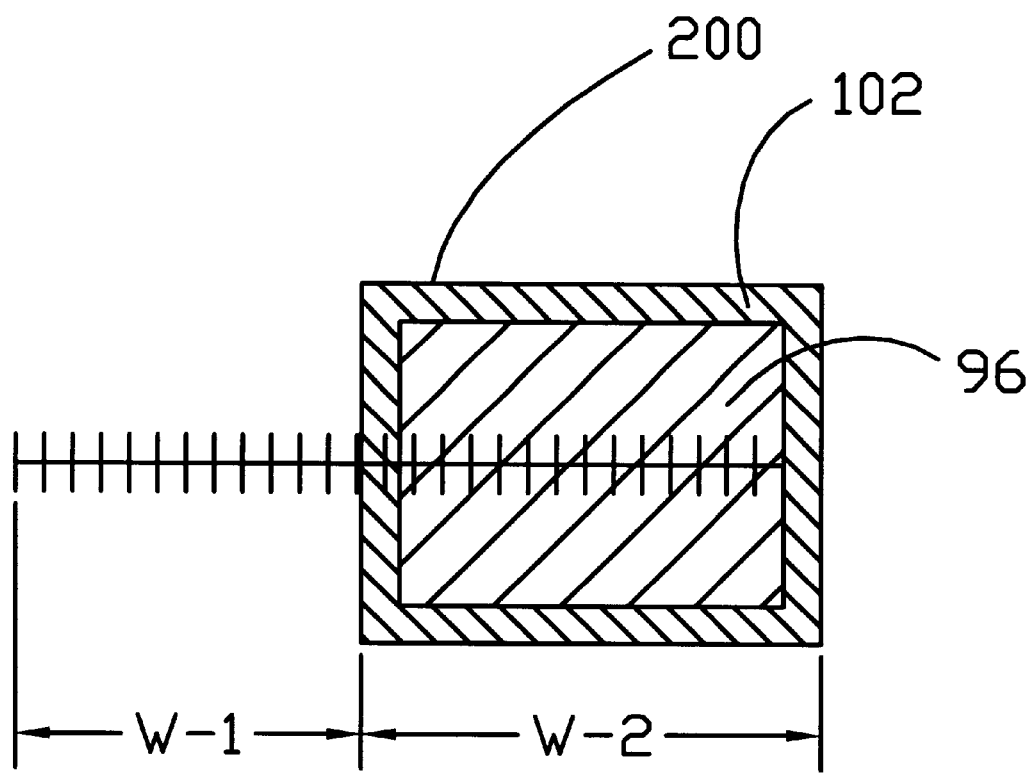
FIG. 64 is a simplified sectional view of a starting substrate component for an additional embodiment of the invention.
Figure 65:
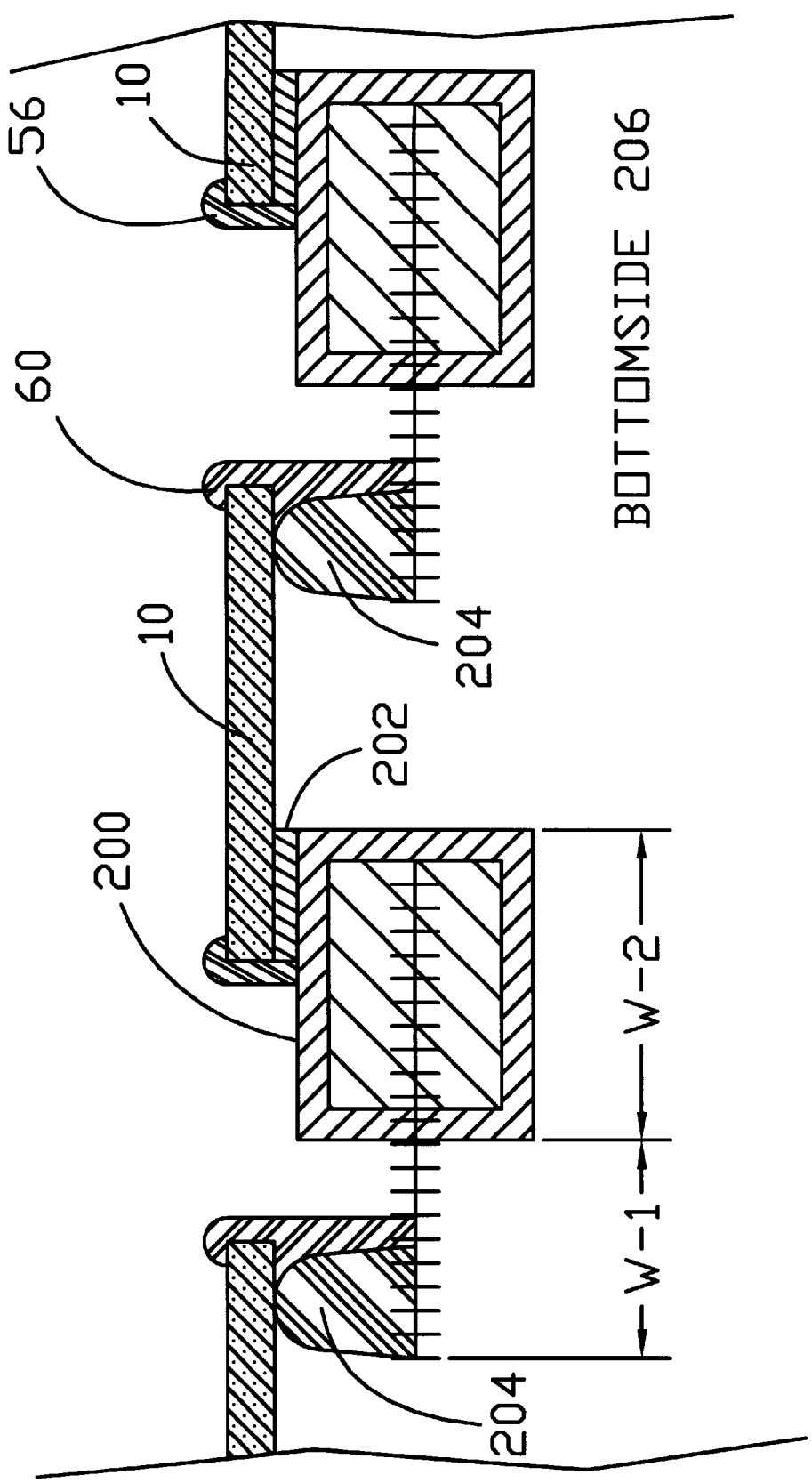
FIG. 65 is a sectional view of the FIG. 64 components following additional processing steps.
Figure 66:
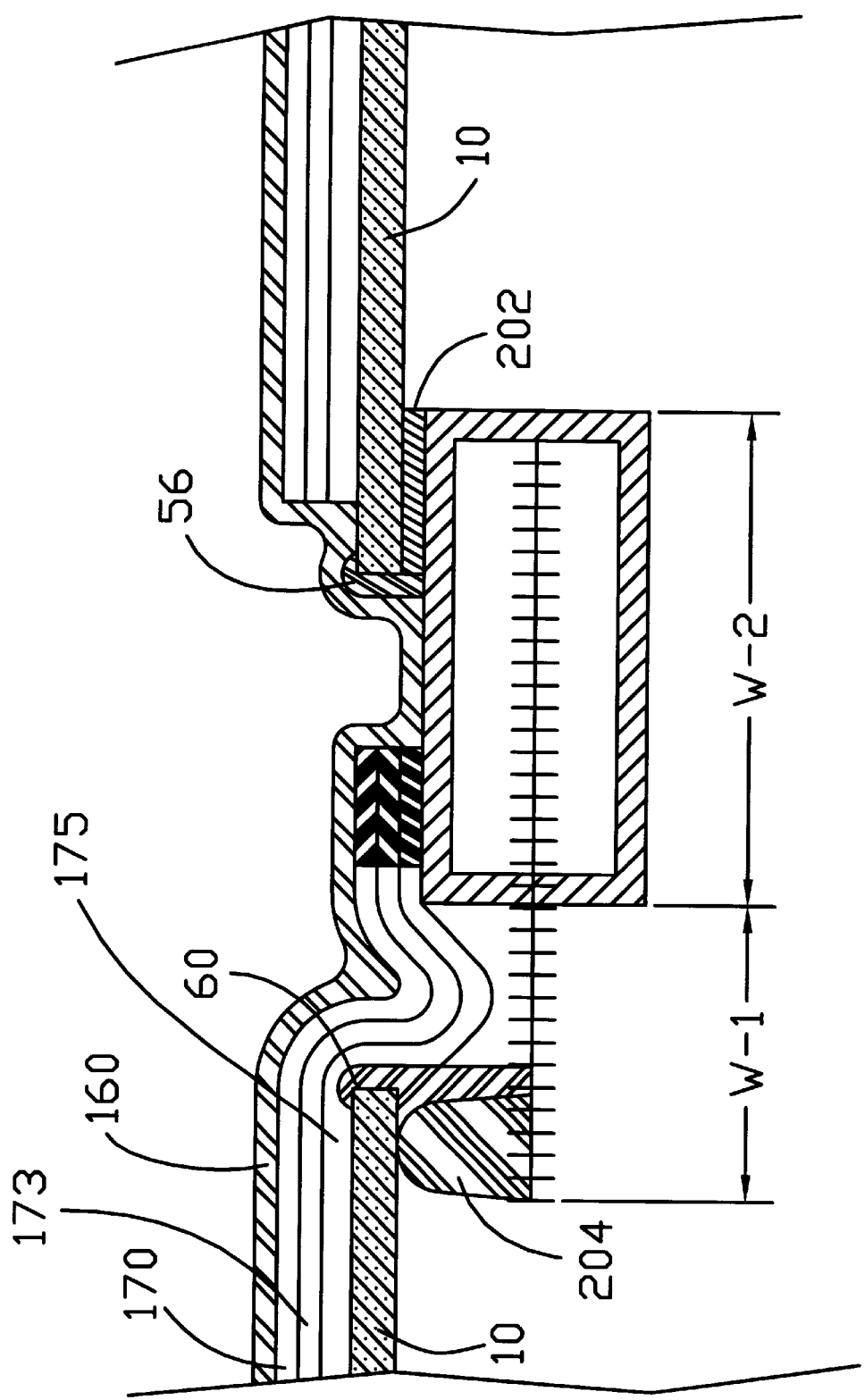
FIG. 66 is a sectional view of the structure resulting from combining the structures shown in FIG. 56 and 65 using the process illustrated in FIG. 60.

Bonding to the contact surface 48 of conductive sheet 23 can be accomplished by any number of the electrical joining techniques mentioned above. These include electrically conductive adhesives, solder, and melting of suitable metals or metal-base alloys during the heat and pressure exposure of the process 177 of FIG. 60. As with the discussion above concerning contact of the "fingers", selecting low melting point metal-based materials as constituents forming surface 187 could aid in achieving good ohmic contact and adhesive bonding of "busses" 171 to the contact surface 48 of sheet 23. FIGS. 64 through 66 show the result of the FIG. 60 process using a substrate structure similar to that illustrated in FIG. 37B, except that the portion "W-3" shown in FIG. 37B is omitted. FIG. 65 shows photovoltaic cells 10 spacially arranged using the substrate structure of FIG. 64. Conductive joining means 202 connect cells 10 to portions of top surface 200 of conductive regions W-2. Insulating beads 56,60 protect the edges of cells 10. Adhesive 204 attaches cell 10 to the non-conductive region W-1 of the substrate. The structure depicted in FIG. 65 is similar in electrical and spacial respects to the structure depicted in FIG. 19. Substituting the structure of FIG. 65 for the FIG. 19 structure shown in the prior embodiments of FIGS. 60 through 63 results in the structure shown in the sectional view of FIG. 66. In this case the through-holes associated with the FIG. 64 substrate structures may assist in the lamination process by permitting a reduced pressure on the bottom side 206 of the sheetlike structures (FIG. 65) thereby promoting removal of air from between the sheetlike structures of FIGS. 56 through 59 and the sheetlike structure of FIG. 65 just prior to lamination.

The sectional views of FIGS. 63 and 66 embody application of the invention to the substrate structures taught in FIGS. 7 and 64 respectively. It is understood that similar results would be achieved using the other substrate structures taught in the disclosure, such as those embodied in FIGS. 8 through 12, 24 and 25, 26, 27 through 37B, 46 through 48, and 49.

The sectional view of FIGS. 63 and 66 show film 160 remaining as part of the structure following the process 177 of FIG. 60. In some cases in may be advantageous to employ film 160 in a manner wherein it is removed after attachment of the "fingers" and "busses" to the respective surfaces of the cells and substrate. In this application, the film 160 would serve as surrogate support and spacial positioning means during formation, placement and bonding of the "finger/buss" structure. In this case a suitable "release" material would be positioned between surface 190 of film 160 and "fingers/busses" 170/171.

Figure 67:
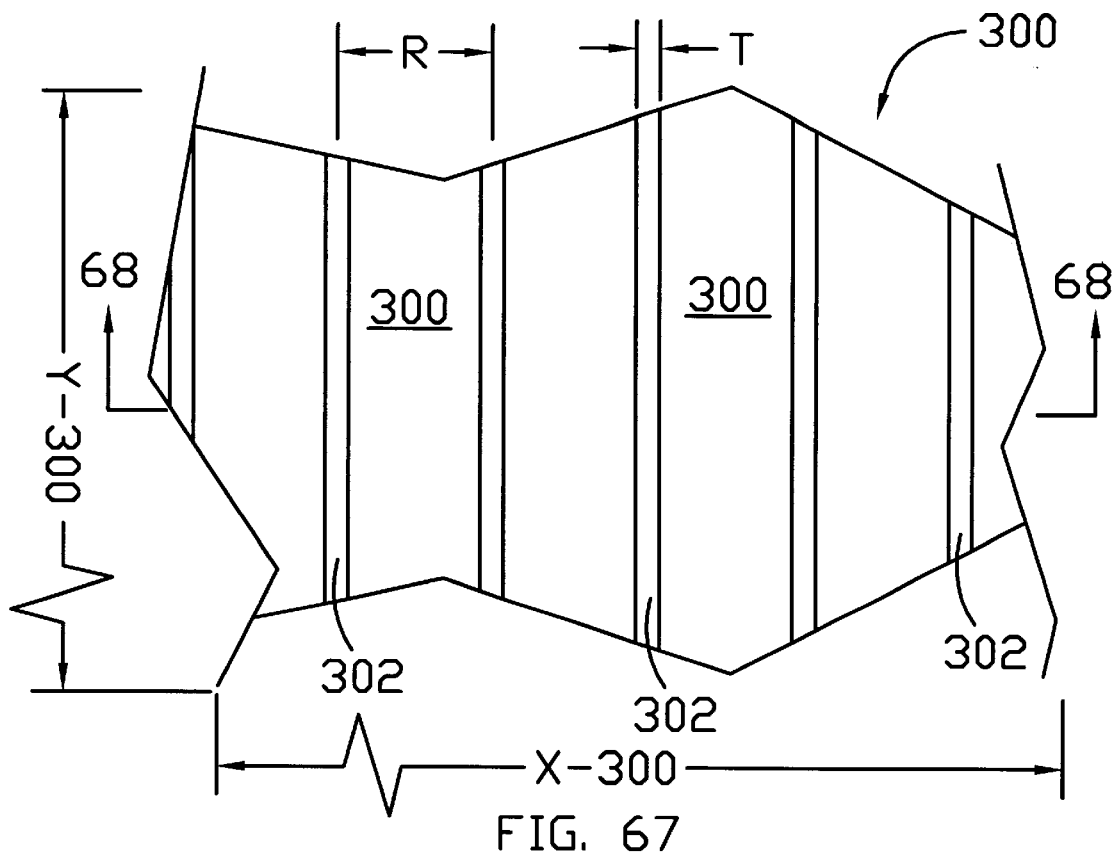
FIG. 67 is a top plan view of a starting component for an additional embodiment of the invention.

A further embodiment of a front face current collector structure is taught in conjunction with FIGS. 67 through 81. FIG. 67 is a top plan view of a metal foil/semi-conductor photovoltaic cell/window electrode similar to the laminated structure depicted in FIGS. 1 and 2. However, the structure of FIG. 67, generally referred to as 300, also includes narrow strips of insulating material 302 extending substantially in the length direction Y-300. Strips 302 are usually positioned at repeat distances R in the width direction X-300 of structure 300. As will be seen below, dimension R approximates the width X-10 of the eventual individual cells.

Figure 68:
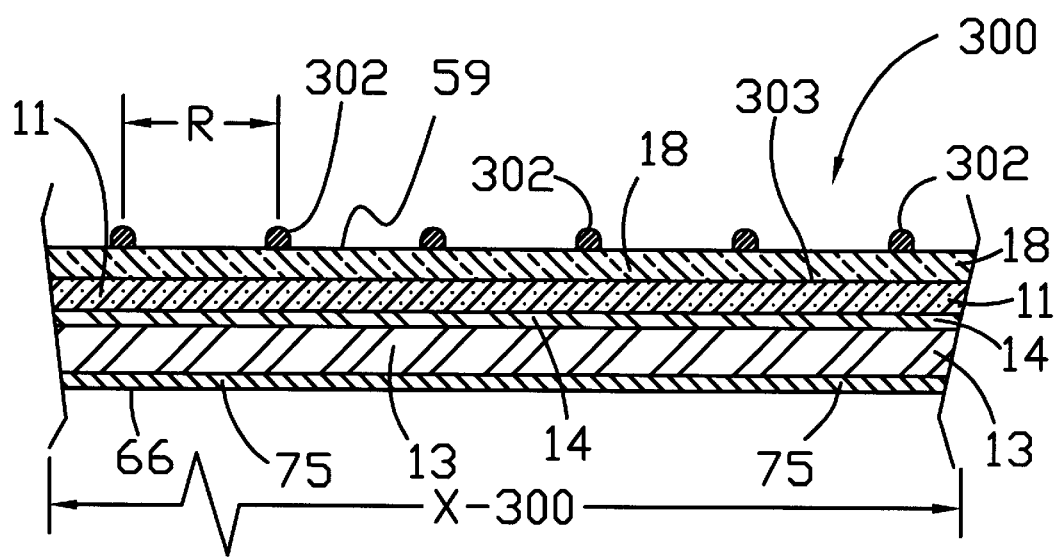
FIG. 68 is a sectional view taken along line 68—68 of FIG. 67.

FIG. 68 is a sectional view taken substantially along line 68—68 of FIG. 67. FIG. 68 shows a laminate comprising separate layers 75,13,14,11, and 18 as previously described for the structure of FIG. 2. insulating strips 302 are shown positioned on top surface 59 of structure 300. However, it is understood that strips 302 could be positioned on top surface 303 of photovoltaic structure 11. In this latter case, window electrode 18 could be deposited over the entire surface (including strips 302) or selectively onto the surface areas between strips 302. For simplicity, the embodiments of FIGS. 67 through 78 will show strips 302 disposed on top surface 59 of window electrode 18. The purpose of the insulating strips 302 is to prevent shorting between top and bottom electrode material during subsequent slitting into individual cells, as will become clear below.

In the embodiment shown, length Y-300 is much greater than width X-300 and length Y-33 can generally be described as "continuous" or being able to be processed in roll-to-roll fashion. In contrast to width X-10 of the individual cell structure of FIGS. 1 and 2, X-300 of FIGS. 67 and 68 is envisioned to be of magnitude equivalent to the cumulative widths of multiple cell structures. Strips 302 are typically 0.002 inch to 0.050 inch wide (dimension "T", FIG. 67). Strips 302 can be applied to the surface 59 by any number of methods such as thermoplastic extrusion, roll printing or photo masking.

In order to promote simplicity of presentation, layers 75,13,14,11 and 18 of structure 300 will be depicted as a single layer 370 in subsequent embodiments.

Figure 69:
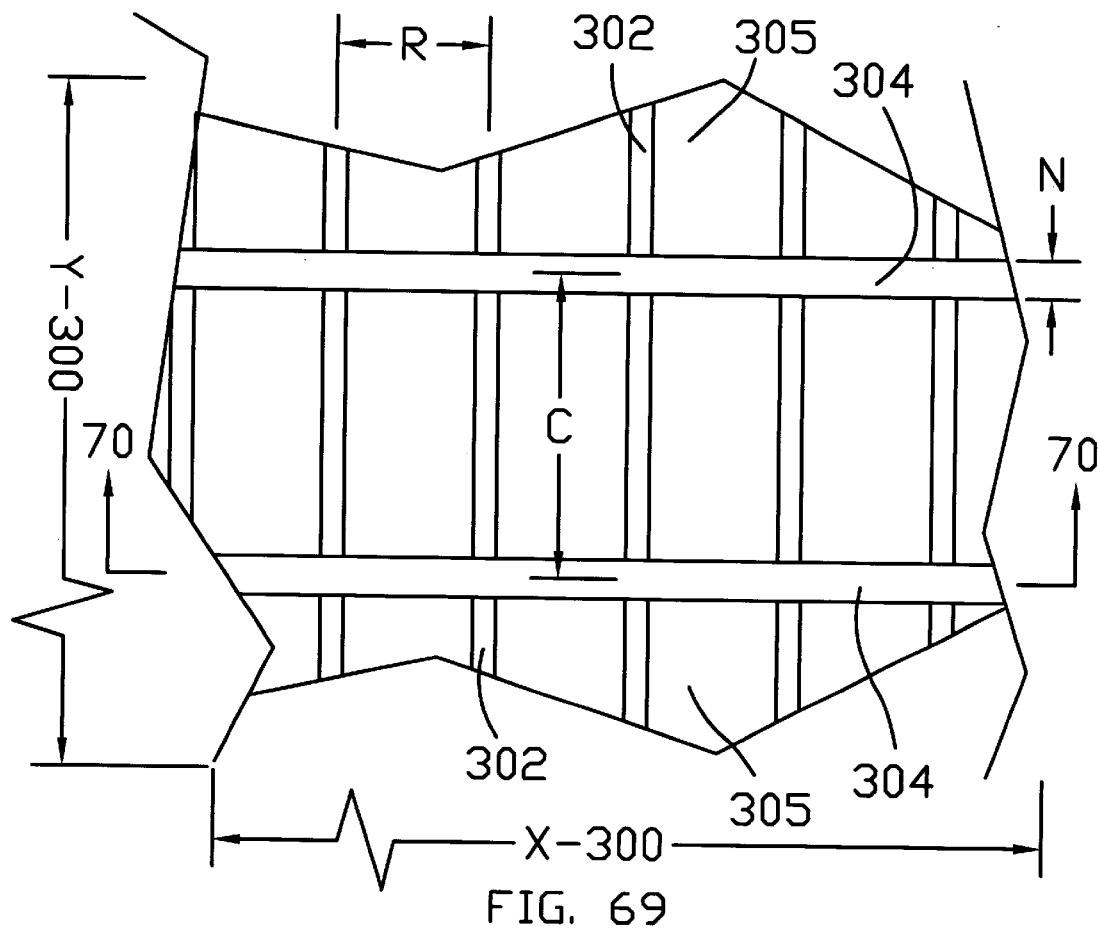
FIG. 69 is a top plan view after an additional processing step employing the structure of FIGS. 67 and 68.

FIG. 69 is a top plan view of the FIG. 67 structure following an additional processing step. Electrically conductive material has been deposited in conductive strips 304 onto the top surface of the structure 300. Strips 304 extend in the width direction X-300 and traverse a plurality of repeat distances "R". Dimension "N" of strips 304 is normally made as small as possible, typically 0.002 inch to 0.100 inch. Dimension "C", the repeat distance between strips 304 depends to some extent on dimension "N" but is typically 0.05 inch to 1.0 inch.

Strips 304 can comprise electrically conductive resins or adhesives applied by printing or thermoplastic extrusion. Alternatively, strips 304 can comprise metal-based materials applied by selective deposition. It is, of course, advantageous to select materials and techniques which promote adhesive and ohmic contact to the surface 59 of window electrode 18. As will be appreciated by those skilled in the art in light of the following teachings, electrically conductive resins, and DER's in particular, are very suitable as materials for conductive strips 304.

In the embodiment of FIG. 69, those areas of the top surface of structure 300 not covered with conductive strips 304 have been coated with a thin coating of electrically insulating material 305.

Figure 71:
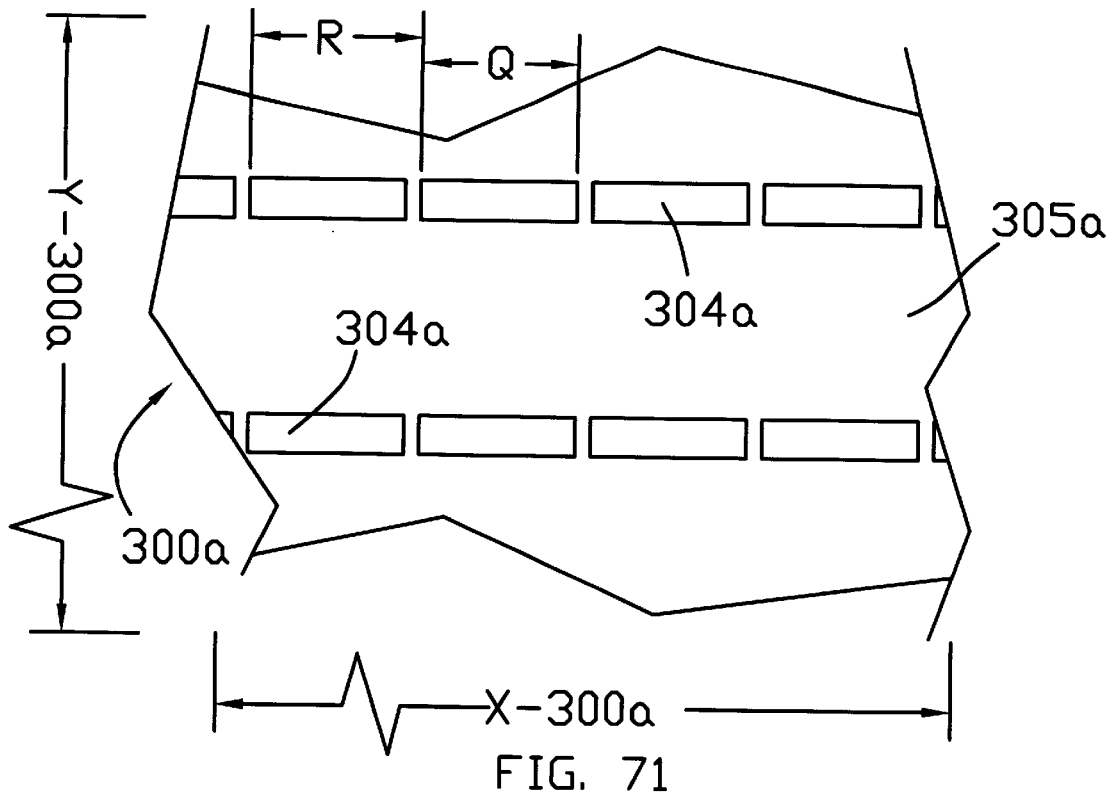
FIG. 71 is a top plan view, simiar to FIG. 69, of an alternate embodiment.

FIG. 71 is a plan view of an alternate embodiment. In FIG. 71, 300A designates a structure similar to the structure 300 of FIGS. 67,68 but strips 302 are not shown. They have either been excluded or are invisible in the plan view of FIG. 71, having been deposited on the surface of photovoltaic structure 11 (and thus overcoated with window electrode 18) or covered by insulating layer 305A. 304A designates strips or islands of electrically conductive material which have dimension "Q" slightly less than repeat distance "R". Those skilled in the art will recognize, in light of the teachings that follow below, that the structure embodied in FIG. 71 would be conceptually equivalent to the structure of FIG. 69.

Figure 70:
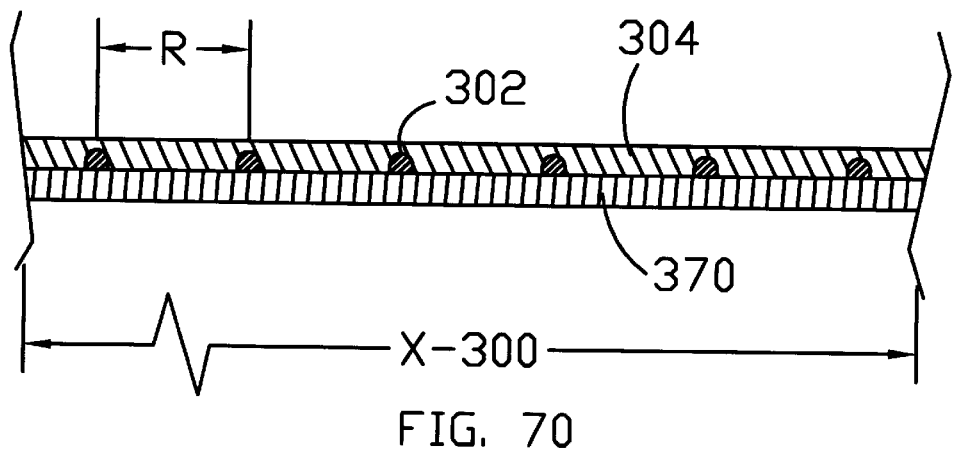
FIG. 70 is a simplified sectional view taken along line 70—70 of FIG. 69.
Figure 72:
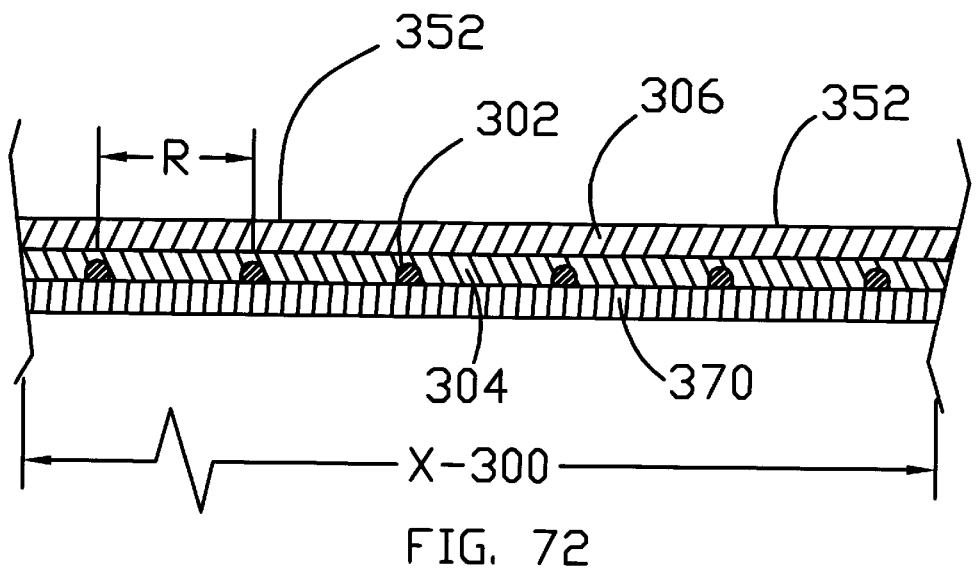
FIG. 72 is a sectional view of the structure of FIG. 70 after an additional processing step.

FIG. 72 illustrates the sectional view structure of FIG. 70 after an additional processing step. In FIG. 72, additional highly electrically conductive material 306 has been deposited overlaying conductive material 304. Material 306 has exposed top surface 352. In a preferred embodiment, highly electrically conductive material 306 is electrodeposited. Electrodeposition permits relatively rapid deposition rates and permits facile deposition of very conductive materials such as copper and silver. It can be appreciated that material strips 304/306 extend in the "X" direction a distance equivalent to multiple widths "R". This concept therefore allows for deposition of the individual cell grid fingers in an essentially continuous, "bulk" fashion.

Figure 73:
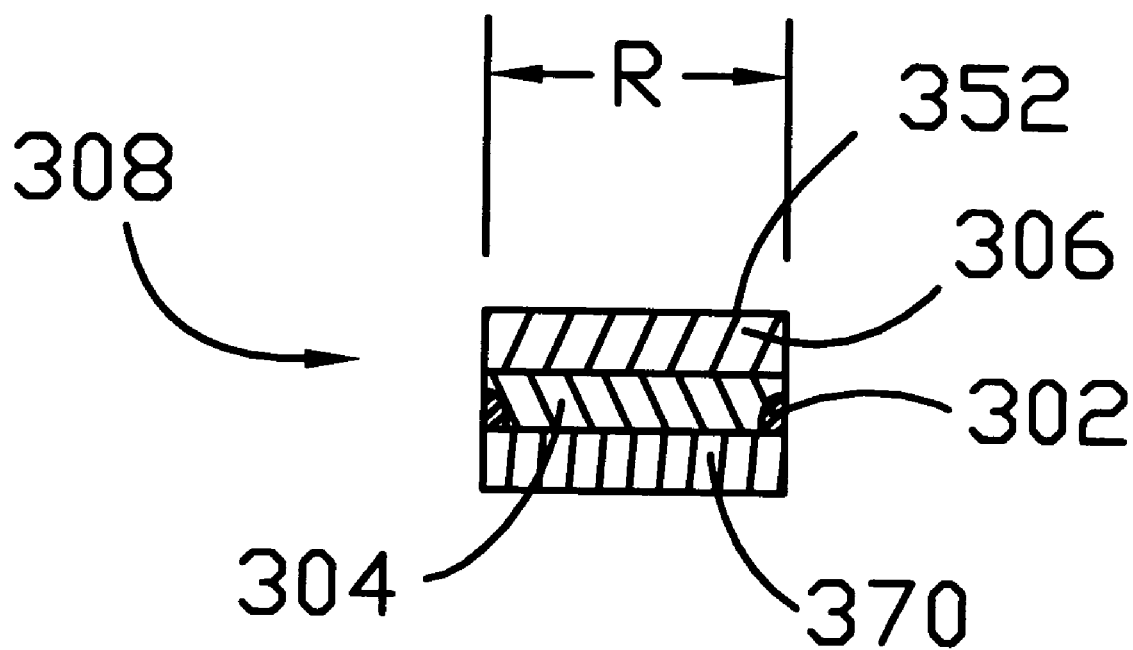
FIG. 73 is a sectional view of a portion of the FIG. 72 structure after an additional processing step.

FIG. 73 is a sectional view of a portion of the FIG. 72 structure after an additional processing step comprising slitting the FIG. 72 structure along the insulating strips 302 at repeat distances "R" to give individual units 308 comprising a laminate of portions of structures 370, 302, 304, 306 of the prior embodiments. Units 308 have width "R" which, as will be seen, approximates the eventual photovoltaic cell width. During this slitting process, insulating beads 302 prevent smearing of the top conductive material to the bottom electrode material 12 which would result in electrical shorting.

Figure 74:
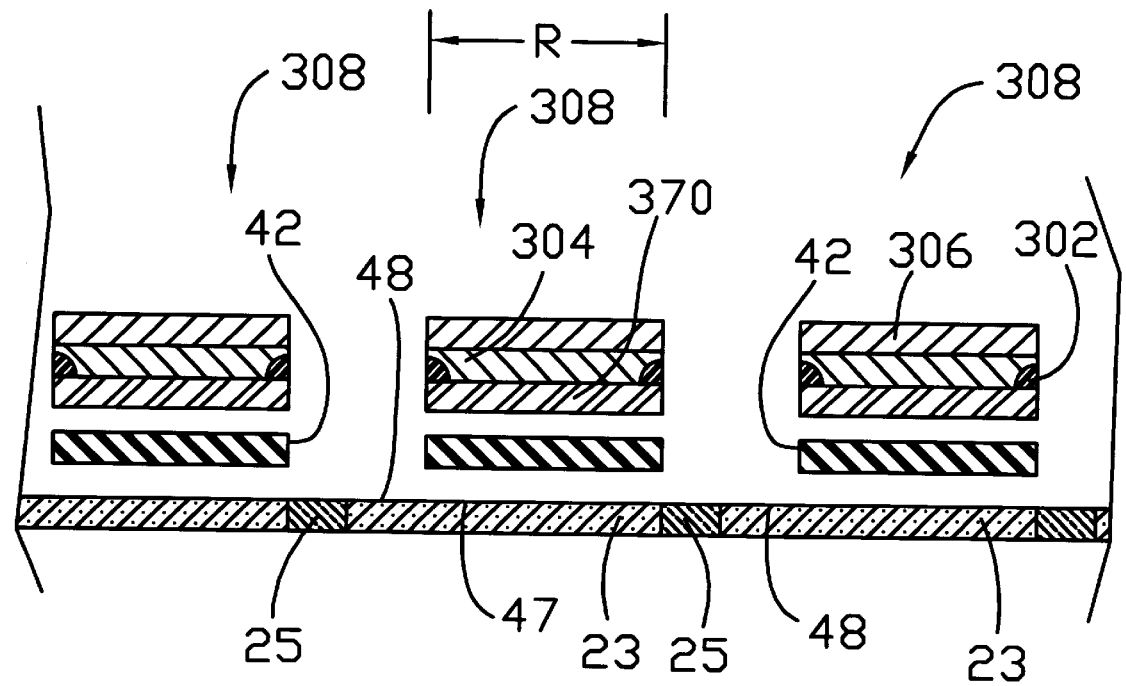
FIG. 74 is a sectional view similar to FIG. 13B just prior to the process illustrated in FIG. 13A, employing the structures shown in the sectional view in FIGS. 7 and 73.

FIG. 74 is a view similar to FIG. 13B showing the FIG. 73 structures just prior to a laminating process similar to FIG. 13A. Individual structures 308 are positioned in spacial relationship with electrically tab conductive adhesive 42 and conductive sheets 23. As in prior embodiments, sheets 23 are separated by insulating joining portions 25. Conductive sheets 23 can be considered to have a top contact surface region 48 and top collector surface area 47.

Figure 75:
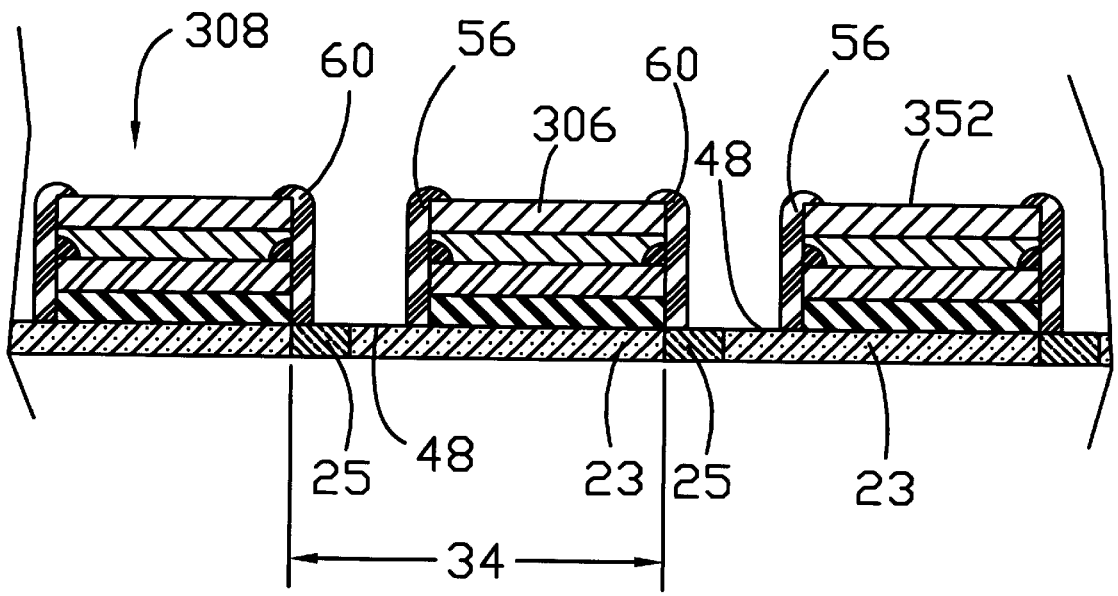
FIG. 75 is a sectional view showing the structure resulting from application of the process of FIG. 13A to the structural arrangement shown in FIG. 74.

FIG. 75 is a sectional view of the structure after the lamination depicted in FIG. 74 plus an additional step of applying insulating beads 56,60 to the terminal edges of the individual units 308. As shown in FIG. 75, at least a portion of top contact surface 48 remains exposed following this lamination. In addition, the lamination is characterized by repeat dimension 34, which is slightly greater than dimension "R".

Figure 76:
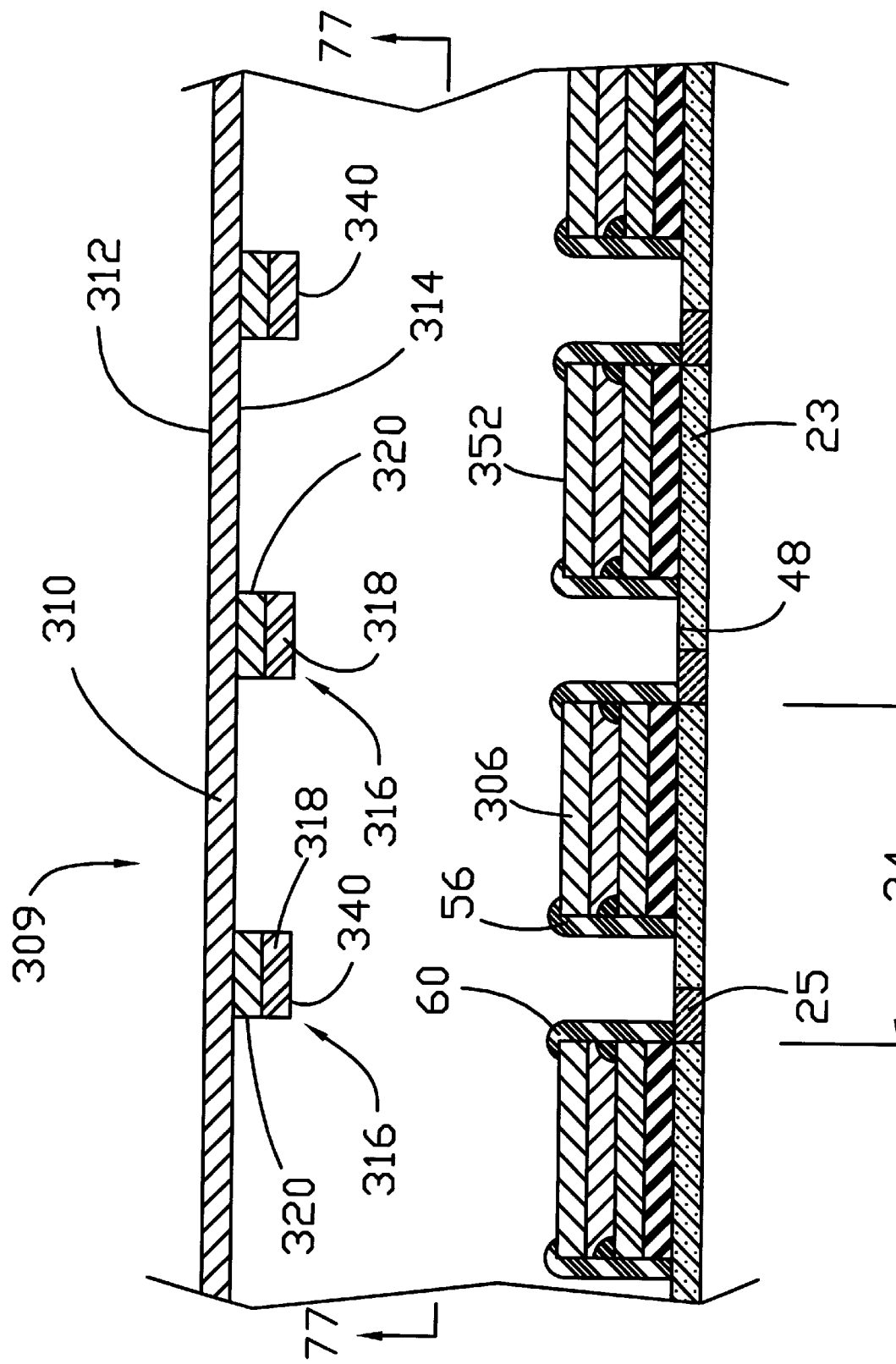
FIG. 76 is a sectional view of the spacial positioning of the structure shown in FIG. 75 and an additional component of the embodiment just prior to a process employed to combine them.

FIG. 76 is a sectional view prior to a further laminating step in the production of the overall array. FIG. 76 shows introduction of an additional steetlike interconnection component 309 comprising material strips 316 mounted on sheet 310 having top surface 312 and bottom surface 314. Sheet 310, shown as a single layer for simplicity, may comprise a laminate of multiple layers of materials to supply adhesive and barrier properties to the sheet. Mounted in spaced arrangement on the bottom surface 314 of sheet 310 are strips 316 of material having an exposed surface 340 which is electrically conductive. Strips 316 are also shown in FIG. 76 to comprise layer 320 which adhesively bonds conductive layer 318 to sheet 310. Layer 320 need not necessarily be electrically conductive and may be omitted if adhesion between conductive material 318 and sheet 310 is sufficient.

Figure 77:
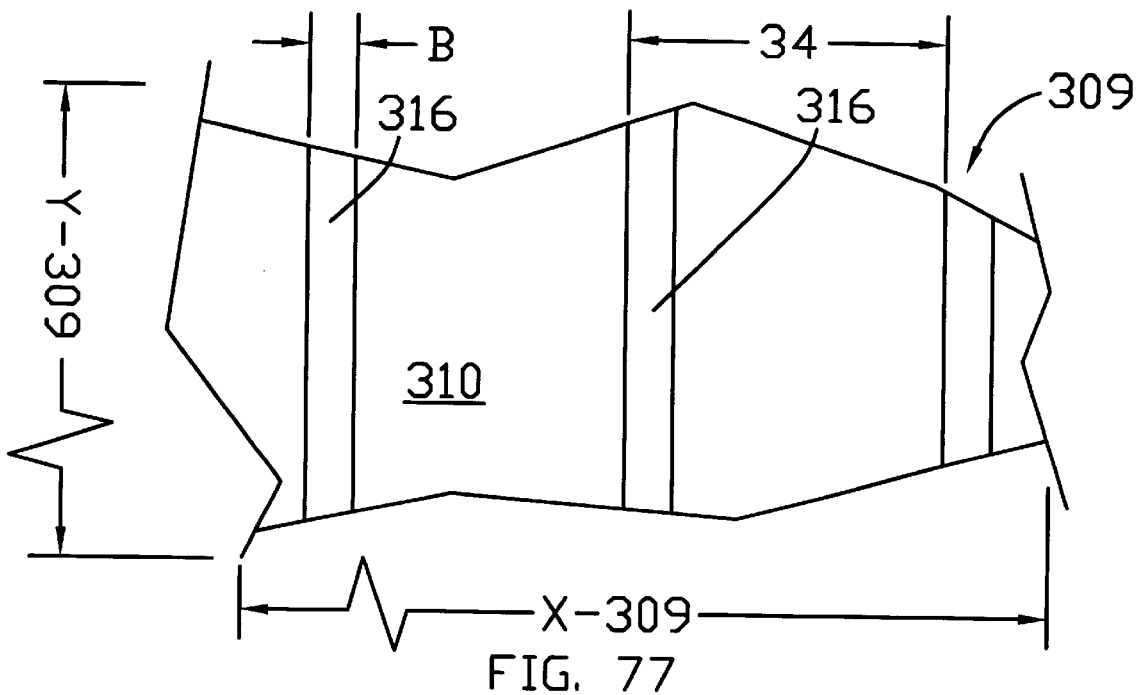
FIG. 77 is a plan view taken along the line 77—77 of FIG. 76.

FIG. 77, a plan view taken substantially along line 77—77 of FIG. 76, indicates the linear nature of strips 316 extending in the direction Y-309. Strips 316 have a width dimension "B" sufficient to span the distance between conductive strips 306 of one unit 308 to the contact surface 48 of sheet 23 corresponding to an adjacent unit. Typical magnitudes for dimension "B" are from 0.020 inch to 0.125 inch depending on registration accuracy during the multiple lamination processes envisioned.

Figure 78:
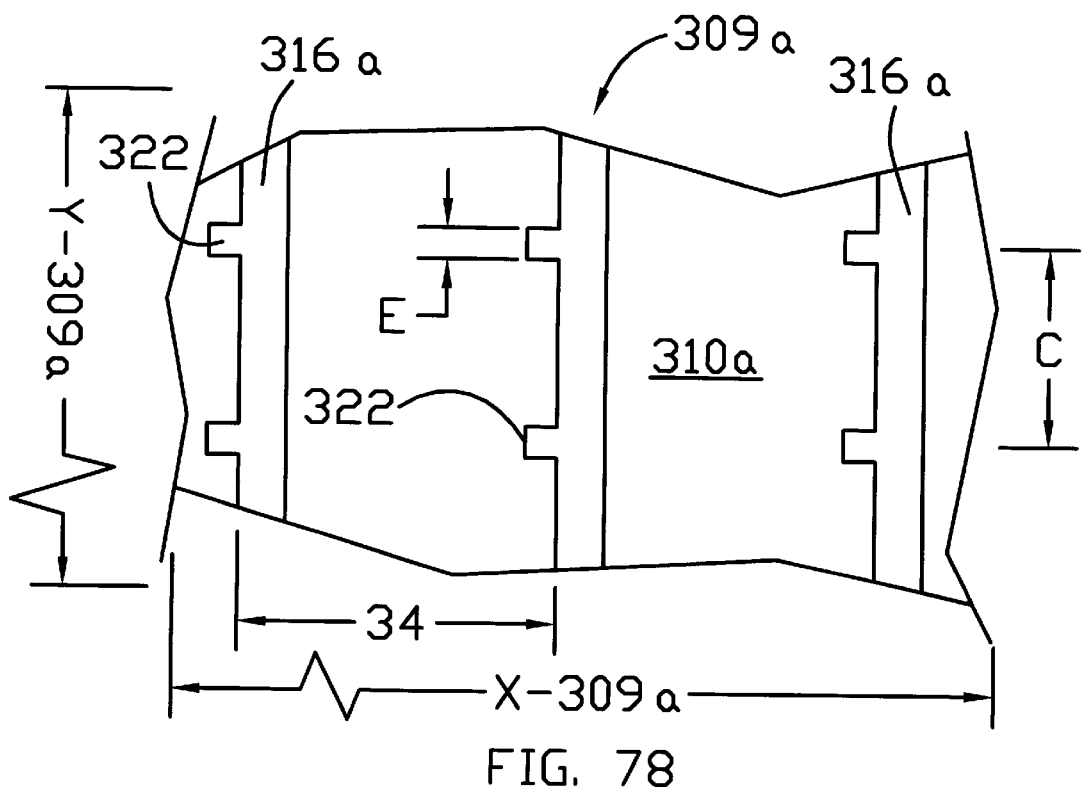
FIG. 78 is an alternate embodiment of the FIG. 77 structure.
Figure 79:
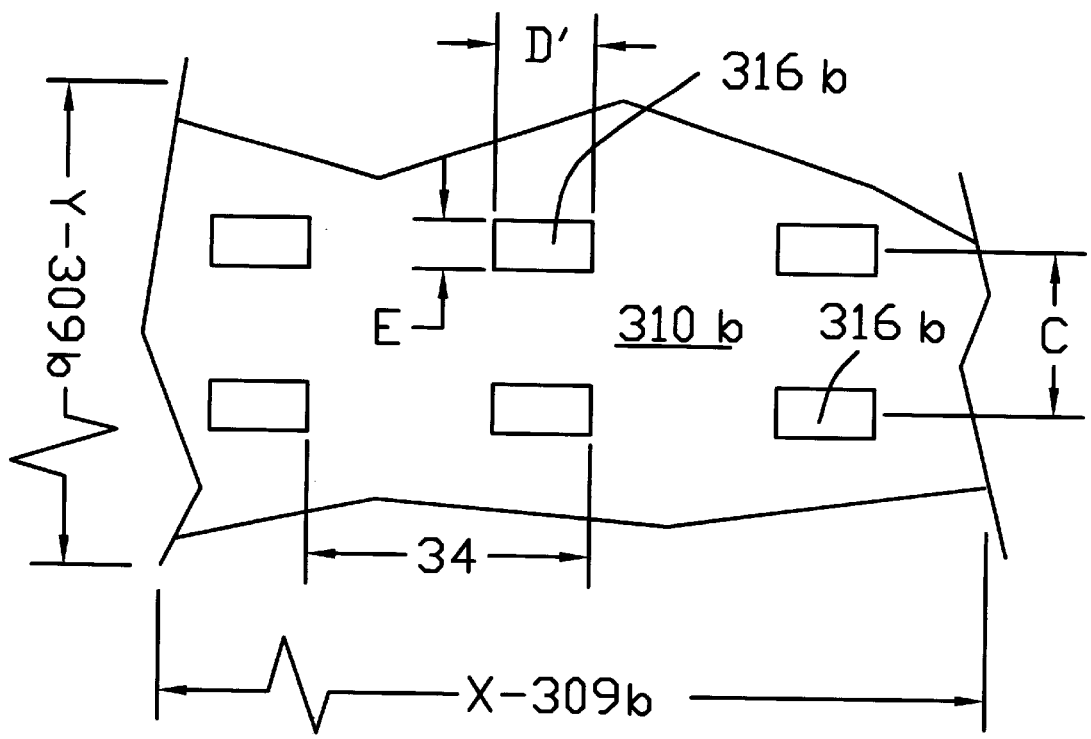
FIG. 79 is yet another alternate embodiment of the FIG. 77 structure.

FIGS. 78 and 79 present alternatives to the FIG. 77 component. In FIG. 78, tab extensions 322 of width "E" reach out in the "X" direction from the strips 316A. Tabs 322 are positioned at repeat distances "C" in the "Y" direction corresponding to the repeat dimension "C" of the conductive strips 304/306. Proper positional registration during the lamination process envisioned in FIG. 76 allows tabs 322 to overlap and contact strips 306, permitting increased contact area between strips 306 and tabs 322 and also a possible reduction in width "D" of strips 316a (FIG. 78) in comparison to dimension "B" (FIG. 77).

FIG. 79 shows an alternate embodiment wherein strips 316 and 316A of FIGS. 77 and 78 respectively have been replaced by individual islands 316B.

Dimension "E" (FIG. 79) is similar to dimension "N" (FIG. 69). Dimension D', (FIG. 79) is sufficient to span the distance between conductive strips 306 of one unit 308 to the contact surface 48 of sheet 23 corresponding to an adjacent unit.

Since the linear distance between strips 306 of one unit 308 and surface 48 corresponding to an adjacent unit is small, the structures 316, 316A and 322, and 316B of FIGS.

77, 78, and 79 respectively do not necessarily comprise materials exhibiting electrical conductivities characteristic of pure metals and alloys. However, as will be discussed below, proper selection of metal-based materials to form surface 340 of these structures can be used to advantage in achieving excellent ohmic and adhesive contacts to the strips 306 and contact surfaces 48 of conductive sheets 23.

Figure 80:
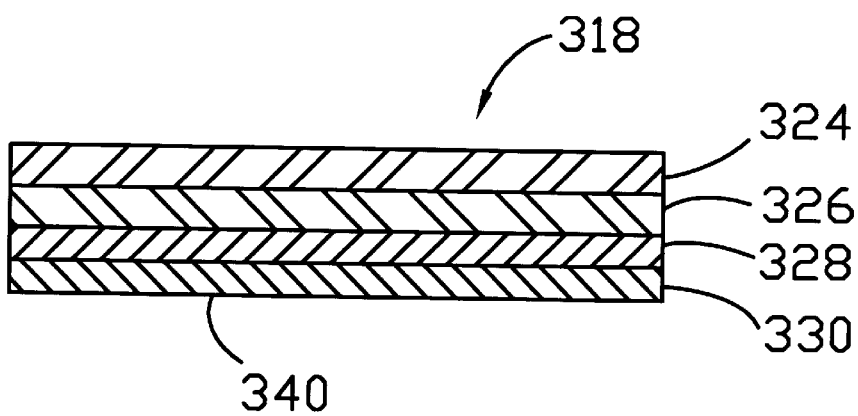
FIG. 80 is a sectional view showing one possible example of the structural makeup of a portion the components illustrated in FIGS. 77 through 79.

Accordingly, an example of a laminated structure envisioned for conductive layer 318 is shown in the sectional view of FIG. 80. A layer of resin 324 is attached to adhesive layer 320 (layer 320 not shown in FIG. 80). This is followed by layers 326,328 of electrodeposited metal for mechanical and electrical robustness. Finally a layer of low melting point metal or alloy 330 is deposited to produce free surface 340. Those skilled in the art will recognize that DER's would be a highly attractive choice for material layer 324. Alternatively, a material, not necessarily conductive, which would allow selective deposition of metal by chemical techniques could be chosen for layer 324.

Using the structure embodied in FIG. 80 for the conductive layer 318, the material 330 with surface 340 is caused to melt during the lamination process depicted in FIG. 76, resulting in a "solder" bond between material forming contact surface 48 of sheet 23 and material 330 with surface 340. A similar "solder" bond is formed between material forming top surface 352 of strip 306 and material 330 having surface 340.

One will note that the presence of sheets 310, 310A, and 310B of FIGS. 76 through 79 is not an absolute requirement for achieving the electrical interconnections among cells, but does facilitate handling and maintenance of spacial positioning during formation of the conductive interconnect structures and the subsequent laminating process envisioned in FIG. 76. In this regard, sheet 310 could be a surrogate support which is removed subsequent to or during lamination. This removal could be achieved, for example, by having layer 320 melt during the lamination process to release sheet 310 from structure 318, etc.

Figure 81:
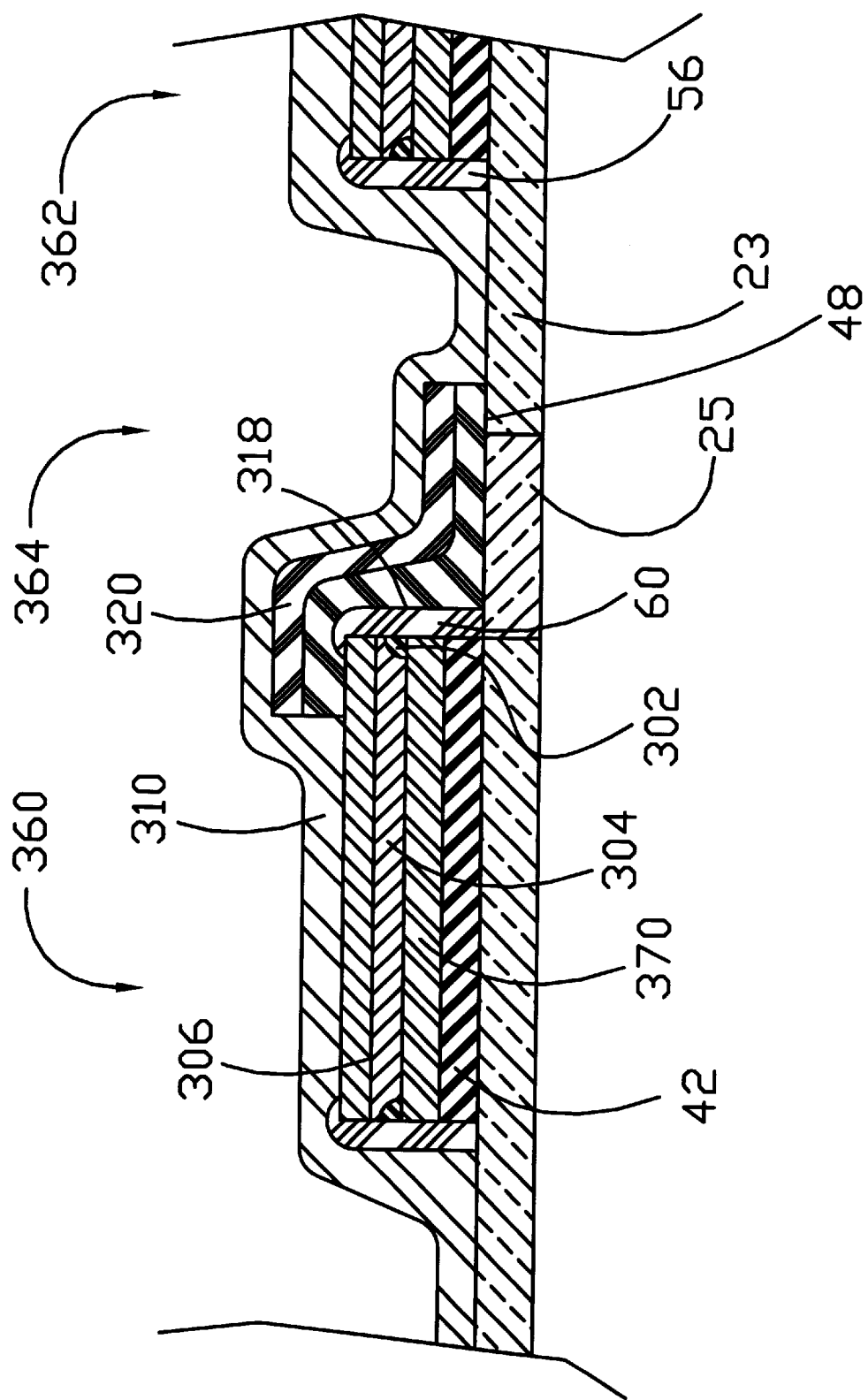
FIG. 81 is a sectional view of the structure resulting from the process envisioned in FIG. 76.

FIG. 81 is a greatly exploded view of a completed interconnection achieved according to the teachings embodied in FIGS. 67 through 80. FIG. 81 shows first cell 360 and a portion of adjacent cell 362. Interconnect region 364 is positioned between cells 360 and 362. It is seen that robust, highly efficient top surface current collection and cell interconnections are achieved with inexpensive, controllable and repetitive manufacturing techniques. Sensitive, fine processing involving material removal techniques and adversely affecting yields are avoided.

While the grid/interconnect structure taught in conjunction with FIGS. 67 through 81 employed the substrate structure depicted in FIGS. 6 and 7, it is understood that similar results would be achieved with the other substrate embodiments revealed in conjunction with the teachings corresponding to FIGS. 8 through 66.

Although the present invention has been described in conjunction with preferred embodiments, it is to be understood that modifications, alternatives and equivalents may be included without departing from the spirit and scope of the inventions, as those skilled in the art will readily understand. Such modifications, alternatives and equivalents are considered to be within the purview and scope of the invention and appended claims.

What is claimed is:

1. A process of manufacture in the production of an interconnected array of photovoltaic cells comprising the steps of, providing a first intermediate article of manufacture comprising semiconduuctor material forming a photovoltaic junction deposited on a metal-based foil, said intermediate article having a first linear dimension and a second linear dimension substantially perpendicular to said first linear dimension, a top surface and a bottom surface, said metal-based foil being closer to said bottom surface than is said semiconductor material, producing a second intermediate article of manufacture by depositing electrically conductive material in the form of strips on said top surface of said first intermediate article of manufacture, said strips extending in the direction of said first linear dimension, and slitting said second intermediate article of manufacture in the direction of said second linear dimension to produce individual photovoltaic cells, said individual cells having a third linear dimension less than said first linear dimension and comprising a portion of said metal-based foil and having portions of said strips of electrically conductive material extending in the direction of said third linear dimension.

2. The process of claim 1 wherein said electrically conductive material in the form of strips comprises an electrically conductive polymer-based material.

3. The process of claim 1 wherein said electrically conductive material in the form of strips comprises a directly electroplateable resin.

4. The process of claim 1 wherein said electrically conductive material in the form of strips comprises metal-based material.

5. The process of claim 4 wherein said metal-based material comprises an electrodeposit.

6. An intermediate article of manufacture in the production of an interconnected array of individual photovoltaic cells, said intermediate article comprising semiconductor material forming a photovoltaic junction deposited in direct contact on a metal-based foil, said semiconductor material extending continuously between oppositely disposed terminal edges of said article, said terminal edges defining a width dimension of said article, said intermediate article further having exposed top and bottom surfaces, said metal-based foil forming a portion of said exposed bottom surface, said intermediate article further having multiple strips of electrically conductive material forming a portion of said top surface, said strips extending in the direction of said width.

7. The intermediate article of claim 6 wherein said electrically conductive material comprises an electrically conductive polymer-based material.

8. The intermediate article of claim 6 wherein said electrically conductive material comprises a directly electroplateable resin.

9. The intermediate article of claim 6 wherein said electrically conductive material comprises metal-based material.

10. The intermediate article of claim 9 wherein said metal-based material comprises an electrodeposit.

11. The intermediate article of claim 6 characterized by having a length dimension perpendicular to said width dimension, said length being much greater than said width such that said article can be processed in roll-to-roll fashion in the direction of said length.

12. A process for producing an electrically inconnected array of photovoltaic cells comprising the steps of, producing photovoltaic cells comprising semiconductor material deposited on a metal-based foil substrate, said cells having a top surface and a bottom surface, said foil forming said bottom surface, providing a first interconnection component, said interconnection component being initially separate and distinct from said cells, said first interconnection component characterized by having first spacially arranged conductive and non-conductive regions, spacially arranging and attaching a multiple of said cells on said first interconnection component to produce an intermediate article of manufacture wherein said metal-based foil of a first of said cells is in electrical communication with one of said first conductive regions, preparing a second interconnection component, said second interconnection component being initially prepared in separate and distinct form from said intermediate article, said second interconnection component having second spacially arranged conductive surface regions as initially prepared in its separate and distinct form, combining said second interconnection component with said intermediate article to interconnect a multiple of said cells, said second component supplying electrical communication between said one of said first conductive regions and said top surface of a second of said cells.

13. In combination, multiple photovoltaic cells comprising semiconductor material deposited on a metal-based foil, said cells having a top surface and a bottom surface, said metal-based foil forming said bottom surface of said cells, and an interconnection component initially separate and distinct from said photovoltaic cells, said interconnection component having structure comprising spacially arranged regions of conductive material, said structure being present in said initially separate and distinct form of said component, said combination characterized by having a portion of a first of said regions of conductive material in contact with said top surface of a first of said cells.

* * * * *